United States Patent
Sano

(10) Patent No.: US 9,123,865 B2
(45) Date of Patent: Sep. 1, 2015

(54) SEMICONDUCTOR LIGHT EMITTING ELEMENT

(71) Applicant: Nichia Corporation, Anan-shi (JP)

(72) Inventor: Masahiko Sano, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/575,807

(22) Filed: Dec. 18, 2014

(65) Prior Publication Data

US 2015/0179890 A1   Jun. 25, 2015

(30) Foreign Application Priority Data

Dec. 19, 2013  (JP) .................................. 2013-262438

(51) Int. Cl.

| | |
|---|---|
| H01L 33/50 | (2010.01) |
| H01L 33/42 | (2010.01) |
| H01L 33/00 | (2010.01) |
| H01L 33/46 | (2010.01) |
| H01L 33/38 | (2010.01) |
| H01L 33/44 | (2010.01) |
| H01L 33/20 | (2010.01) |

(52) U.S. Cl.
CPC .............. *H01L 33/42* (2013.01); *H01L 33/005* (2013.01); *H01L 33/38* (2013.01); *H01L 33/44* (2013.01); *H01L 33/46* (2013.01); *H01L 33/20* (2013.01); *H01L 2933/0016* (2013.01)

(58) Field of Classification Search
CPC ....................... H01L 33/005; H01L 2933/0016
USPC ........................................................... 257/98
See application file for complete search history.

(56) References Cited

U.S. PATENT DOCUMENTS

| | | |
|---|---|---|
| 2006/0231852 A1 | 10/2006 | Kususe et al. |
| 2008/0185606 A1 | 8/2008 | Sano et al. |
| 2010/0155752 A1 | 6/2010 | Lim et al. |
| 2012/0049234 A1* | 3/2012 | Cheng .............................. 257/99 |
| 2012/0085988 A1 | 4/2012 | Yu et al. |
| 2012/0146075 A1 | 6/2012 | Deguchi |
| 2013/0175572 A1 | 7/2013 | Liao et al. |

FOREIGN PATENT DOCUMENTS

| | | |
|---|---|---|
| EP | 2 207 211 A1 | 7/2010 |
| JP | 2008-192710 A | 8/2008 |

(Continued)

OTHER PUBLICATIONS

Partial European Search Report dated May 18, 2015 issued in Application No. 14198483.1.

*Primary Examiner* — Tuan Nguyen

(74) *Attorney, Agent, or Firm* — Foley & Lardner LLP

(57) ABSTRACT

A semiconductor light emitting element includes a first conductive type semiconductor layer, a light emitting layer, and a second conductive type semiconductor layer disposed in this order. The semiconductor light emitting element includes first and second electrodes, a first insulating film and a translucent electrode. The first electrode is provided on the first conductive type semiconductor layer and includes a first pad portion and a first extending portion. The first insulating film covers the first extending portion. The translucent electrode is connected to an upper surface of the second conductive type semiconductor layer and extends over the first insulating film. The second electrode is connected to the translucent electrode at a position on the first insulating film. The second electrode includes a second pad portion and a second extending portion extending along the first extending portion so as to be superimposed over the first extending portion.

16 Claims, 50 Drawing Sheets

(56) References Cited

FOREIGN PATENT DOCUMENTS

| JP | 2008-210903 | * | 9/2008 |
|---|---|---|---|
| JP | 2008-210903 A | | 9/2008 |
| JP | 2010-153870 A | | 7/2010 |
| JP | 2012-114343 A | | 6/2012 |
| JP | 2012-124306 | * | 6/2012 |
| JP | 2012-124306 A | | 6/2012 |
| WO | WO-2004/013916 A1 | | 2/2004 |

* cited by examiner

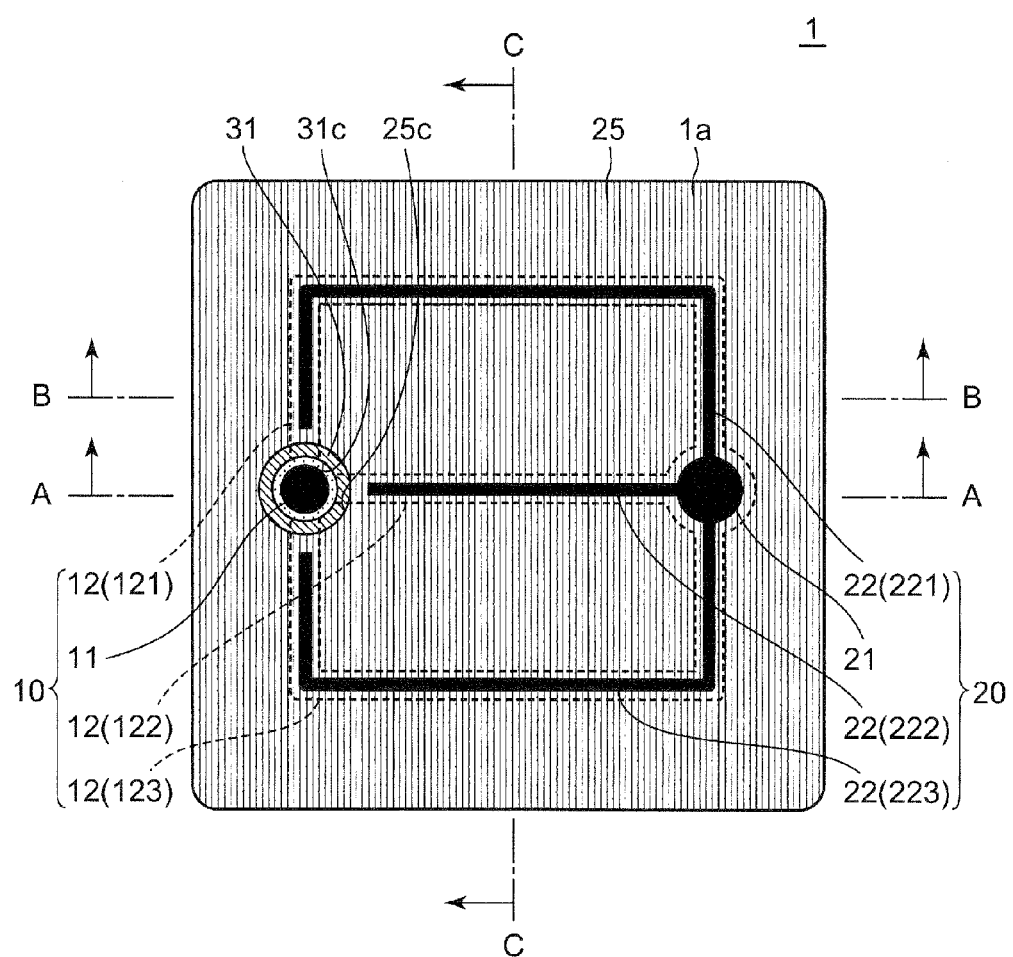

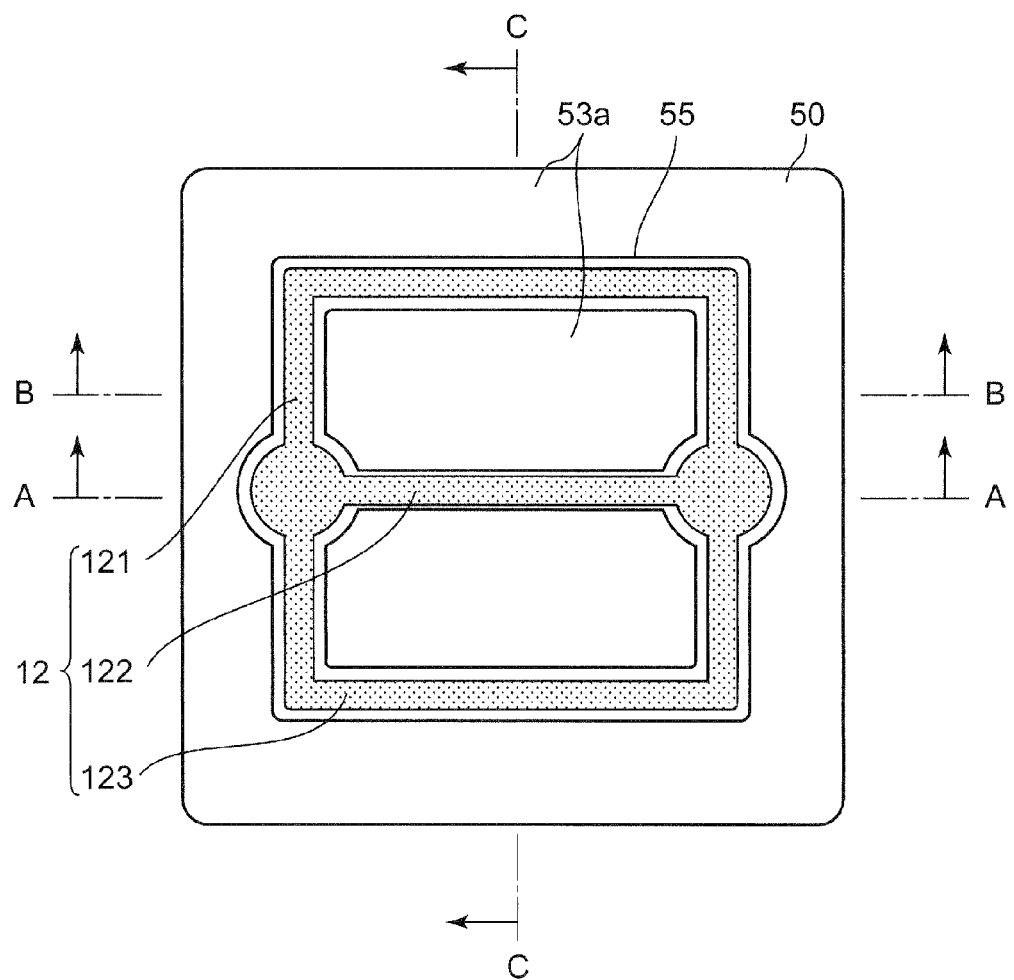

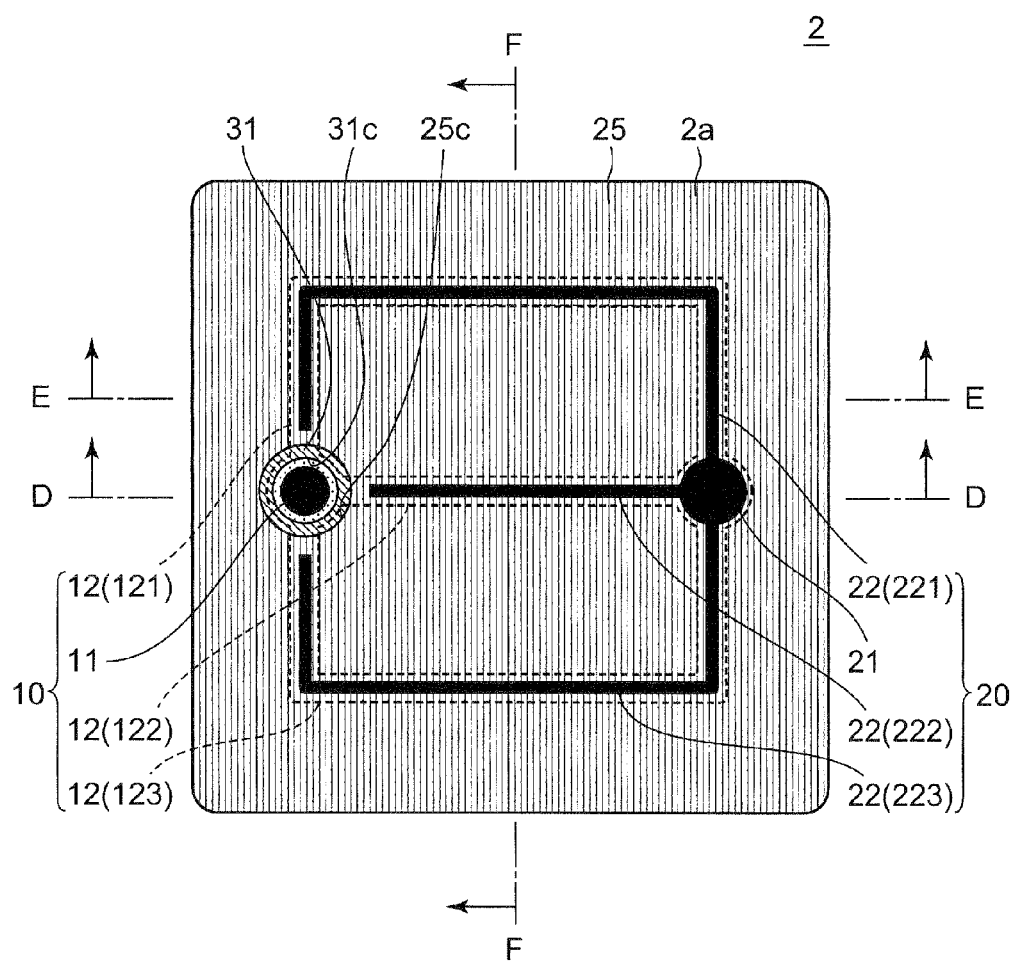

SEMICONDUCTOR LIGHT EMITTING ELEMENT

CROSS-REFERENCE TO RELATED APPLICATIONS

This application claims priority on Japanese Patent Application No. 2013-262438 filed on Dec. 19, 2013, the disclosure of which is incorporated by reference herein.

BACKGROUND OF THE INVENTION

1. Field of the Invention

The present disclosure relates to semiconductor light emitting elements, and more particularly, to a semiconductor light emitting element with high light extraction efficiency.

2. Description of the Related Art

Light emitting elements using a nitride semiconductor material are known as light emitting elements that are able to emit light within a wide range of wavelengths, from near-ultraviolet light to red light. The general basic structure of the nitride semiconductor light-emitting element includes an n-type nitride semiconductor layer, an active layer, and a p-type nitride semiconductor layer stacked on an insulating substrate in this order. Further, an n-side electrode for energizing the n-type nitride semiconductor layer and a p-side electrode for energizing the p-type nitride semiconductor layer are formed at an upper surface side of the p-type nitride semiconductor layer.

Electrode structures may affect characteristics of the light emitting element (for example, output, light extraction efficiency, and an element resistance of the light emitting element, and the like). In order to improve the characteristics of the light emitting elements, an electrode structure has been studied from various viewpoints. For example, in the light emitting element having an upper surface of the p-type nitride semiconductor layer serving as a light emitting surface, the metal electrode formed on the light emitting surface functions as a light shielding member and therefore the light extraction efficiency will be reduced. Particularly, when both the n-side electrode and the p-side electrode are provided with an extending electrode made of metal in order to diffuse current into the entire light emitting element, the extending electrode also serves as the light shielding member and therefore the light extraction efficiency will be further reduced.

To address this problem, Japanese Patent Application No. JP 2012-114343 A discloses an electrode wiring in which a p-side electrode and an n-side electrode (mainly, extending electrodes thereof) are stacked via an insulating layer so that these electrodes partially overlap with each other as viewed from the light emitting surface side. Partial overlapping of these electrodes leads to a reduction of a light shielding area shielded by the electrodes as compared to an electrode wiring without overlap. As a result, the light extraction efficiency can be enhanced.

According to JP 2012-114343 A, an insulating film is provided between the electrodes and semiconductor layers, and each electrode is in electrical conduction with the corresponding semiconductor layer through a plurality of penetrating electrodes. However, since the n-side electrode and the p-side electrode overlap with each other so as to reduce the light shielding area, it is difficult to connect each electrode to the penetrating electrodes. For this reason, each electrode is provided with a plurality of protrusions extending in a plane parallel to the light emitting surface in order to connect each electrode to the penetrating electrodes through the protrusions. The protrusions of the n-side electrode and the protrusions of the p-side electrode are arranged so as to not overlap with each other as viewed from the light emitting surface side.

SUMMARY OF THE INVENTION

Similar to the electrodes, the protrusions of each electrode are formed of a metal film. The plurality of the protrusions increases the light shielding area. As a result, the light extraction efficiency cannot be sufficiently improved.

An object of one embodiment of the present invention is to provide a semiconductor light emitting element having high light extraction efficiency.

A semiconductor light emitting element according to one embodiment of the present invention is adapted to take out light from the upper surface side thereof, comprising: a first conductive type semiconductor layer being one of an n-type semiconductor and p-type semiconductor; a light emitting layer; a second conductive type semiconductor layer being the other type semiconductor; the first conductive type semiconductor layer, the light emitting layer and the second conductive type semiconductor layer being formed in this order from a lower surface side of the light emitting element toward an upper surface side thereof; a first electrode provided on the first conductive type semiconductor layer, the first electrode including a first pad portion and a first extending portion extending from the first pad portion; a first insulating film covering the first extending portion; a translucent electrode connected to an upper surface of the second conductive type semiconductor layer and extending over the first insulating film; and a second electrode connected to the translucent electrode at a position on the first insulating film, the second electrode including a second pad portion, and a second extending portion extending from the second pad portion along the first extending portion so as to be superimposed over the first extending portion.

According to one embodiment of the present invention, since the second extending portion is disposed so as to be superimposed over the first extending portion, a light shielding area can be reduced by a superimposed area. The second electrode is connected to the second conductive type semiconductor layer through the translucent electrode connected to the upper surface of the second conductive type semiconductor layer. Therefore, unlike JP 2012-114343 A, it is not necessary to provide protrusions. As a result, the light emitting element according to one embodiment of the present invention can achieve a high light extraction efficiency.

BRIEF DESCRIPTION OF THE DRAWINGS

FIG. 1 is a schematic top view of a light emitting element according to a first embodiment of the present invention.

FIG. 5 is a schematic top view for explaining a manufacturing method of the light emitting element in the first embodiment of the present invention.

FIG. 11 is a schematic top view of a light emitting element according to a second embodiment of the present invention.

DETAILED DESCRIPTION OF THE PREFERRED EMBODIMENTS

Figure 2A:
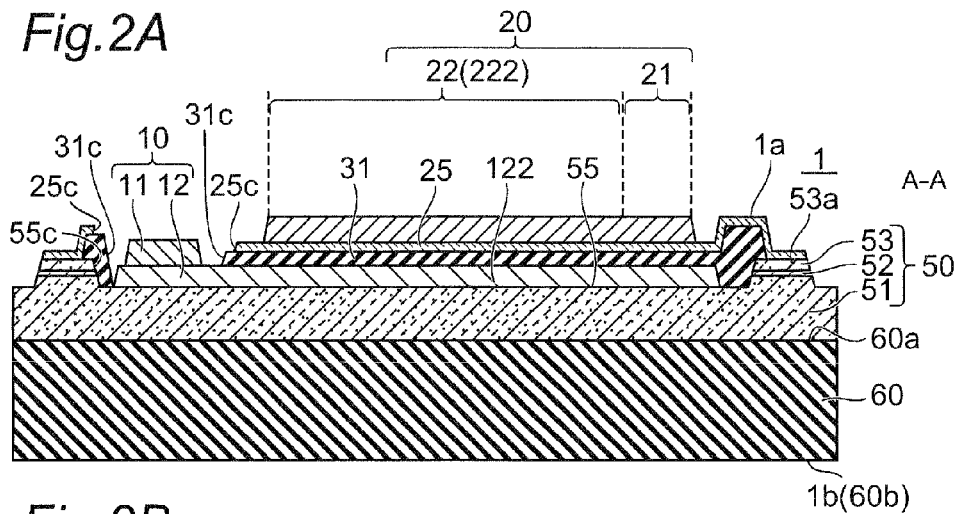
FIG. 2A is a cross-sectional view taken along the line A-A in FIG. 1.

Hereinafter, embodiments of the present invention will be described in detail below with reference to the accompanying drawings. In the description below, terms indicative of specific directions and positions (for example "upper", "lower", "right", "left", and other terms including these terms) are used if needed. These terms are used for better understanding of the embodiments of the present invention with reference to the accompanying drawings. The terms are not intended to limit the technical scope of the present invention. The same parts or members are designated by the same reference numerals throughout the drawings.

First Embodiment

FIGS. 1 to 10C

A light emitting element 1 according to one embodiment of the present invention is shown in FIGS. 1, and 2A to 2C. The light emitting element 1 is suitable for a mounting configuration in which light is taken out from a side of an upper surface 1a of the light emitting element 1 (a so-called "face-up mounting"). A first feature of this embodiment is that a second extending portion 22 of a second electrode 20 is disposed so as to be superimposed over a first extending portion 12 of a first electrode 10 as viewed from the side of the upper surface 1a of the light emitting element 1 (see FIGS. 1, and 2A to 2C). A second feature of this embodiment is that a second electrode 20 is formed at an upper side of a first insulating film 31 and is in electrical conduction with a second conductive type semiconductor layer 53 through a translucent electrode 25 extending from an upper surface 53a of the second conductive type semiconductor layer 53 onto the first insulating film 31 (see FIGS. 2A to 2C).

The light emitting element 1 according to this embodiment will be described in detail below with reference to the accompanying drawings.

The light emitting element 1 shown in FIGS. 1, and 2A to 2C is provided with a substrate 60 at a side of a lower surface 1b and a semiconductor laminate 50 at a side of the upper surface 1a. The electrodes 10 and 20 for energizing the light emitting element 1 are formed on an upper surface of the semiconductor laminate 50.

Figure 2B:
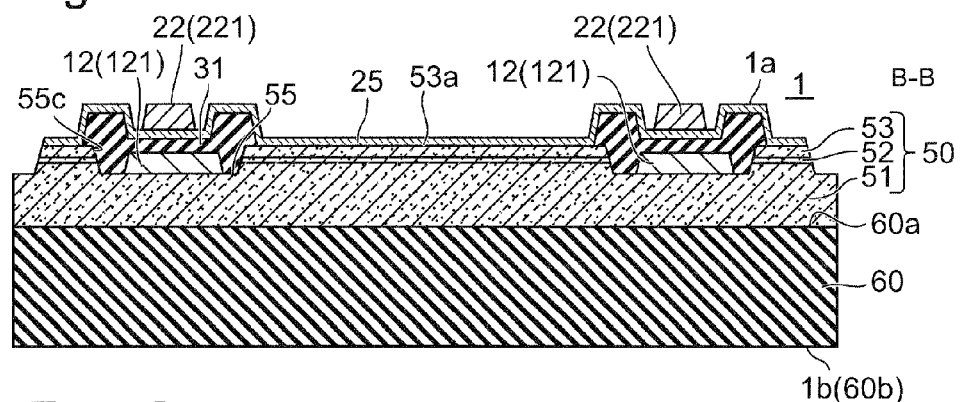
FIG. 2B is a cross-sectional view taken along the line B-B in FIG. 1.
Figure 2C:
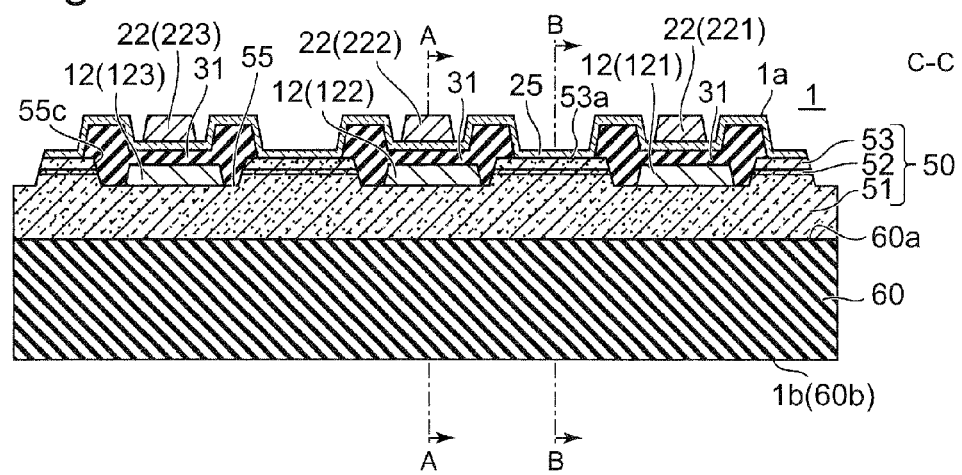
FIG. 2C is a cross-sectional view taken along the line C-C in FIG. 1.
Figure 3:
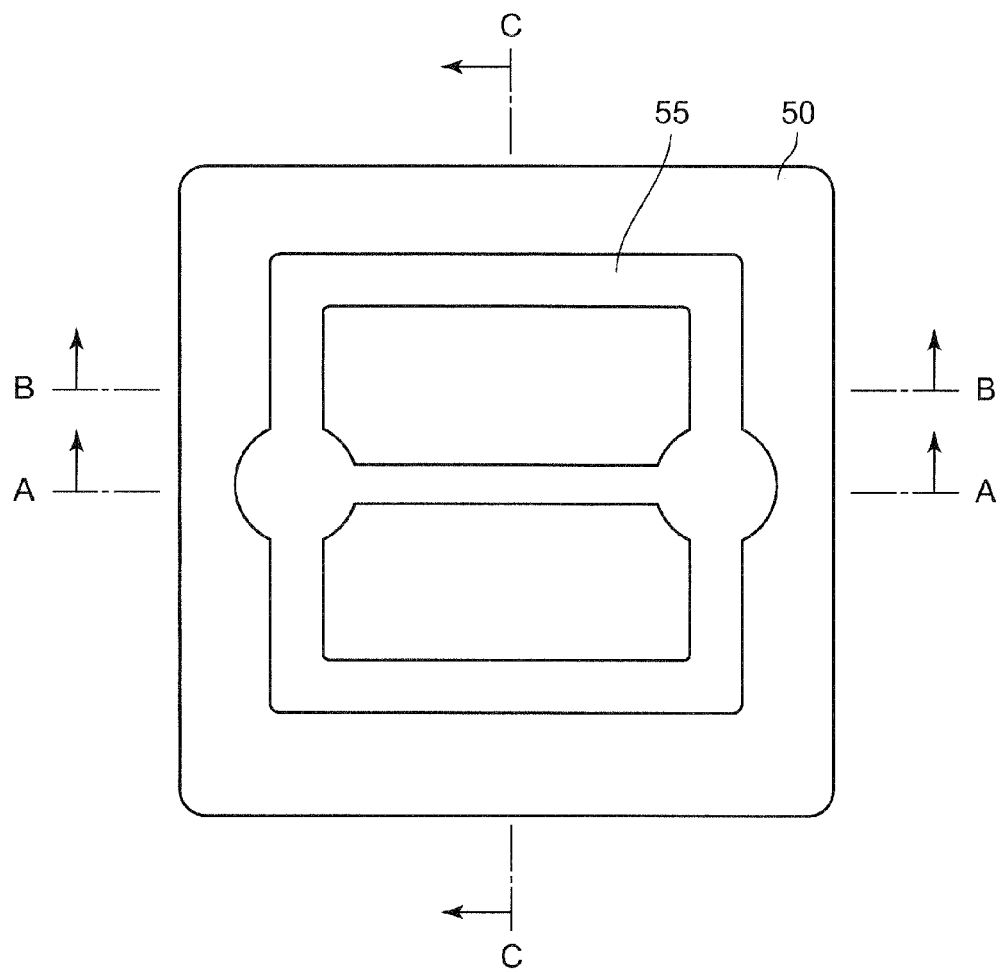
FIG. 3 is a schematic top view for explaining a manufacturing method of the light emitting element in the first embodiment of the present invention.
Figure 4A:
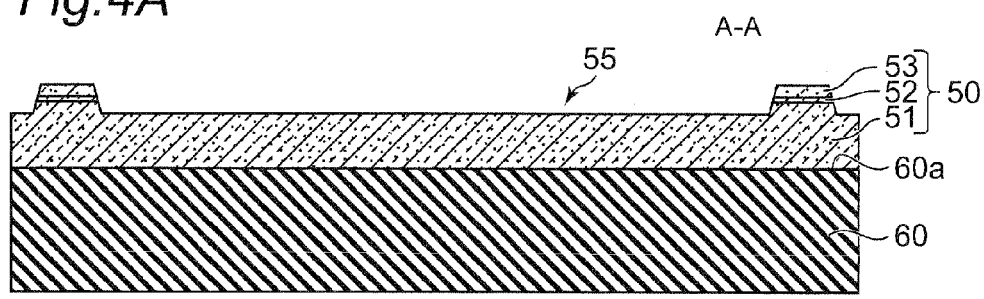
FIG. 4A is a cross-sectional view taken along the line A-A in FIG. 3.
Figure 4B:
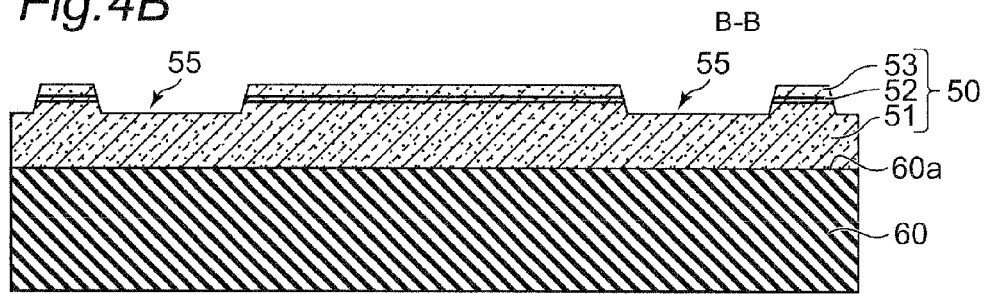
FIG. 4B is a cross-sectional view taken along the line B-B in FIG. 3.
Figure 4C:
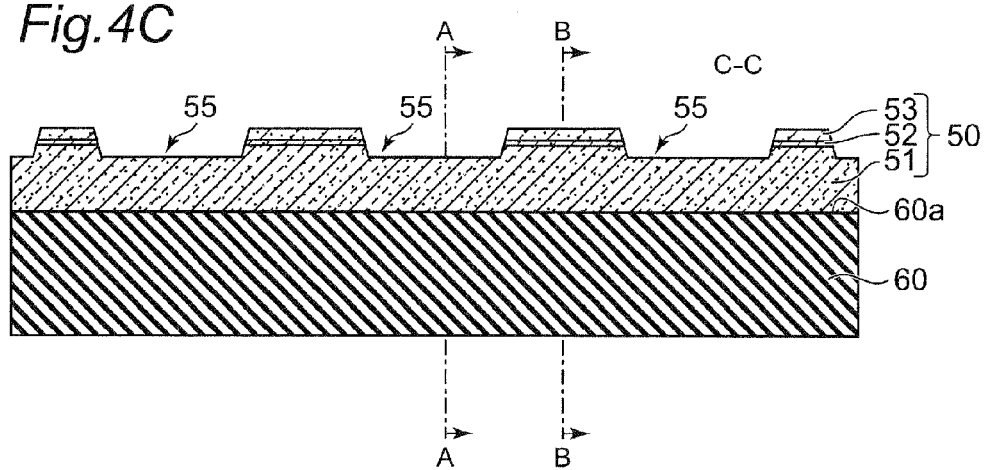
FIG. 4C is a cross-sectional view taken along the line C-C in FIG. 3.

The semiconductor laminate 50 includes a first conductive type semiconductor layer (n-type semiconductor layer) 51, a light emitting layer 52, and the second conductive type semiconductor layer (p-type semiconductor layer) 53 which are formed in this order from the lower surface 1b side of the light emitting element 1 toward the upper surface 1a side thereof (that is, from an upper surface 60a of the substrate 60 to the upper surface 1a of the light emitting element 1). As shown in FIGS. 2A to 2C, an exposed portion 55 for exposing the n-type semiconductor layer 51 is provided at a side of the p-type semiconductor layer 53 of the semiconductor laminate 50.

The first electrode (n-side electrode) 10 is provided on the n-type semiconductor layer 51 and is exposed within the exposed portion 55. The n-side electrode 10 includes a first pad portion (n-side pad portion) 11 and the first extending portion (n-side extending portion) 12 extending from the n-side pad portion 11. The n-side pad portion 11 is used to connect a metal wire or the like to be energized to the light emitting element 1. The n-side extending portion 12 is provided to spread current to the n-type semiconductor layer 51.

In this embodiment, the n-type semiconductor layer 51 and the n-side extending portion 12 are in contact with each other and therefore the n-type semiconductor layer 51 and the n-side electrode 10 are electrically connected to each other. The n-side pad portion 11 is provided on the n-side extending portion 12 (see FIG. 2A).

As shown in FIGS. 2A to 2C, the n-side extending portion 12 provided within the exposed portion 55 is covered with the first insulating film 31. The first insulating film 31 has an opening 31c, and the n-side pad portion 11 is exposed from the opening 31c (see FIGS. 1 and 2A). In this way, the n-side extending portion 12 is substantially insulated from an external atmosphere, but can be in electrical conduction with an external power source through the n-side pad portion 11.

The first insulating film 31 may further cover a side surface 55c of the exposed portion 55. In order to surely insulate the side surface 55c, the first insulating film 31 may extend beyond the exposed portion 55 up to a nearby region of the upper surface 53a of the p-type semiconductor layer 53 located near the exposed portion 55.

The n-side extending portion 12 and the side surface 55c of the exposed portion 55 are insulated from each other by the first insulating film 31 positioned therebetween. As a result, it can be surely avoided that the n-side extending portion 12 is in contact with the active layer 52 and/or the p-type semiconductor layer 53 exposed at the side surface 55c.

A translucent electrode 25 is disposed on a side of the upper surface 53a of the p-type semiconductor layer 53 so as to connect with the upper surface 53a thereof. The translucent electrode 25 is provided to diffuse the current into the p-type semiconductor layer 53, while allowing the light emitted from the light emitting element 1 to pass therethrough.

The translucent electrode 25 further extends over the first insulating film 31 to cover substantially the entire upper surface 1a of the light emitting element 1 (see FIG. 1).

The translucent electrode 25 has an opening 25c. An inner diameter of the opening 25c is larger than that of the opening 31c of the first insulating film 31. The opening 25c of the translucent electrode 25 is positioned so that the opening 31c of the first insulating film 31 is entirely exposed from the opening 25c of the translucent electrode 25. As a result, it can prevent the translucent electrode 25 from contact with the n-side electrode 10 (that is, the n-side extending portion 12 and the n-side pad portion 11) (see FIGS. 1 and 2A).

The second electrode (p-side electrode) 20 is disposed on the translucent electrode 25 so as to connect with the translucent electrode 25. The p-side electrode 20 includes a second pad portion (p-side pad portion) 21 and the second extending portion (p-side extending portion) 22 extending from the second pad portion 21. The p-side pad portion 21 is used to connect a metal wire or the like to be energized to the light emitting element 1. The p-side extending portion 22 is provided to spread current to the translucent electrode 25 and the p-type semiconductor layer 53.

The p-side electrode 20 is connected with the translucent electrode 25 at a position on the first insulating film 31. As shown in FIG. 1, the p-side extending portion 22 extends along the n-side extending portion 12. The p-side extending portion 22 is disposed so as to be superimposed over the n-side extending portion 12 as viewed from the upper surface 1a of the light emitting element 1 (see FIGS. 1, and 2A to 2C). The n-side electrode 10 may be also located directly under the p-side pad portion 21.

When the light emitting element 1 emits light, most of the light from the active layer 52 passes through the p-type semiconductor layer 53 and the translucent electrode 25 and is taken out of the upper surface 1a of the light emitting element 1 (see FIGS. 2B and 2C). Apart of the light emitted is reflected within the semiconductor laminate 50 and propagates in the lateral direction. In some cases, the propagating light enters, for example, the n-type semiconductor layer 51 located below the exposed portion 55 and reaches the lower surface of the n-side electrode 10. This light is reflected by the n-side electrode 10, and therefore does not reach an area above the n-side electrode 10. In one embodiment of the present invention, since at least a part of the p-side electrode 20 is disposed on the upper side of the n-side electrode 10, no light reaches at least part of the p-side electrode 20.

According to a conventional light emitting element, the p-side electrode and the n-side electrode are normally disposed and spaced apart from each other in the viewpoint of enhancing the light emission efficiency. Therefore, the p-side electrode is usually not superimposed over the n-side electrode at all. As a result, the light propagating through the semiconductor laminate 50 reaches not only the n-side electrode but also the p-side electrode. The light is shielded by both the p-side electrode and the n-side electrode, which reduces the light extraction efficiency.

In contrast, in one embodiment of the present invention, at least a part of the p-side electrode 20 is superimposed over the n-side electrode 10, and therefore the light does not reach at least part of the p-side electrode 20. As a result, the light shielding area can be reduced without decreasing the areas of the n-side electrode 10 and the p-side electrode 20. Therefore, the light extraction efficiency can be improved.

In particular, the nitride semiconductor light-emitting element with the structure of this embodiment has the significant effect of improving the light extraction efficiency.

The n-side electrode of the n-type nitride semiconductor can be formed using metal material such as Al or the like having a high reflectivity. The reflectivity of the n-side electrode can be increased and the absorption of light reaching the n electrode can be suppressed, and as a result, the light extraction efficiency can be improved.

On the other hand, it is difficult to use Al for forming the p-side electrode of the p-type nitride semiconductor for the following reasons. Since the p-type nitride semiconductor has high electric resistance, an electrode must be in contact with substantially an entire surface of the p-type nitride semiconductor. In most cases, the translucent electrode made of conductive oxide (e.g., ITO) is provided on the surface of the p-type nitride semiconductor. When a p-side electrode made of Al is in contact with the translucent electrode, it is likely that Al is oxidized at a contact surface with the translucent electrode to be insulated (in form of $Al_2O_3$). In such a case, the translucent electrode will be insulated from the p-side electrode.

For this reason, the metal material having high reflectivity cannot be used for the p-type electrode. As a result, once the light reaches the p-side electrode formed of a low-reflectivity material, the p-side electrode absorbs the light and therefore light extraction efficiency is reduced.

On the other hand, the light emitting element 1 of this embodiment can reduce the amount of light reaching the p-side electrode. Therefore, even when the p-side electrode is formed of a low-reflectivity material, the light absorption by the p-side electrode can be surely decreased, and therefore the light extraction efficiency can be improved.

JP 2012-114343 A discloses an n-side electrode and a p-side electrode that are partially superimposed over each other. However, JP 2012-114343 A is different from one embodiment of the present invention for the following point: penetrating electrodes that penetrate an insulating film and a semiconductor layer are used so that n-side and p-side electrodes are in electrical conduction with the n-type semiconductor and p-type semiconductor layers, respectively; and each electrode has protrusions for connecting the penetrating electrode. These differences cause some problems in the light emitting element disclosed in JP 2012-114343 A.

The penetrating electrode provided in the light emitting element of JP 2012-114343 A has a small inner diameter and tends to be of a higher electric resistance. Furthermore, the smaller inner diameter of the penetrating electrode causes the penetrating electrode to be in contact with the semiconductor layer in a smaller area. As a result, a contact resistance between the penetrating electrode and the semiconductor laminate is increased. An electric resistance of the entire light emitting element is increased with increasing in electric resistance.

In particular, in the case of the nitride semiconductor light-emitting element, since the p-type nitride semiconductor layer has the high resistance, the contact resistance between the p-type nitride semiconductor layer and the p-side penetrating electrode will be higher. Although JP 2012-114343 A discloses that the translucent electrode can be formed on the upper surface of the p-type nitride semiconductor layer, the conductive oxide material (such as ITO) for forming the translucent electrode has a sufficiently high resistance as compared with the metal material. As long as a penetrating electrode with a small diameter is used, drastic decrease of the electric resistance of the light emitting element cannot be expected.

The protrusion provided in each electrode is formed of the same metal material as that of the electrode as disclosed in JP 2012-114343 A. The protrusions increase the light shielding area. That is, according to JP 2012-114343 A, while the n-side electrode and p-side electrode are partly superimposed over each other in order to decrease the light shielding area, the protrusions must be provided in order to electrically connect these electrodes to the semiconductor layers, the protrusions increasing the light shielding area. As a result, the light shielding area cannot be sufficiently decreased, and the light extraction efficiency also cannot be sufficiently improved.

Furthermore, in JP 2012-114343 A, the contact area between the penetrating electrode and the semiconductor layer is small, and therefore a current spreading region from one penetrating electrode is narrow. If the number of the penetrating electrodes is small, the light emission distribution would get worse. If the number of penetrating electrodes is increased so as to improve the light emission distribution, the number of protrusions also has to be increased. From the viewpoint of decreasing the light shielding area as the object of JP 2012-114343 A, the number of penetrating electrodes has to be suppressed. As a result, it is difficult to achieve the excellent light emission distribution.

In contrast, according to the light emitting element 1 of this embodiment, the entire lower surface of the n-side electrode 10 (i.e. a lower surface of the n-side extending portion 12) is in contact with the n-type semiconductor layer 51 (see FIGS. 2A to 2C), and the translucent electrode 25 in connection with the p-side electrode 20 is widely in contact with the p-type semiconductor layer 53. Therefore, the contact resistance between each electrode and the corresponding semiconductor layer can be suppressed to a lower level. Additionally, in the light emitting element 1 of this embodiment, the translucent electrode 25 is used as a member for electrically connecting the p-side electrode 20 with the p-side semiconductor layer 53, and therefore the contact area between the p-side electrode 20 and the translucent electrode 25 can be increased without decreasing the light extraction efficiency. For example, the translucent electrode 25 and the p-side electrode 20 are in contact with each other at the entire lower surface of the p-side extending portion 22 (see FIGS. 2A to 2C). Therefore, the contact resistance between the translucent electrode 25 and the p-side electrode 20 can be decreased. As a result, the electric resistance of the entire light emitting element 1 can be decreased. Furthermore, a "power efficiency (lm/W)" which is obtained by dividing a flux of light (in units of lumens (lm)) by a power consumption (W), can be improved.

In this embodiment, the n-side electrode 10 is in direct contact with the n-side semiconductor layer 51, and the p-side electrode 20 is connected to and by the translucent electrode 25 having translucency. That is, in this embodiment, the protrusion having the light shielding property does not need to be additionally provided, unlike JP 2012-114343 A. Therefore, the light extraction efficiency can be sufficiently improved by decreasing the light shielding area through superimposing the p-side electrode 20 over the n-side electrode 10. That is, this embodiment can provide the light emitting element 1 with a high output. From the top side view, a ratio of the n-side and p-side electrodes 10 and 20 to the entire light emitting element 1 can be, for example, 20% or less with respect to the entire area of the light emitting element 1.

In this embodiment, as mentioned above, the entire lower surface (lower surface of the n-side extending portion 12) of the n-side electrode 10 is in contact with the n-type semiconductor layer 51 (see FIGS. 2A to 2C), and the translucent electrode 25 connected to the p-side electrode 20 is widely in contact with the p-type semiconductor layer 53, and therefore the current can be widely spread. This arrangement can provide the light emitting element with an excellent emission intensity distribution (that is, with a small deviation of emission intensity).

In the light emitting element 1 of this embodiment, the p-side electrode 20 is formed over the n-side electrode 10 through the first insulating film 31, and therefore the shapes and formation positions of the p-side electrode 20 and n-side electrode 10 can be determined without restrictions on the positional relationship therebetween or the like. Taking into consideration the emission intensity distribution, the p-side electrode 20 and the n-side electrode 10 are formed to be line-symmetric with respect to the center line of the light emitting element 1 in order to improve the in-plane uniformity of the emission intensity.

As a result, the light emitting element 1 of this embodiment can achieve at least one effect (preferably, a plurality of effects), including reduction in resistance of the light emitting element 1, increase in output, and improvement of power efficiency (lm/W).

In this embodiment, the n-side extending portion 12 is formed only at a position on the n-type semiconductor layer 51, which reduces the risk of short-circuit. Specifically, assume that, for example, a part of the n-side extending portion 12 is formed over the p-type semiconductor layer 53 via an insulating film (in the second to fourth embodiments mentioned below). In this case, if the insulating film has a crack, gap, or the like, the n-side extending portion 12 might be in contact with the p-type semiconductor layer 53, causing a leakage of current. On the other hand, in this embodiment, the n-side extending portion 12 is formed only at a position on the n-type semiconductor layer 51, and therefore such a risk can be reduced.

Although this embodiment shows the form in which the p-side electrode 20 is superimposed over the translucent electrode 25 extending over the first insulating film 31, the present invention is not limited thereto, and may have any other form as long as the translucent electrode 25 is electrically connected to the p-side electrode 20. For example, the translucent electrode 25 may not be superimposed over the p-type semiconductor layer 53 in the same plane, but instead the edge of the translucent electrode 25 and the edge of the semiconductor layer 53 can be in contact with each other. Alternatively, after the p-side electrode 20 is provided directly on the first insulating film 31, the translucent electrode 25 can also be provided to cover the first insulating film 31 and the p-side electrode 20. In the latter case, an opening for exposing the p-side pad portion 21 of the p-side electrode 20 is provided in the translucent electrode 25, which enables wire bonding or the like with the p-side pad portion 21. The contact area between the p-side electrode 20 and the translucent electrode 25 is preferably large. For example, the contact area can be larger by superimposing one electrode over the other electrode as compared to the form in which only the edges of both the electrodes are in contact with each other.

Like this embodiment, from the top view, it is desirable that the p-side electrode 20 is fully superimposed over the n-side electrode 10 (see FIGS. 1 and 2A to 2C), but the present invention is not necessarily limited thereto. In particular, at least most of the p-side extending portion 22 (for example, 70% or more, preferably 80% or more, and most preferably 90% or more of an area of the p-side extending portion 22) is superimposed over the n-side electrode 10, and therefore the light extraction efficiency can be effectively and sufficiently improved.

This is because the p-side pad portion 21 can be formed in a position far away from the strong light-emission region (or normally near the center of the light emitting element 1), for example, in the vicinity of the edge of the light emitting element, while the p-side extending portion 22 can be formed in the vicinity of the center of the light emitting element to diffuse sufficient current into the strong light-emission region. For example, in this embodiment, a part of p-side extending portion 222 is provided across the center of the light emitting element 1. In this case, the p-side extending portion 22 tends to have a significant light shielding effect as compared to the p-side pad portion 21. Most of the p-side extending portion 22 is superimposed over the n-side electrode 10 in order to reduce the light shielding area, and therefore the light extraction efficiency can be effectively improved.

Further, from the top view, 90% or more of an area of the p-side electrode 20 is preferably superimposed over the n-side electrode 10. More preferably, 95% or more, and still more preferably, 98% or more, and most preferably, 100% of the area of the p-side electrode 20 (for example, the light emitting element 1 shown in FIGS. 1 and 2A to 2C) is superimposed over the n-side electrode 10. The light reaching the p-side electrode 20 can be drastically decreased, and therefore the light extraction efficiency of the light emitting element can be improved.

The n-side extending portion 12 preferably has a plurality of parts extending in the same direction from the top view. For example, a part of n-side extending portion 121 has portions shown in FIG. 2B which extend in the same direction and are arranged in parallel with each other as shown in FIG. 1. For example, each of the parts of n-side extending portion 121 to 123 has a portion shown in FIG. 2C, and these portions extend in the same direction and are arranged in parallel with each other as shown in FIG. 1. Similarly to the p-side extending portion 22 formed over the n-side extending portion 12, the p-side extending portion 22 preferably has a plurality of parts extending in the same direction. As a result, the light emitting element 1 can uniformly emit the light, thereby improving the light emission efficiency.

The manufacturing method of the light emitting element 1 in this embodiment will be described in detail below with reference to FIGS. 1 to 10C.

1. Formation of Semiconductor Laminate 50

As shown in FIGS. 3 and 4A to 4C, the n-type semiconductor layer 51, the light emitting layer 52, and the p-type semiconductor layer 53 are formed in this order over the upper surface 60a of the substrate 60 to thereby form the semiconductor laminate 50. Then, the p-type semiconductor layer 53 and the light emitting layer 52 are partly removed to form the exposed portion 55 from which the n-type semiconductor layer 51 is exposed. In this embodiment, the exposed portion 55 is a trench (see FIGS. 4B and 4C), and has a predetermined shape from the top view (see FIG. 3). The exposed portion 55 in this embodiment includes a first part extending in a substantially square shape, a second part extending in a lateral direction and connecting the midpoints of two opposed sides (which are spaced apart in the lateral direction and extend in parallel with each other in the longitudinal direction in FIG. 3) of the first part, and circular parts each provided at the intersection of the first and second parts, from the top view of FIG. 3.

The exposed portion 55 can be provided in various methods.

For example, as mentioned above, after uniformly depositing the semiconductor laminate 50 on the substrate 60, the p-type semiconductor layer 53 and the light emitting layer 52 are partly removed by etching or the like. This method is technically established and can be advantageously carried out relatively easily.

In another method, when the semiconductor laminate 50 on the substrate 60 is formed, the n-type semiconductor layer 51 is formed over the entire upper surface 60a of the substrate 60, and then the light emitting layer 52 and the p-type semiconductor layer 53 are formed in a predetermined pattern so as to leave parts (which are to be the exposed portion 55 later) where the light emitting layer 52 and the p-type semiconductor layer 53 are not formed. This method does not need the step of partly removing the light emitting layer 52 and p-type semiconductor layer 53, but requires a special operation for growing the light emitting layer 52 and p-type semiconductor layer 53 in the predetermined pattern.

2. Formation of N-Side Extending Portion 12

As shown in FIGS. 5 and 6A to 6C, the n-side extending portion 12 (121 to 123) is formed on the n-type semiconductor layer 51 exposed on the bottom surface of the exposed portion 55. The n-side extending portion 12 is represented by the three reference numerals 121 to 123, which is to clarify the corresponding relationship of the n-side extending portion 12 between the top view (see FIG. 5, etc.) and the cross-sectional view (see FIGS. 6A to 6C, etc.)

Figure 6A:
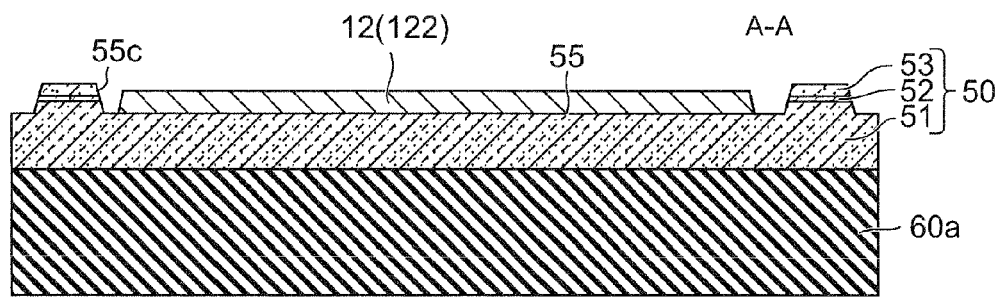
FIG. 6A is a cross-sectional view taken along the line A-A in FIG. 5.
Figure 6B:
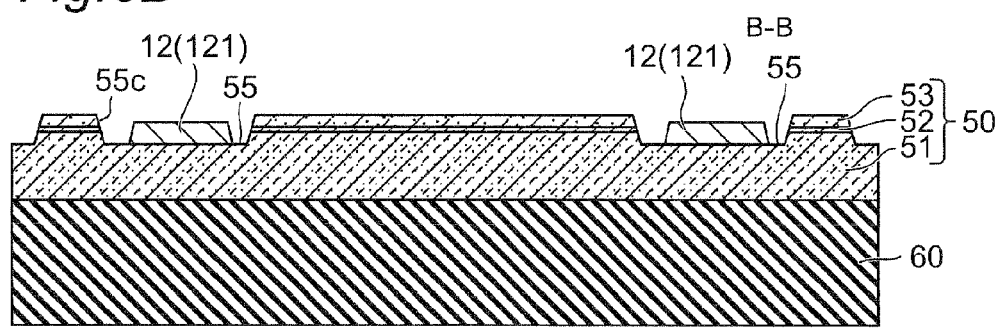
FIG. 6B is a cross-sectional view taken along the line B-B in FIG. 5.
Figure 6C:
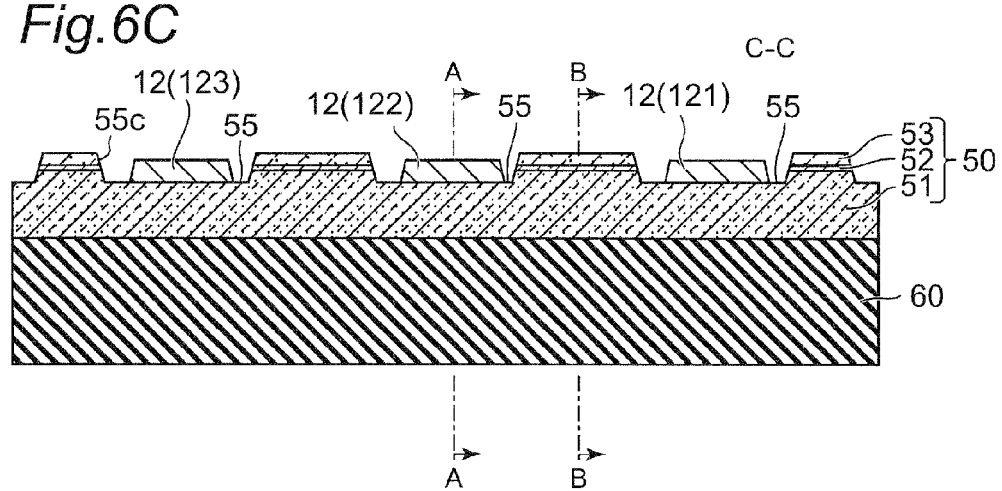
FIG. 6C is a cross-sectional view taken along the line C-C in FIG. 5.
Figure 7:
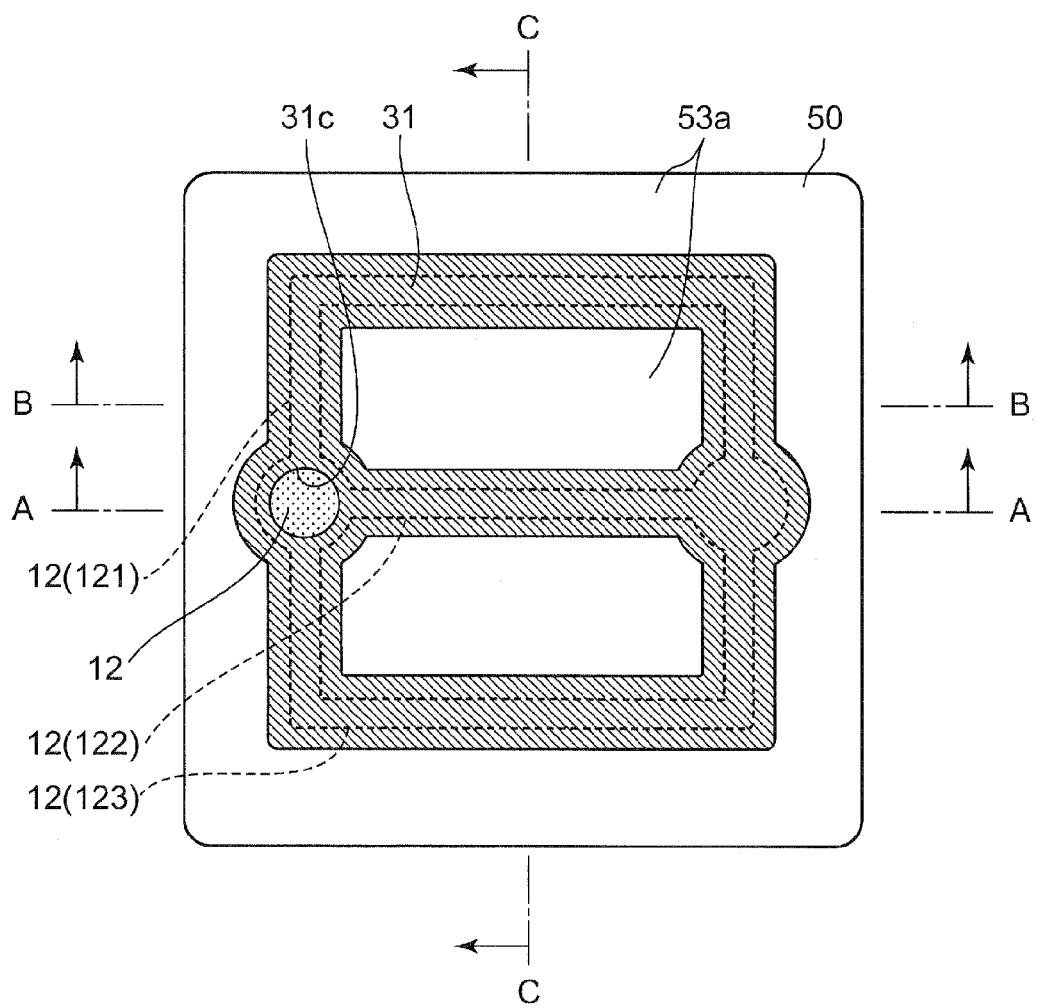
FIG. 7 is a schematic top view for explaining a manufacturing method of the light emitting element in the first embodiment of the present invention.
Figure 8A:
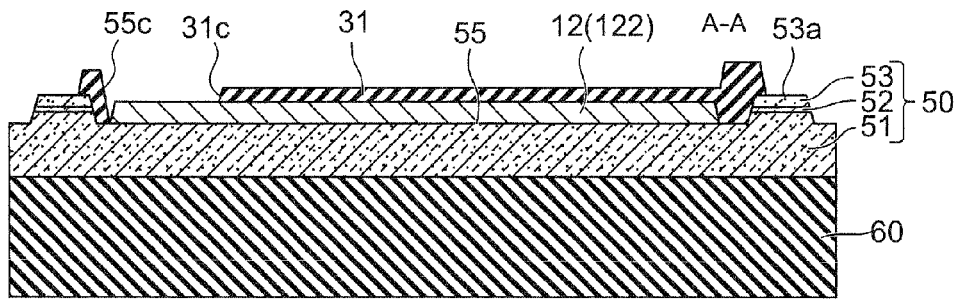
FIG. 8A is a cross-sectional view taken along the line A-A in FIG. 7.
Figure 8B:
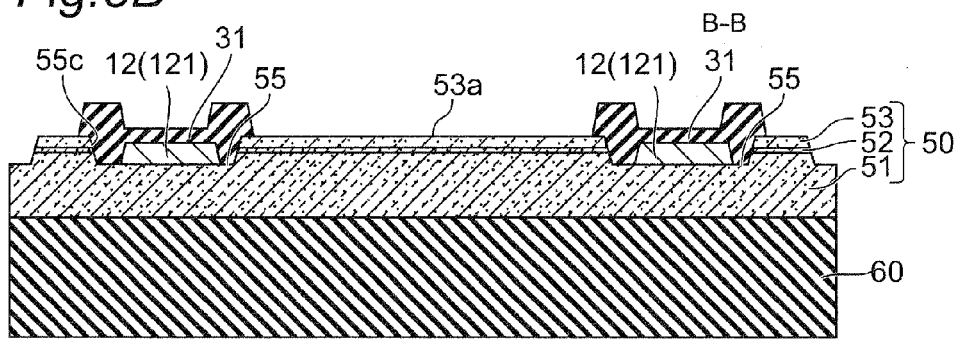
FIG. 8B is a cross-sectional view taken along the line B-B in FIG. 7.
Figure 8C:
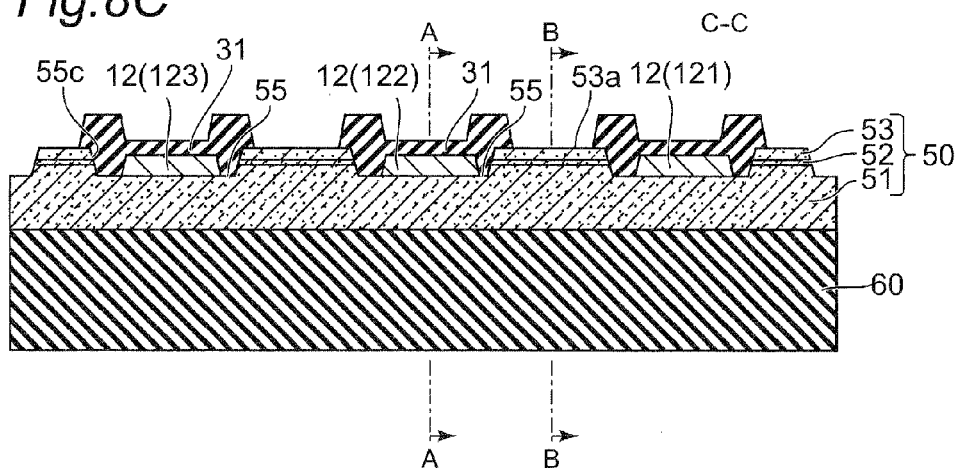
FIG. 8C is a cross-sectional view taken along the line C-C in FIG. 7.
Figure 9:
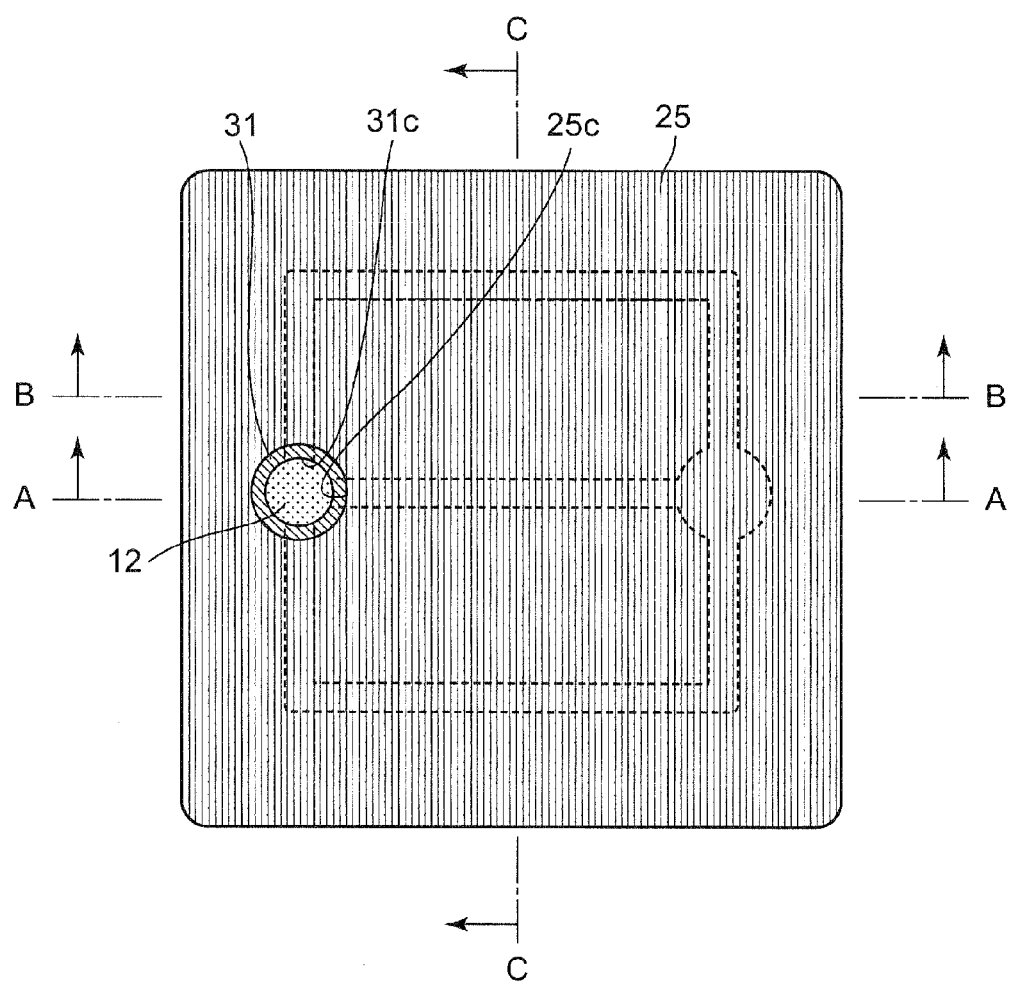
FIG. 9 is a schematic top view for explaining a manufacturing method of the light emitting element in the first embodiment of the present invention.
Figure 10A:
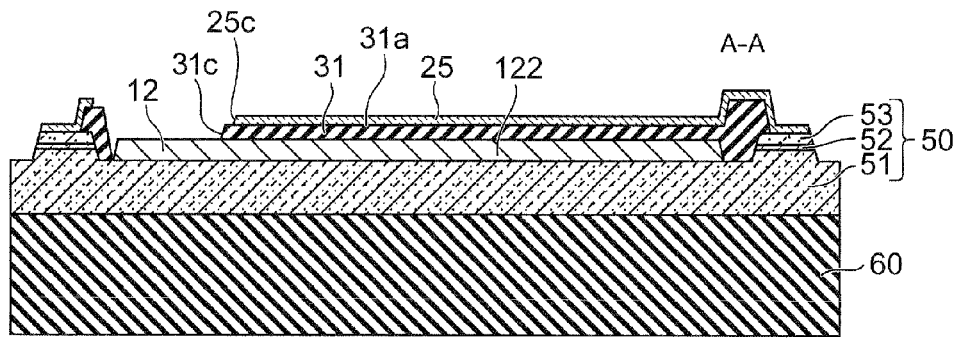
FIG. 10A is a cross-sectional view taken along the line A-A in FIG. 9.
Figure 10B:
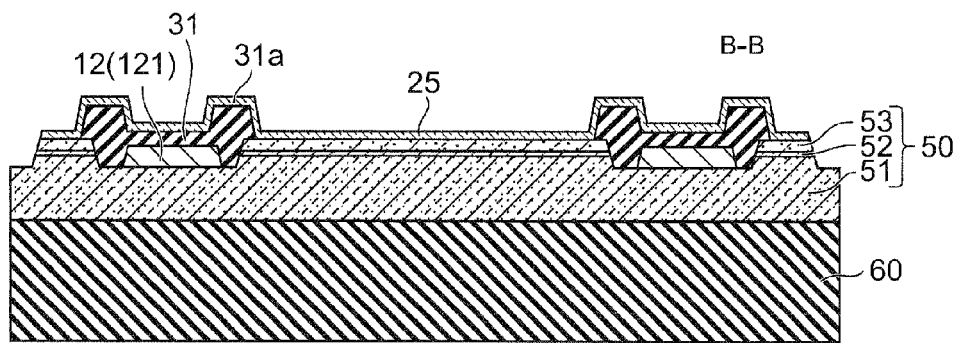
FIG. 10B is a cross-sectional view taken along the line B-B in FIG. 9.
Figure 10C:
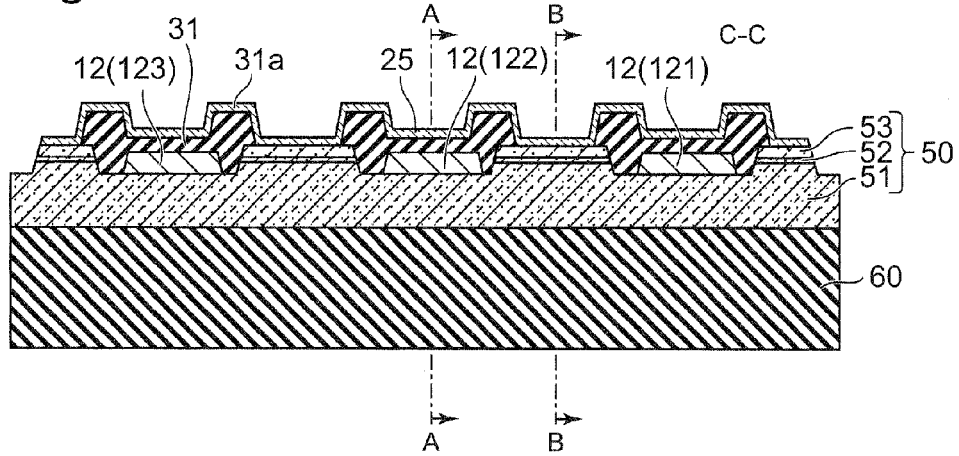
FIG. 10C is a cross-sectional view taken along the line C-C in FIG. 9.
Figure 12A:
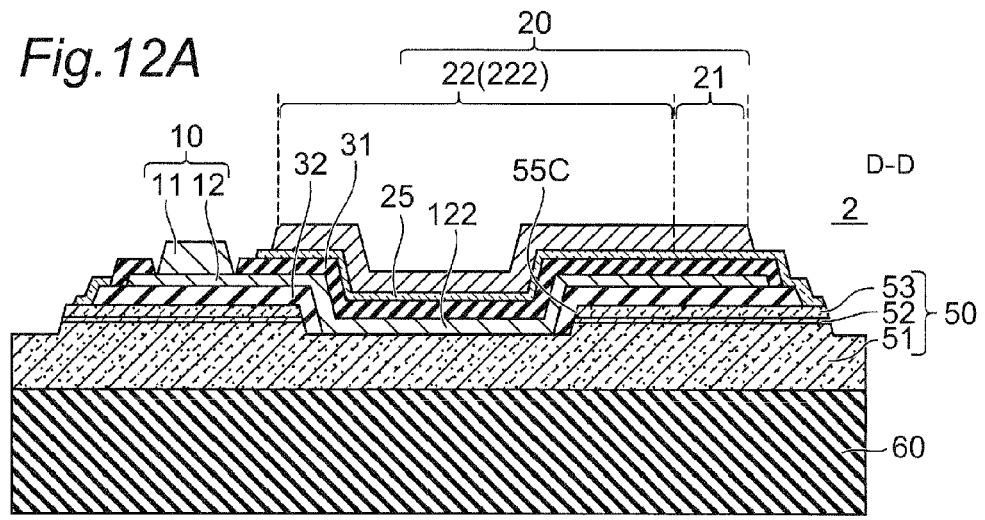
FIG. 12A is a cross-sectional view taken along the line D-D in FIG. 11.
Figure 12B:
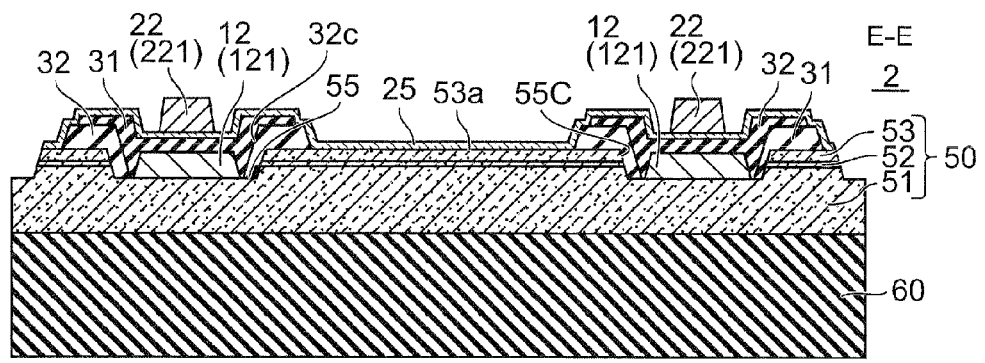
FIG. 12B is a cross-sectional view taken along the line E-E in FIG. 11.
Figure 12C:
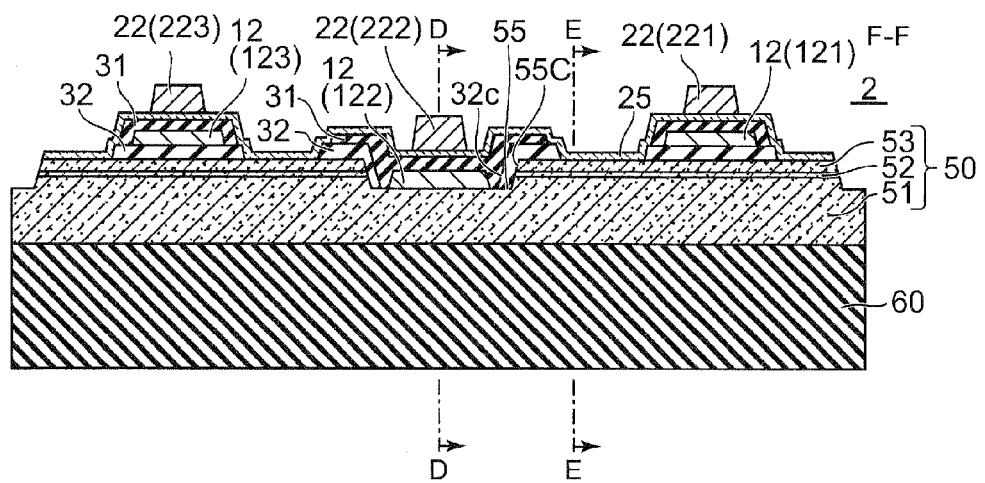
FIG. 12C is a cross-sectional view taken along the line F-F in FIG. 11.

The n-side extending portion 12 is provided in the exposed portion 55 to thereby electrically connect the n-type semiconductor layer 51 to the n-side extending portion 12. The n-type semiconductor layer 51 needs only to be electrically connected to the n-side extending portion 12. Therefore, a conductive member may be placed between the n-type semiconductor layer 51 and the n-side extending portion 12, in addition to the case where the n-side extending portion 12 is directly formed on the n-type semiconductor layer 51 as shown in FIGS. 6A to 6C.

When the n-side extending portion 12 is formed, the n-side extending portion 12 is formed to be spaced apart from the side surface 55c of the exposed portion 55 so as not to be in contact with the side surface 55c. This arrangement can prevent a short circuit due to the contact between the n-side extending portion 12 and the light emitting layer 52 and/or the p-type semiconductor layer 53 exposed on the side surface 55c that would be caused by the contact of the n-side extending portion 12 with the side surface 55c of the exposed portion 55.

3. Formation of First Insulating Film 31

As shown in FIGS. 7 and 8A to 8C, a first insulating film 31 is formed to cover the n-side extending portion 12 provided in the exposed portion 55. The first insulating film 31 is provided with an opening 31c from which the n-side extending portion 12 is partly exposed. The first insulating film 31 is adapted to insulate the n-side extending portion 12 from the p-side electrode (p-side electrode 20 and translucent electrode 25). In order to prevent the p-side and n-side electrodes from contacting the side surface 55c of the exposed portion 55, the first insulating film 31 preferably covers the side surface 55c of the exposed portion 55. At this time, the first insulating film 31 may extend up to the upper surface 53a of the p-type semiconductor layer 53 near the exposed portion 55 while overcoming the exposed portion 55 to surely insulate the side surface 55c.

As mentioned above in "2. Formation of N-side Extending Portion 12," a clearance is provided between the n-side extending portion 12 and the side surface 55c of the exposed portion 55 in forming the n-side extending portion 12. When the first insulating film 31 is formed, the clearance may be filled with the first insulating film 31. As a result, the n-side extending portion 12 can be surely insulated from the side surface 55c by the first insulating film 31.

4. Formation of Translucent Electrode 25

As shown in FIGS. 9 and 10A to 10C, the translucent electrode 25 is formed to cover almost all of the upper surface 53a of the p-type semiconductor layer 53 and the upper surface 31a of the first insulating film 31. As a result, the translucent electrode 25 is connected to the upper surface 53a of the p-type semiconductor layer 53 and extends over the first insulating film 31.

An opening 25c is provided in the translucent electrode 25, and an inner diameter of the opening 25c is larger than that of the opening 31c of the first insulating film 31. The translucent electrode 25 is positioned such that the entire opening 31c of the first insulating film 31 is exposed from the opening 25c. As a result, the n-side extending portion 12 is partially exposed through the opening 25c of the translucent electrode 25 and the opening 31c of the first insulating film 31, and the translucent electrode 25 can be avoided from being in contact with the n-side extending portion 12.

When the translucent electrode 25 is formed of conductive oxide, such as ITO, heat treatment can be carried out after formation of the translucent electrode 25 so as to reduce the contact resistance between the translucent electrode 25 and the p-type semiconductor layer 53, and to increase the transparency of the translucent electrode 25. The heat treatment may be performed at any stage until the light emitting element 1 is completed after formation of the translucent electrode 25. For example, the heat treatment can be performed before the p-side electrode 20 is formed.

5. Formation of P-Side Electrode 20 (P-Side Pad P Portion 21 and P-Side Extending Portion 22) and N-Side Pad Portion 11

As shown in FIGS. 1 and 2A to 2C, the p-side electrode 20 (p-side pad portion 21 and p-side extending portion 22) is formed on the translucent electrode 25, whereby the p-side electrode 20 is connected to the translucent electrode 25. At this time, the p-side extending portion 22 is formed to extend along the n-side extending portion 12 (see FIG. 1), and arranged to be superimposed over the n-side extending portion 12 via the first insulating film 31 (see FIGS. 1 and 2A to 2C). In this example, the p-side pad portion 21 and the p-side extending portion 22 are integrally formed together at the same time, but are not limited thereto. For example, the p-side pad portion 21 and the p-side extending portion 22 may be formed in different steps when these pad portions are intended to be formed in different thicknesses or of different metals. In order to form the thicker p-side pad portion 21, first the p-side pad portion 21 and the p-side extending portion 22 may be formed at the same time, and then an additional metal layer may be formed over only the p-side pad portion 21.

At the same time as the formation of the p-side electrode 20, the n-side pad portion 11 may be formed on a part of the n-side extending portion 12 exposing through the opening 25c of the translucent electrode 25 and through the opening 31c of the first insulating film 31. When the p-side electrode 20 and the n-side pad portion 11 are formed at the same time, the number of manufacturing steps can be decreased. The p-side electrode 20 and the n-side pad portion 11 are not limited thereto, and may be independently formed when the p-side electrode and the n-side pad portion are intended to be formed of different metals. Here, the n-side pad portion 11 is provided as a separate member from the n-side extending portion 12. Without providing the separate member, a part of the n-side extending portion 12 can serve as the n-side pad electrode. In this case, the uppermost surface of the n-side extending portion 12 may be formed of material appropriate for connection with a metal wire or the like (such as Au).

In the obtained light emitting element 1 of this embodiment, the p-side extending portion 22 of the p-side electrode 20 is superimposed over the n-side extending portion 12 of the n-side electrode 10. As a result, the light shielding area can be decreased only by a superimposed area. The p-side electrode 20 is connected to the p-side semiconductor layer 53 through the translucent electrode 25 connected to the upper surface 53a of the p-type semiconductor layer 53. The n-side electrode 10 is formed on the n-type semiconductor layer 51 exposed on the exposed portion 55 in order to be connected to the n-type semiconductor layer 51. This arrangement eliminates the necessity of forming the penetrating electrode, and the protrusion for connection with the penetrating electrode, unlike JP 2012-114343 A. As a result, the light emitting element 1 in this embodiment can improve the light extraction efficiency.

Second Embodiment

FIGS. 11 to 22C

A light emitting element 2 of this embodiment shown in FIGS. 11 and 12A to 12C differs from the light emitting element 1 of the first embodiment in that the form of the exposed portion 55 is changed, and together with this, a second insulating film 32 is provided in addition to the first insulating film 31. The light emitting element 2 of this embodiment is substantially the same as the light emitting element 1 of the first embodiment in other points. The differences from the first embodiment will be mainly described in detail below.

Figure 13:
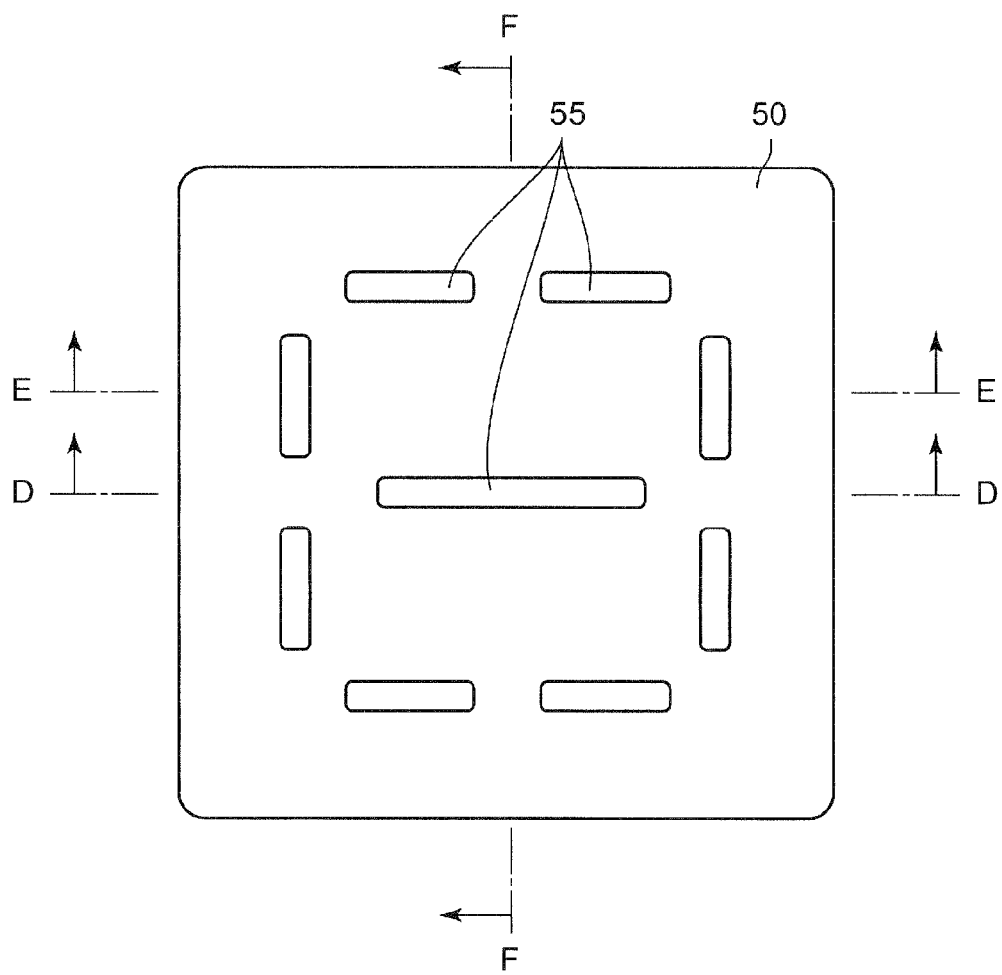
FIG. 13 is a schematic top view for explaining a manufacturing method of the light emitting element in the second embodiment of the present invention.
Figure 14A:
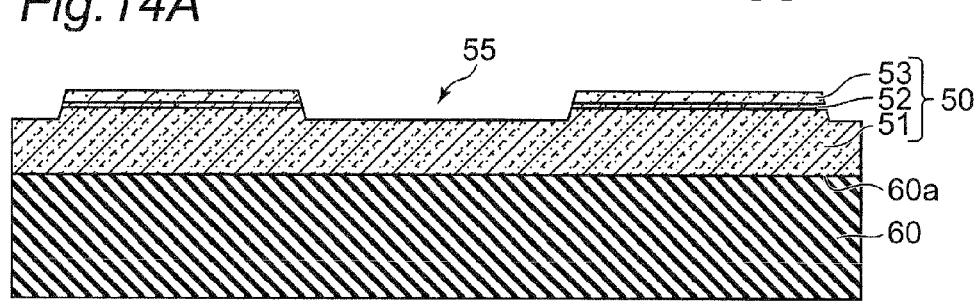
FIG. 14A is a cross-sectional view taken along the line D-D in FIG. 13.
Figure 14B:
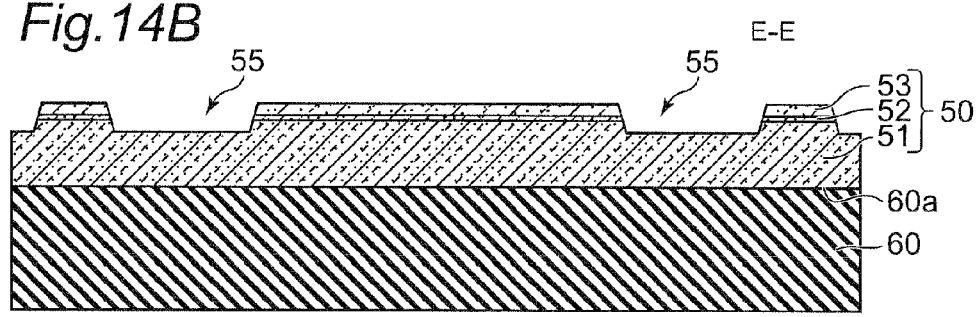
FIG. 14B is a cross-sectional view taken along the line E-E in FIG. 13.
Figure 14C:
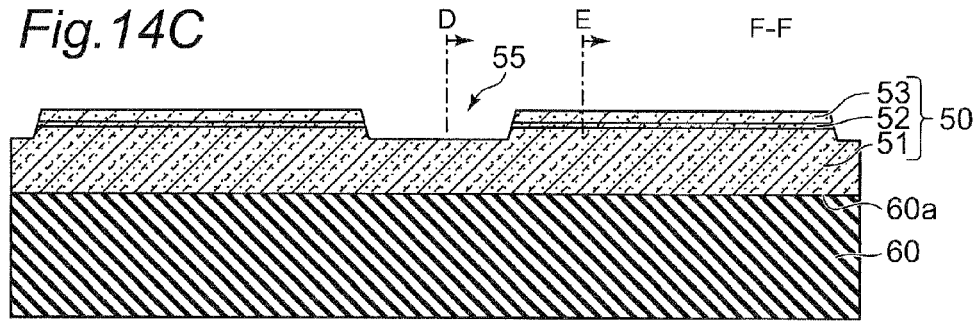
FIG. 14C is a cross-sectional view taken along the line F-F in FIG. 13.

In the light emitting element 2 of this embodiment shown in FIGS. 11 and 12A to 12C, as shown in FIG. 13, the exposed portions 55 are separated from each other. As can be seen from comparison with the continuous exposed portion 55 (see FIG. 3) of the first embodiment, the exposed portions 55 of this embodiment can be separately provided to thereby drastically decrease the area of the exposed portions 55. The exposed portions 55 are provided by removing the light emitting layer 52 and the p-type semiconductor layer 53. By decreasing the area of the exposed portions 55, a larger area of the light emitting layer 52 can be left. As a result, the light emitting element 2 in this embodiment can improve the light emission output.

In providing the n-side extending portion 12 of the n-side electrode 10, the n-side extending portion 12 is disposed (see FIG. 17) so as to connect the exposed portions 55 (see FIG. 13) that are separated from each other. At this time, the n-side extending portion 12 extends from the bottom surface of the exposed portion 55 (where the n-type semiconductor layer 51 is exposed) through the side surfaces 55c of the exposed portions 55 up to over the upper surface 53a of the p-type semiconductor layer 53 positioned between two adjacent exposed portions 55 to reach the adjacent exposed portions 55 (see FIGS. 17 and 18A). The active layer 52 and the p-type semiconductor layer 53 are exposed on the side surface 55c of the exposed portion 55. Once the n-side extending portion 12 is in contact with the side surface 55c, a short circuit will occur between the n-side extending portion 12 and each of the layers 52 and 53. If the n-side extending portion 12 extends above the upper surface 53a of the p-type semiconductor layer 53 so as to be in direct contact with the p-type semiconductor layer 53, the short circuit will occur between the n-side extending portion 12 and the p-type semiconductor layer 53.

In this embodiment, after forming the exposed portions 55, on a route where the n-side extending portion 12 is disposed, the side surface 55c of each exposed portion 55 and the upper surface 53a of the p-type semiconductor layer 53 are covered by the second insulating film 32 (see FIGS. 12A to 12C, 15, and 16A to 16C). As a result, when the n-side extending portion 12 is disposed to connect the exposed portions 55 together, the n-side extending portion 12 can be prevented from establishing a short circuit in the active layer 52 and p-type semiconductor layer 53.

In providing the second insulating film 32, openings 32c need to be provided in alignment with the positions of the exposed portions 55 (more precisely, by being aligned with the positions of the n-type semiconductor layer 51 exposed with the respective exposed portions 55). Through the openings 32c, the n-side extending portion 12 can be connected to the n-type semiconductor layer 51 exposed within the exposed portion 55.

The arrangement of the separated exposed portions 55 is not specifically limited as long as the exposed portions 55 are arranged along the disposed route of the n-side extending portion 12. For example, the arrangement of the exposed portions 55 can be arbitrarily changed or modified according to the distance between the exposed portions 55, the number of formed exposed portions 55, and the like. Here, the exposed portion 55 is preferably displaced from the position of formation of the n-side pad portion 11 and/or p-side pad portion 21 (see FIG. 12A).

If the n-side extending portion 12 is connected to the n-type semiconductor layer 51 directly under the n-side pad portion 11, current tends to flow from the n-side pad portion 11 to the n-type semiconductor layer 51 directly under the pad portion upon energizing the n-side pad portion 11. The light emission intensity in the vicinity of the n-side pad portion 11 tends to become high, and therefore the uniformity of the light emission intensity distribution is likely to degrade. Since the exposed portion 55 is not provided directly under the n-side pad portion 11 (that is, the n-side pad portion 11 is disposed over the p-type semiconductor layer 53 via the first insulating film 31), the strong light emission in the vicinity of the n-side pad portion 11 can be suppressed, and the light emission intensity distribution can be substantially uniform.

The p-side pad portion 21 is also disposed on the first insulating film 31, which stops current from flowing out of the p-side pad portion 21 toward the p-type semiconductor layer 53 located directly under the pad portion 21, thereby preventing the current from centering on a region directly under the p-side pad portion 21 to render the light emission intensity distribution substantially uniform.

The exposed portions 55 that are individually separated can have any shape. Referring to FIG. 13, each exposed portion 55 has a substantially rectangular shape, but it is not limited thereto. The exposed portion 55 can have any shape (for example, a circular shape, an elliptical shape, a square shape, a polygonal shape, or the like). The area of each exposed portion 55 is preferably set in such a manner that a contact resistance between the n-side electrode 10 and the n-type semiconductor layer 51 does not preferably become too high. For example, the total area of the exposed portions 55 is preferably 10% or less of the entire area of the light emitting element 1. The n-side electrode 10 is preferably in contact with substantially the entire regions of the exposed portions 55.

The manufacturing method of the light emitting element 2 in this embodiment will be described in detail below with reference to FIGS. 11 to 22C.

1. Formation of Semiconductor Laminate 50

Similarly to the first embodiment, the semiconductor laminate 50 is formed over the upper surface 60a of the substrate 60, and then the p-type semiconductor layer 53 and the light emitting layer 52 are partly removed to form the exposed portions 55 (see FIGS. 13 and 14A to 14C). The form of the exposed portion 55 in this embodiment differs from that in the first embodiment. The exposed portions 55 are formed separately (see FIGS. 13 and 14A to 14C).

2. Formation of Second Insulating Film 32

Unlike the first embodiment, the second insulating film 32 is formed. The second insulating film 32 is provided on a route where the n-side extending portion 12 is disposed to cover the side surface 55c of the exposed portion 55 and the upper surface 53a of the p-type semiconductor layer 53 (see FIGS. 15 and 16A to 16C). The openings 32 are provided in the second insulating film 32c in alignment with the positions of the exposed portions 55. The n-side extending portion 12 to be formed later can be connected to the n-type semiconductor layer 51 exposed within each exposed portion 55 through the opening 32c.

3. Formation of N-Side Extending Portion 12

Similarly to the first embodiment, the n-side extending portions 12 (121 to 123) are formed (see FIGS. 17 and 18A to 18C). The n-side extending portion 12 of this embodiment differs from that of the first embodiment in that the n-side extending portion 12 is formed to cover not only the n-type semiconductor layer 51 exposed on the bottom surface of the exposed portion 55, but also the second insulating film 32 covering the side surfaces 55c of the exposed portions 55 and the upper surface 53a of the p-type semiconductor layer 53. As mentioned above, the n-side extending portion 12 is electrically connected to the n-type semiconductor layer 51 within each exposed portion 55 through the opening 32c formed in the second insulating film 32.

4. Formation of First Insulating Film 31

Similarly to the first embodiment, the first insulating film 31 is formed to cover the n-side extending portion 12 (see FIGS. 19 and 20A to 20C). The first insulating film 31 of this embodiment covers not only the n-side extending portion 12 provided within the exposed portion 55, but also the n-side extending portion 12 provided over the p-type semiconductor layer 53 via the second insulating film 32. The first insulating film 31 is provided with the opening 31c from which the n-side extending portion 12 is partly exposed.

5. Formation of Translucent Electrode 25

Similarly to the first embodiment, the translucent electrode 25 is formed to cover all of the upper surface 53a of the p-type semiconductor layer 53 and the upper surface 31a of the first insulating film 31 (see FIGS. 21 and 22A to 22C). The translucent electrode 25 of this embodiment is formed to cover substantially the entire second insulating film 32 from the top view (see FIG. 22A to 22C).

Figure 22A:
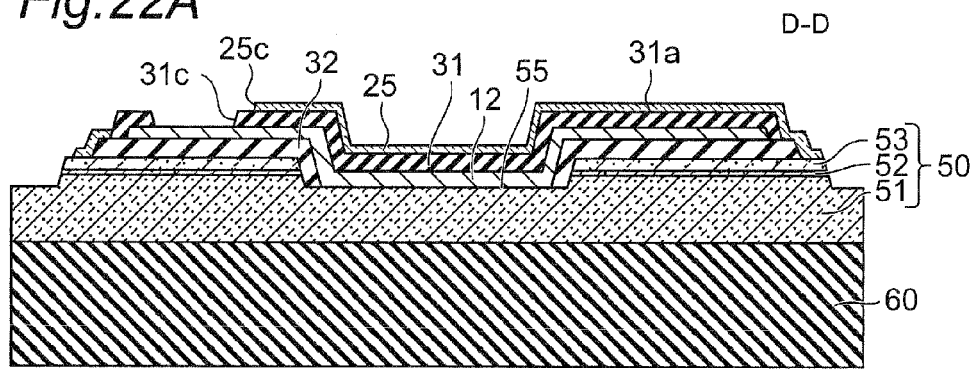
FIG. 22A is a cross-sectional view taken along the line D-D in FIG. 21.
Figure 22B:
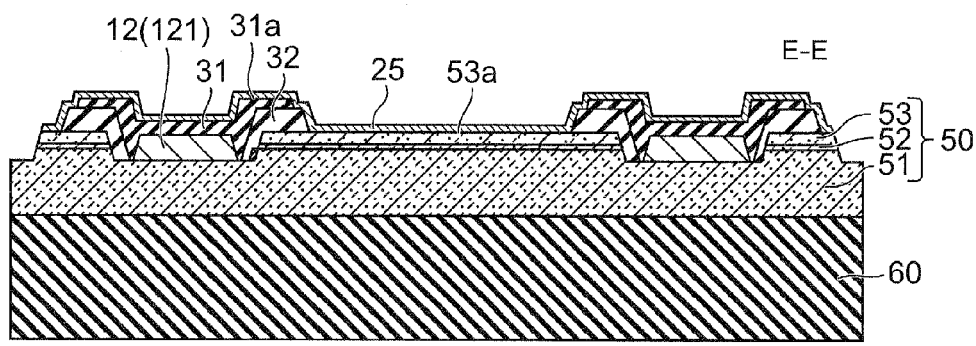
FIG. 22B is a cross-sectional view taken along the line E-E in FIG. 21.
Figure 22C:
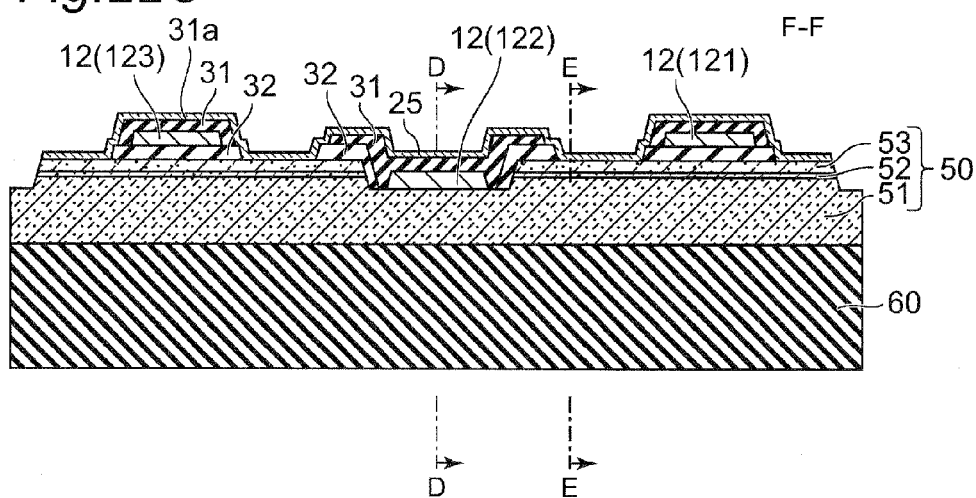
FIG. 22C is a cross-sectional view taken along the line F-F in FIG. 21.
Figure 23:
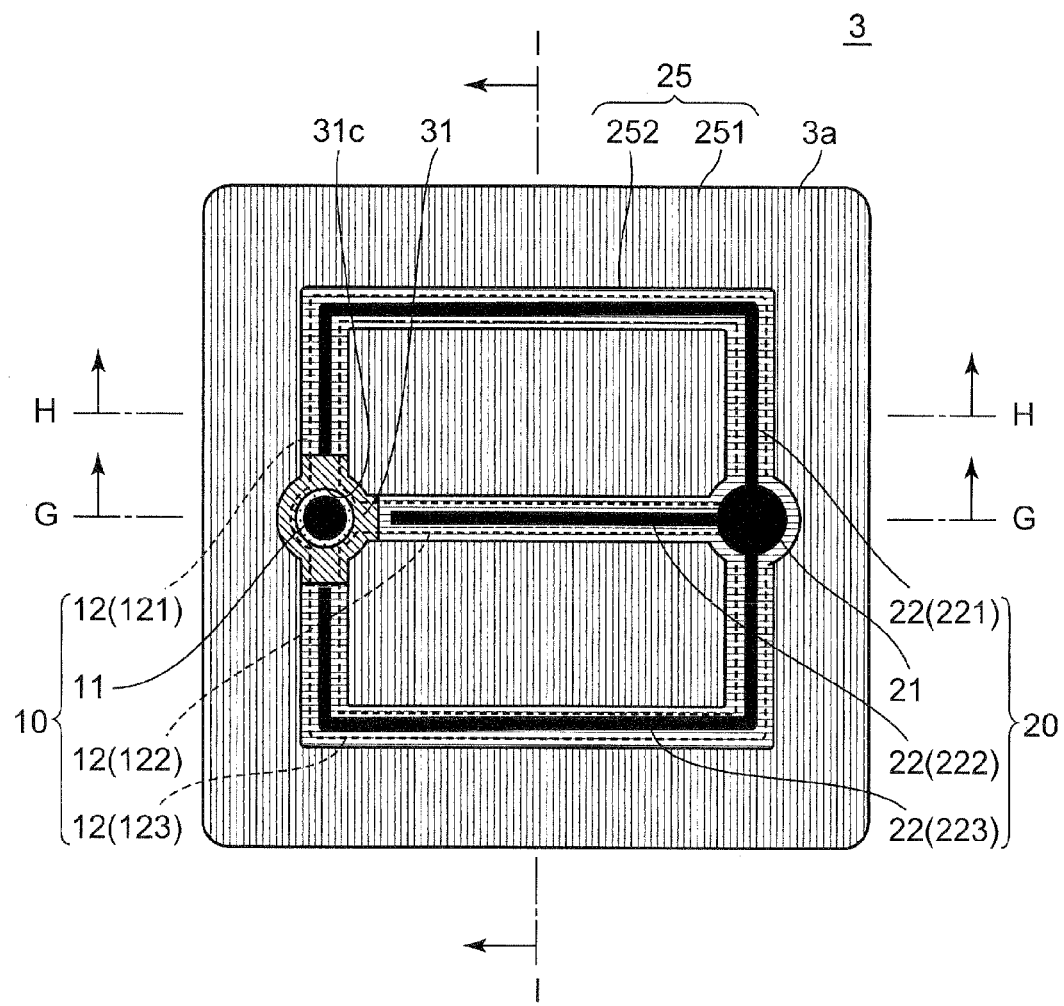
FIG. 23 is a schematic top view of a light emitting element according to a third embodiment of the present invention.
Figure 24A:
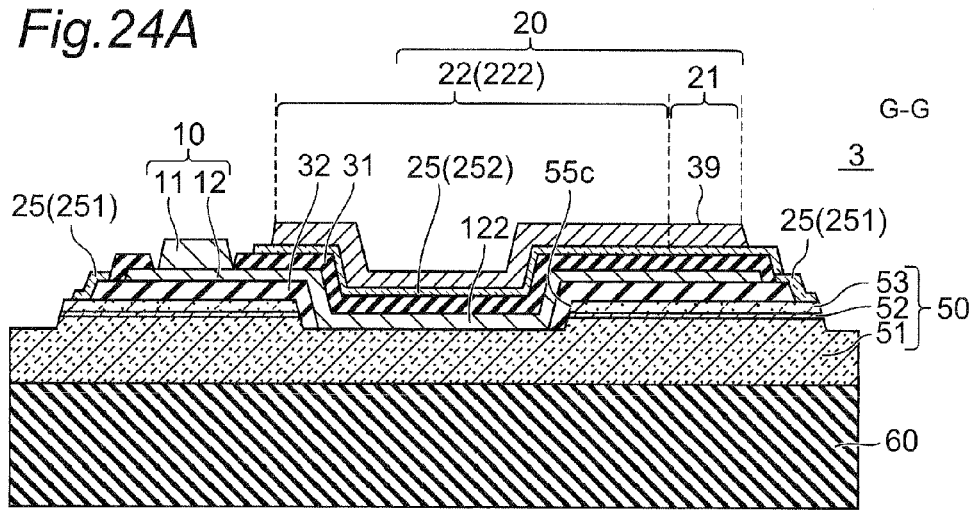
FIG. 24A is a cross-sectional view taken along the line G-G in FIG. 23.
Figure 24B:
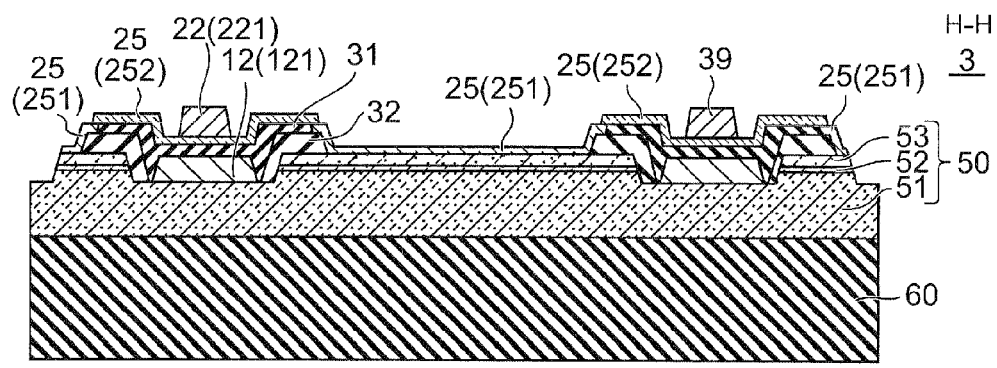
FIG. 24B is a cross-sectional view taken along the line H-H in FIG. 23.
Figure 24C:
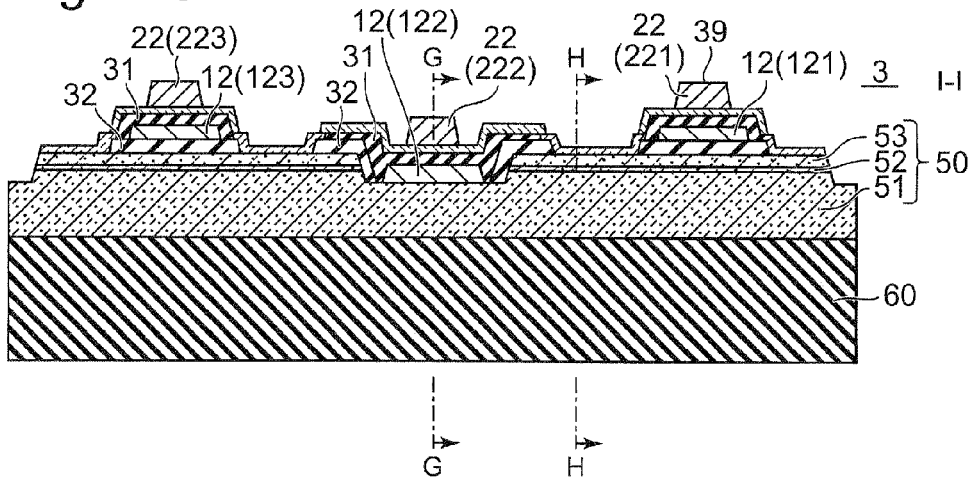
FIG. 24C is a cross-sectional view taken along the line I-I in FIG. 23.
Figure 25:
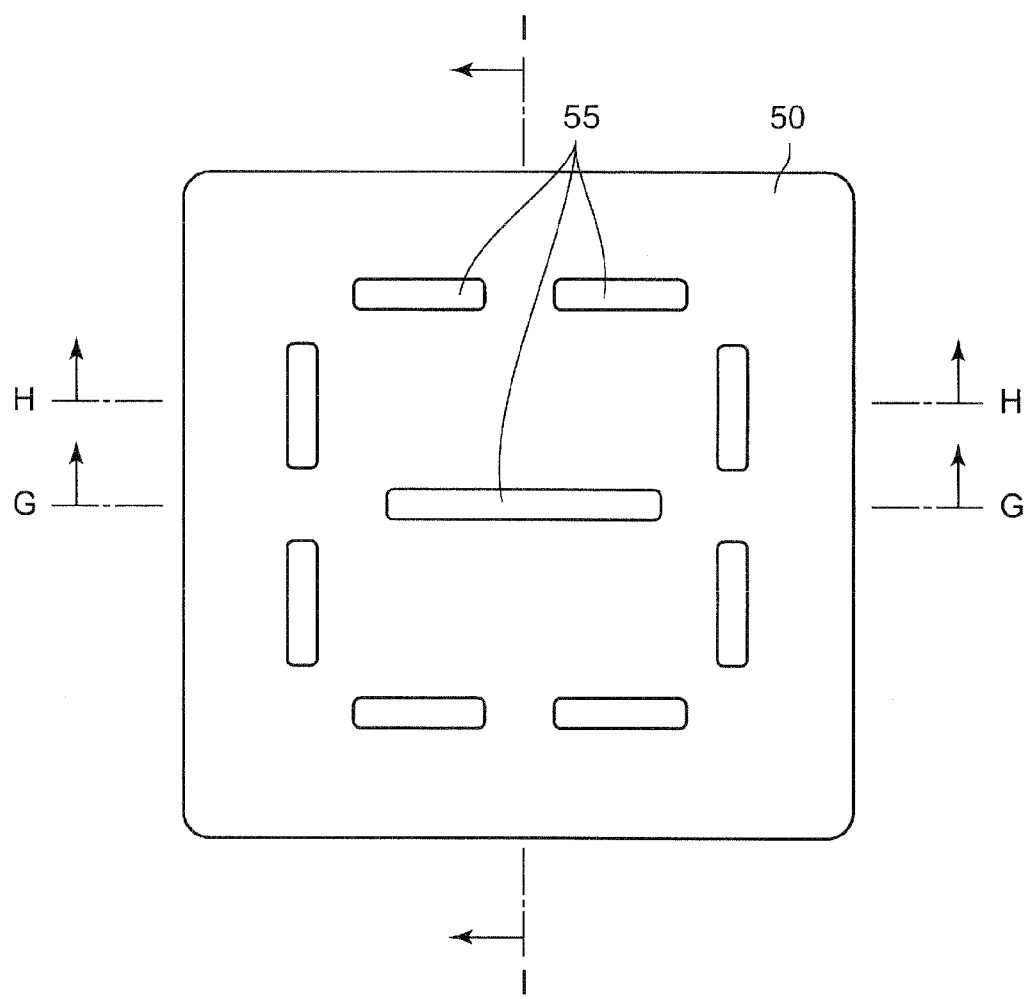
FIG. 25 is a schematic top view for explaining a manufacturing method of the light emitting element in the third embodiment of the present invention.
Figure 26A:
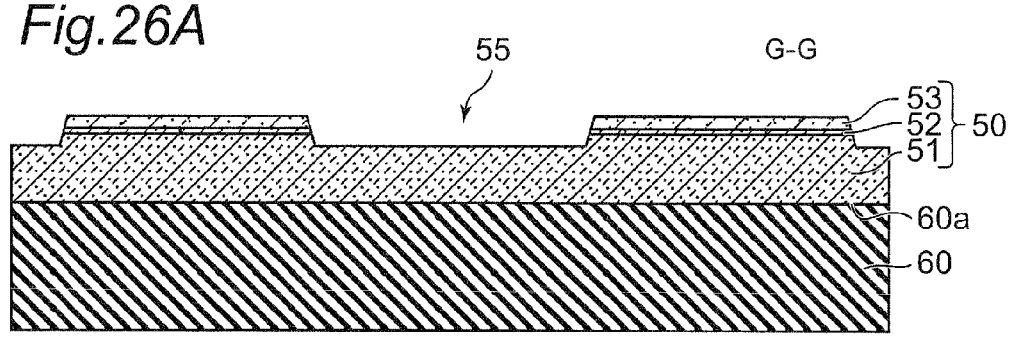
FIG. 26A is a cross-sectional view taken along the line G-G in FIG. 25.
Figure 26B:
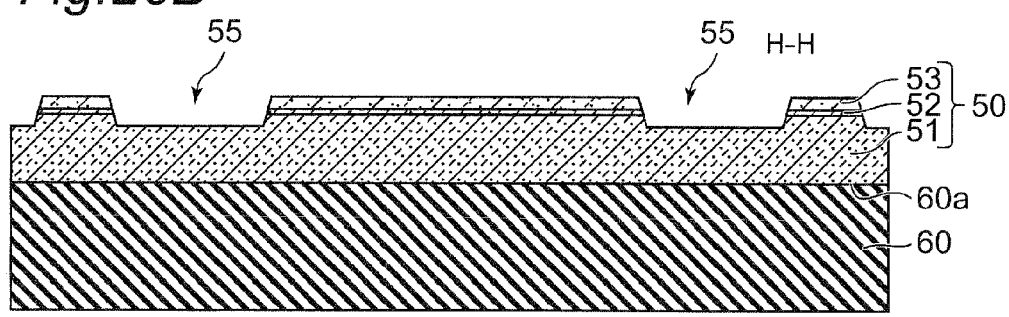
FIG. 26B is a cross-sectional view taken along the line H-H in FIG. 25.
Figure 26C:
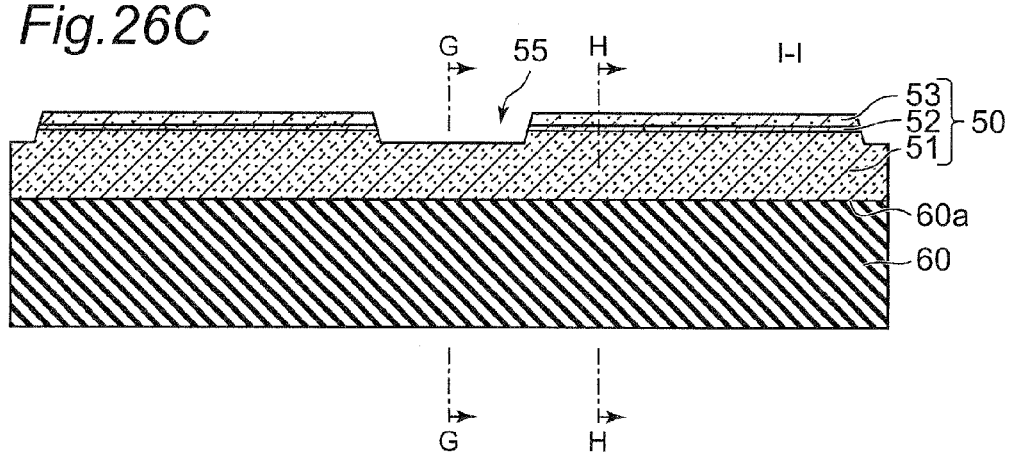
FIG. 26C is a cross-sectional view taken along the line I-I in FIG. 25.
Figure 27:
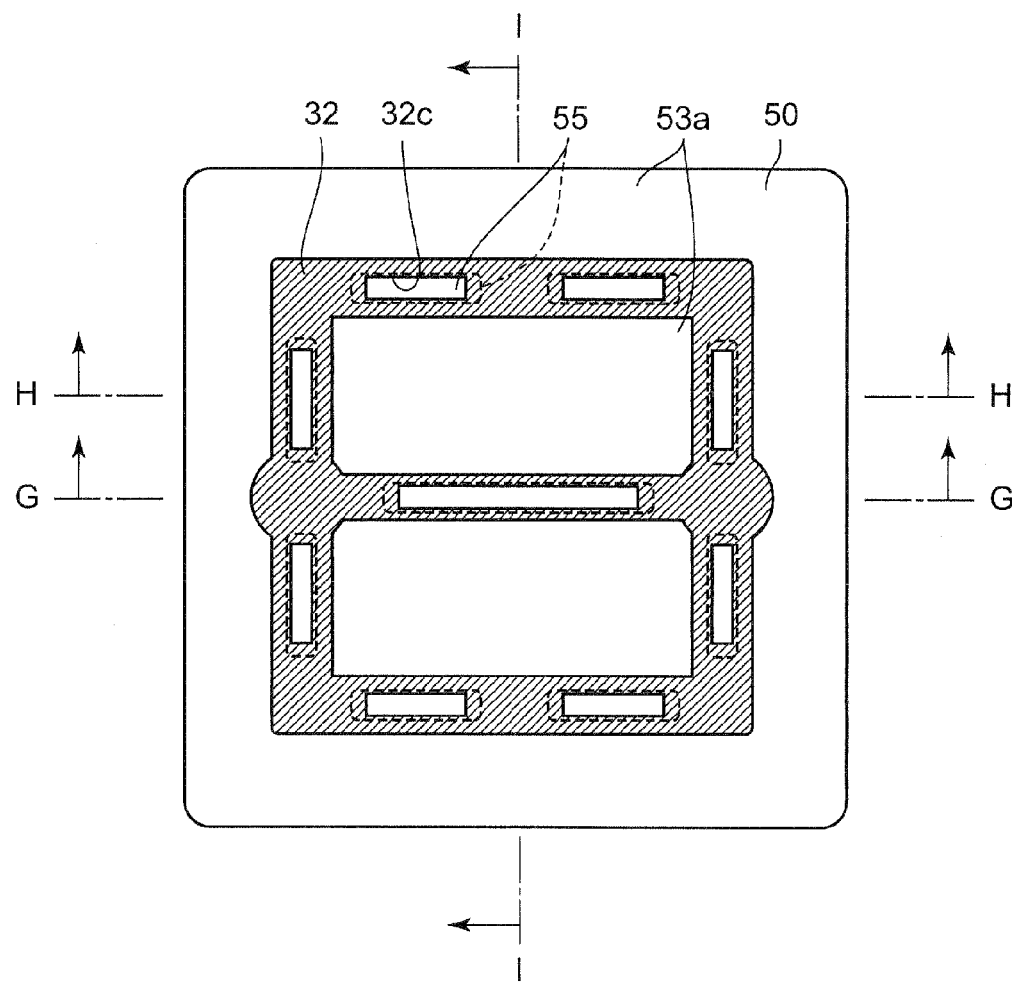
FIG. 27 is a schematic top view for explaining a manufacturing method of the light emitting element in the third embodiment of the present invention.
Figure 28A:
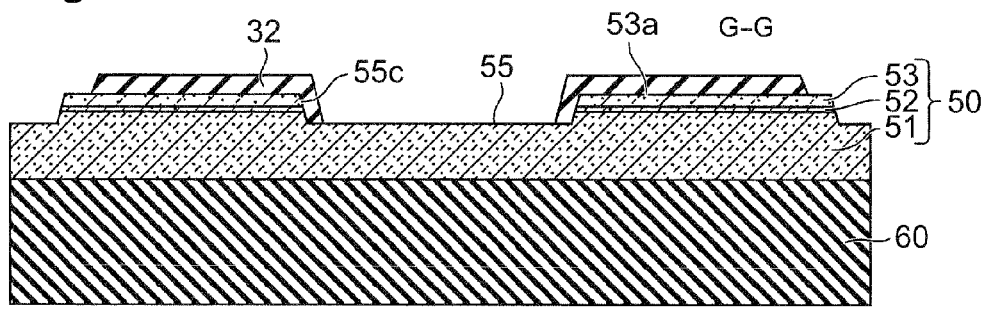
FIG. 28A is a cross-sectional view taken along the line G-G in FIG. 27.
Figure 28B:
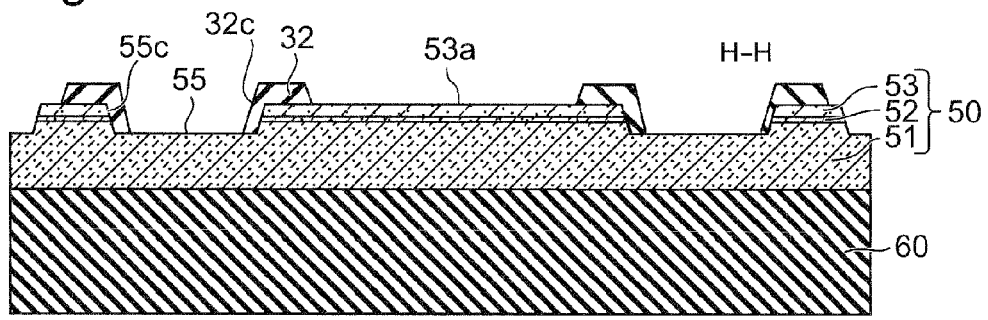
FIG. 28B is a cross-sectional view taken along the line H-H in FIG. 27.
Figure 28C:
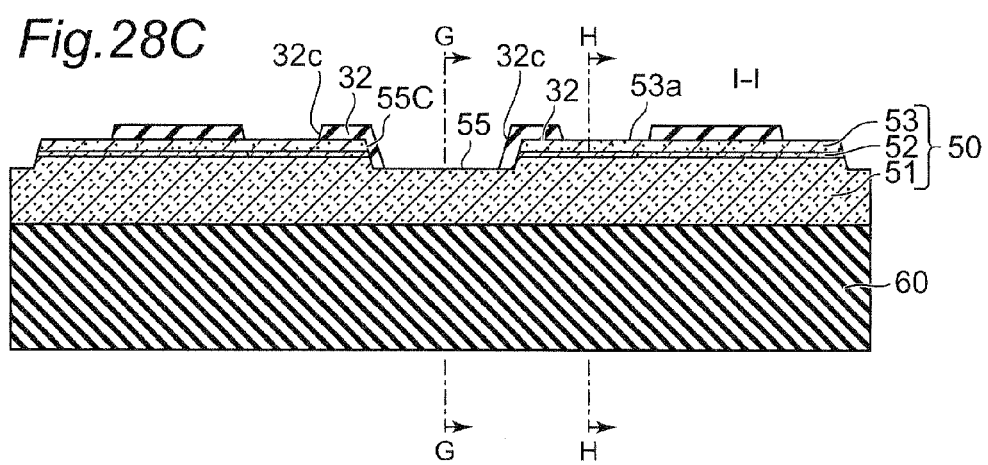
FIG. 28C is a cross-sectional view taken along the line I-I in FIG. 27.
Figure 29:
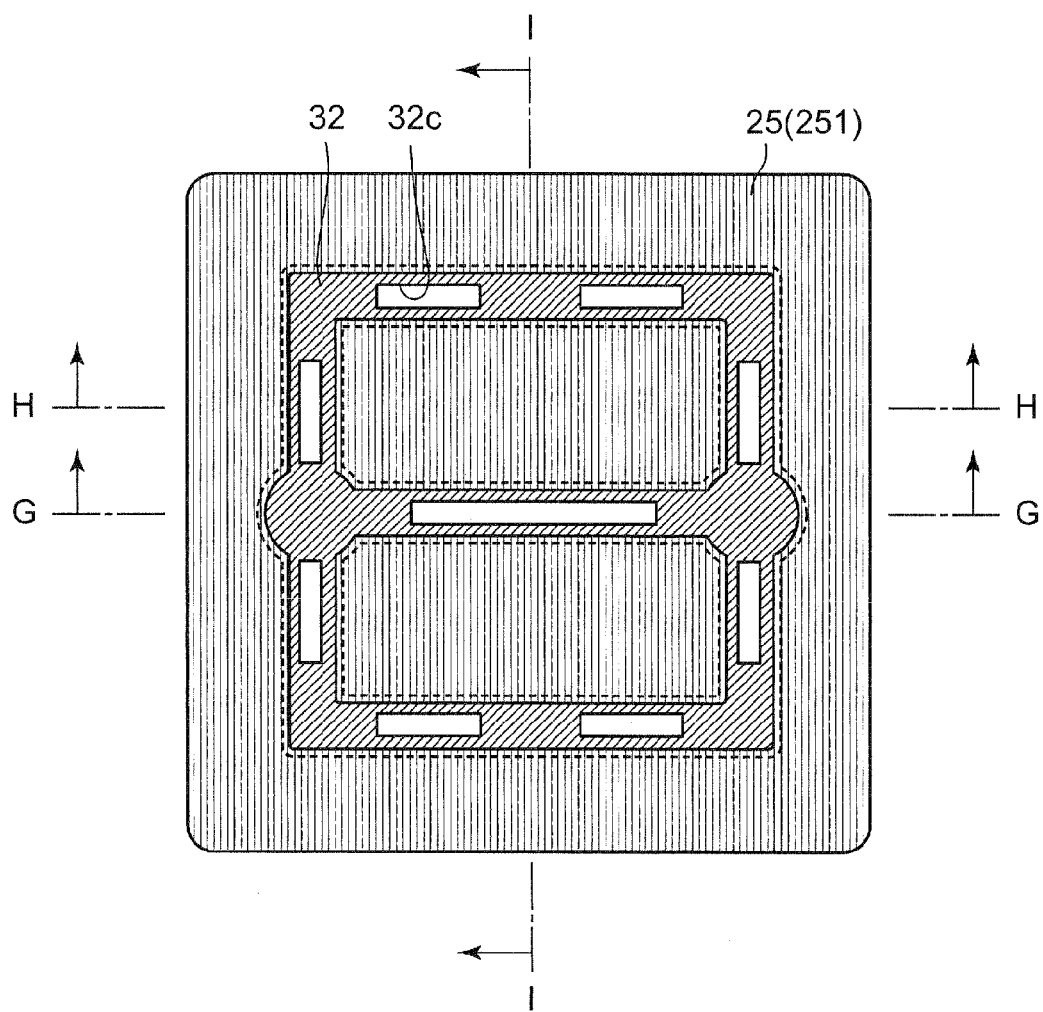
FIG. 29 is a schematic top view for explaining a manufacturing method of the light emitting element in the third embodiment of the present invention.
Figure 30A:
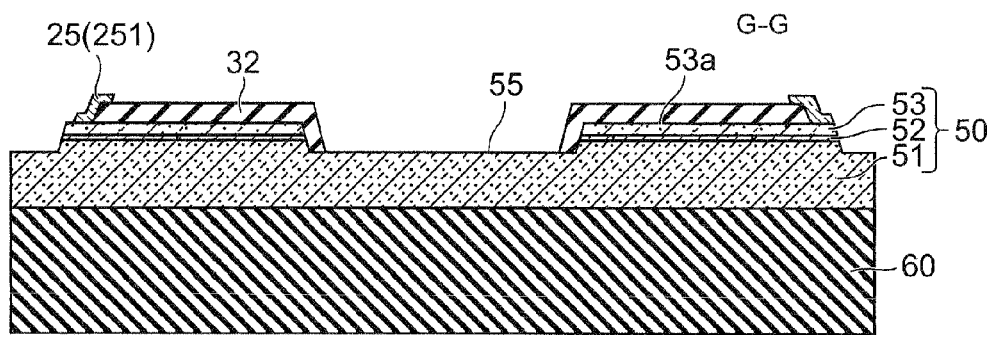
FIG. 30A is a cross-sectional view taken along the line G-G in FIG. 29.
Figure 30B:
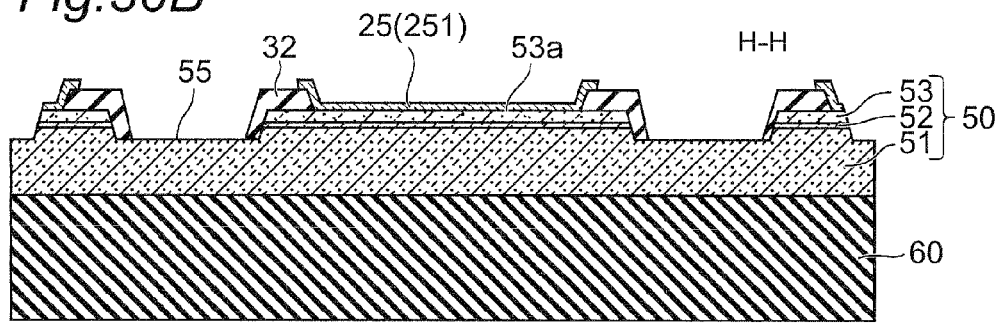
FIG. 30B is a cross-sectional view taken along the line H-H in FIG. 29.
Figure 30C:
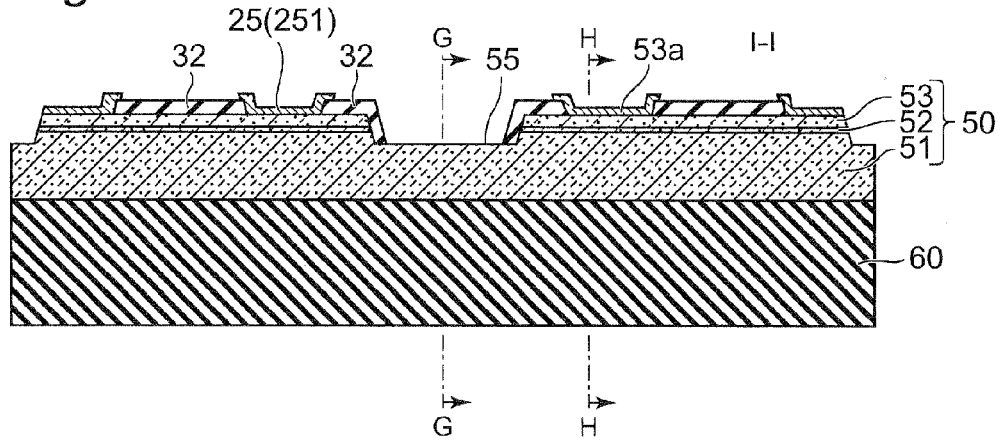
FIG. 30C is a cross-sectional view taken along the line I-I in FIG. 29.
Figure 31:
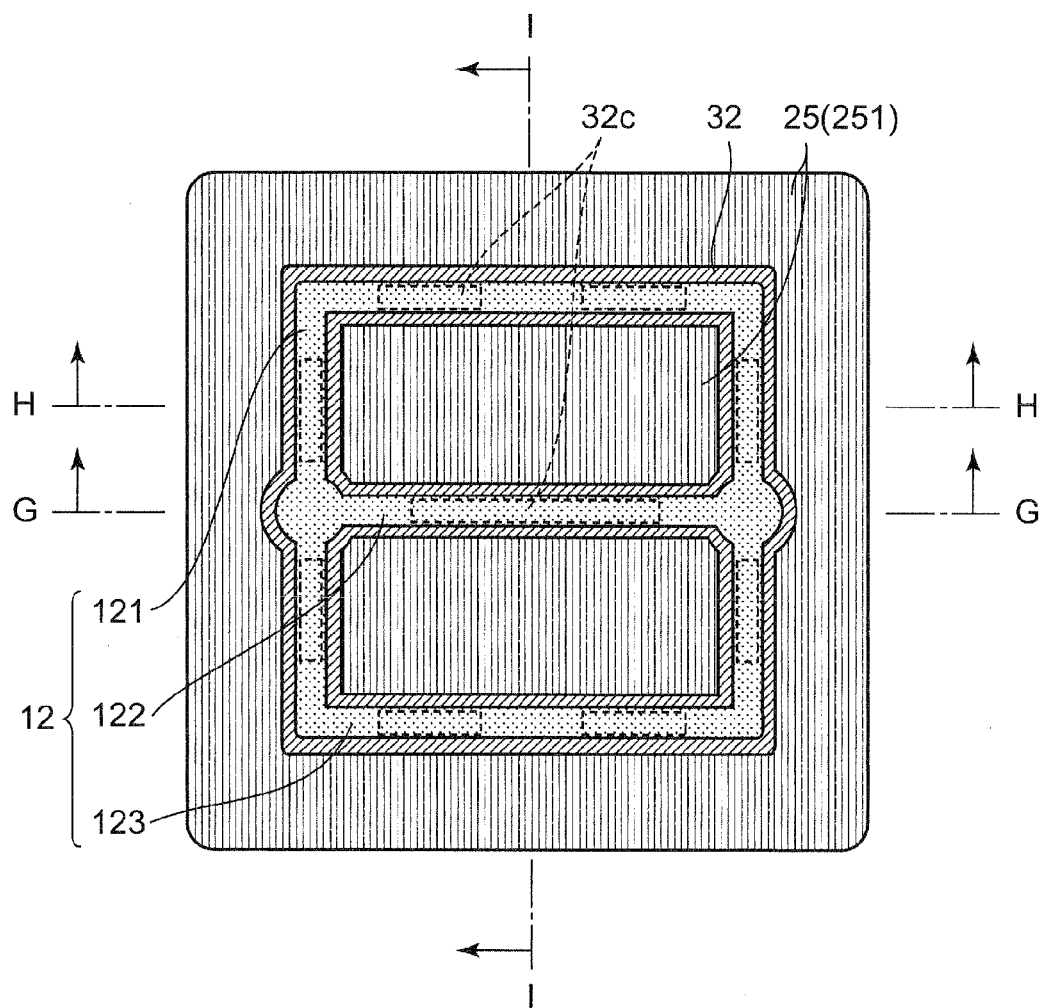
FIG. 31 is a schematic top view for explaining a manufacturing method of the light emitting element in the third embodiment of the present invention.
Figure 32A:
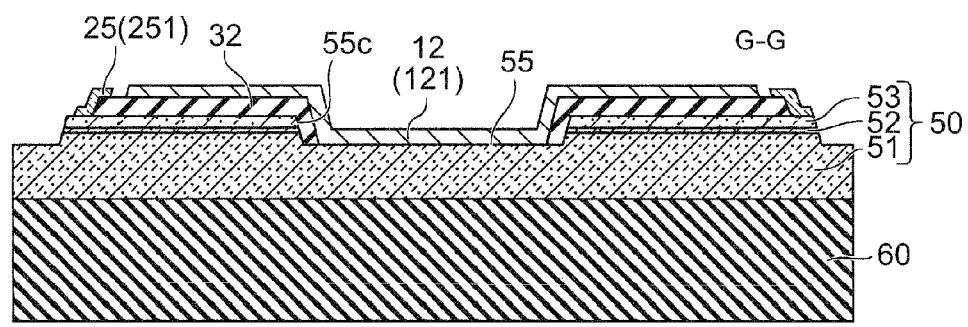
FIG. 32A is a cross-sectional view taken along the line G-G in FIG. 31.
Figure 32B:
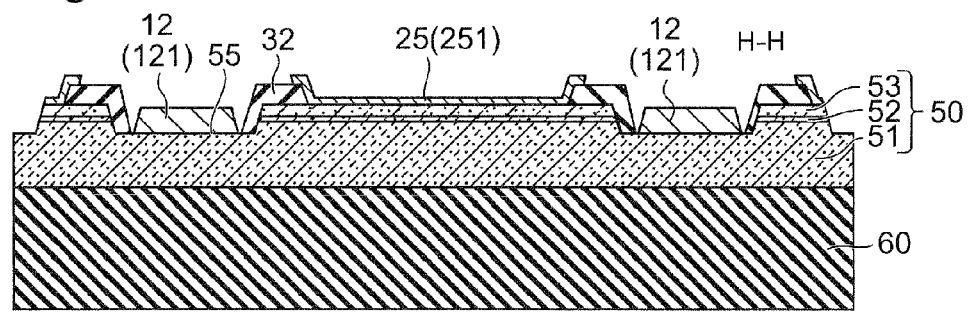
FIG. 32B is a cross-sectional view taken along the line H-H in FIG. 31.
Figure 32C:
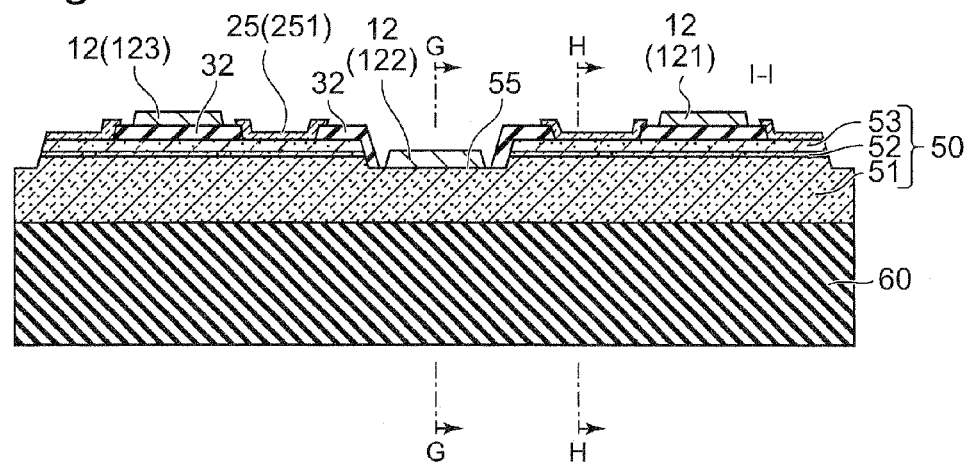
FIG. 32C is a cross-sectional view taken along the line I-I in FIG. 31.
Figure 33:
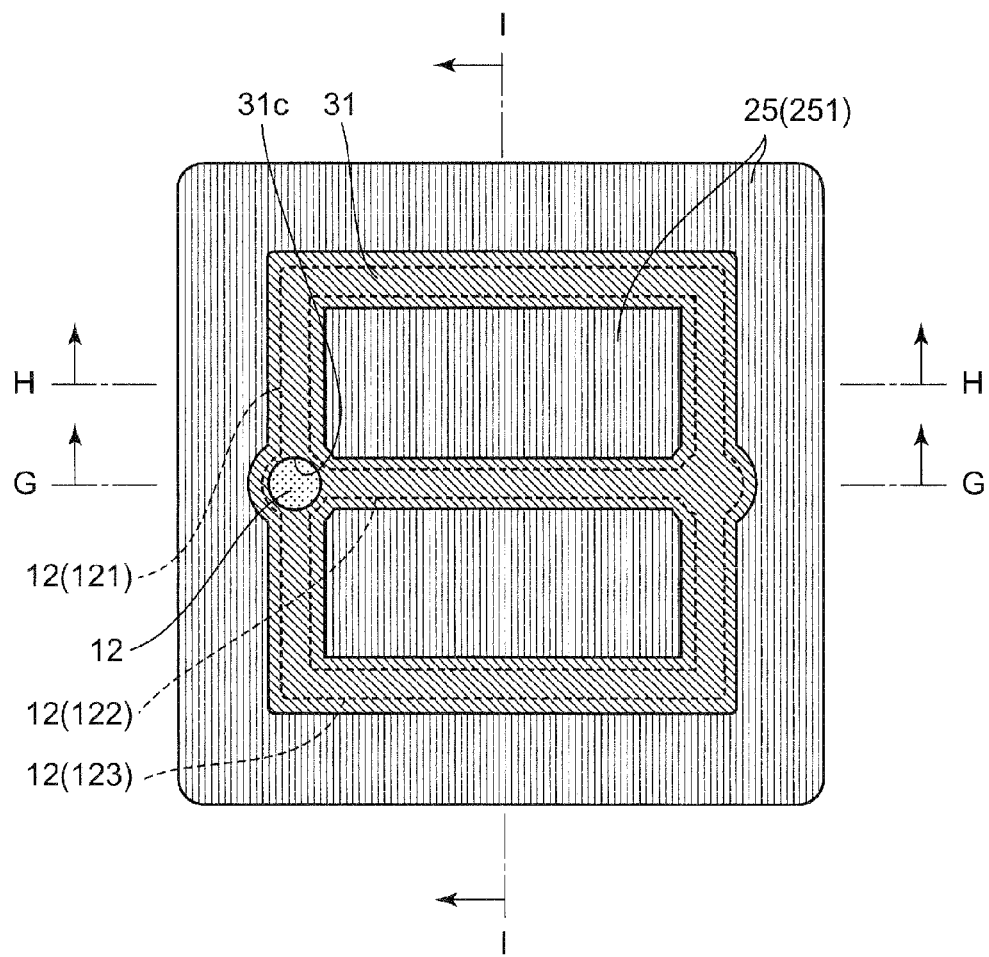
FIG. 33 is a schematic top view for explaining a manufacturing method of the light emitting element in the third embodiment of the present invention.
Figure 34A:
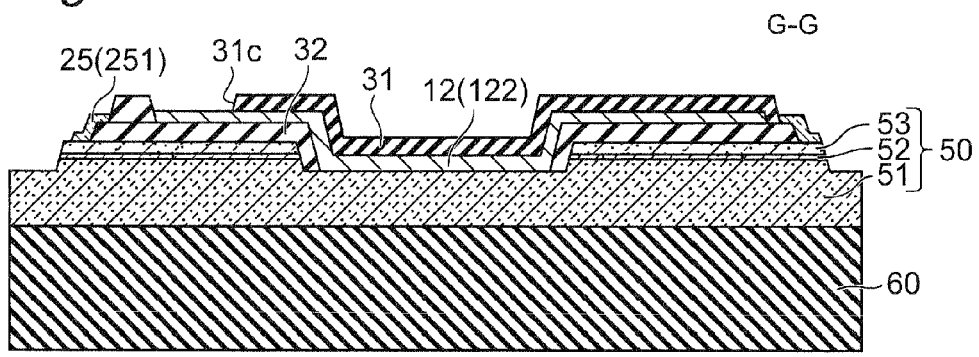
FIG. 34A is a cross-sectional view taken along the line G-G in FIG. 33.
Figure 34B:
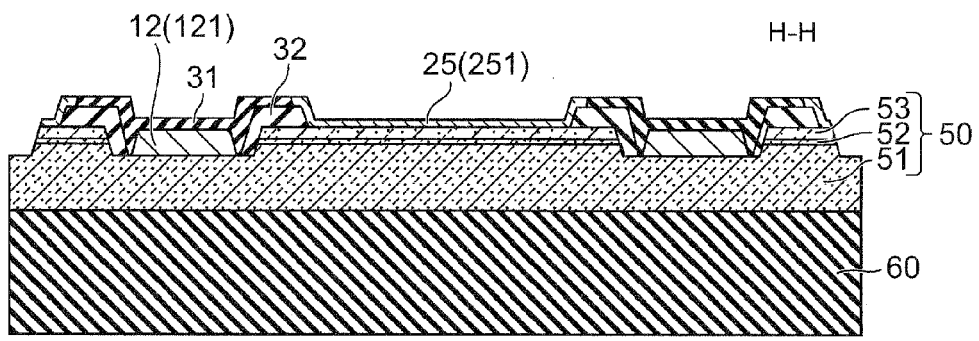
FIG. 34B is a cross-sectional view taken along the line H-H in FIG. 33.
Figure 34C:
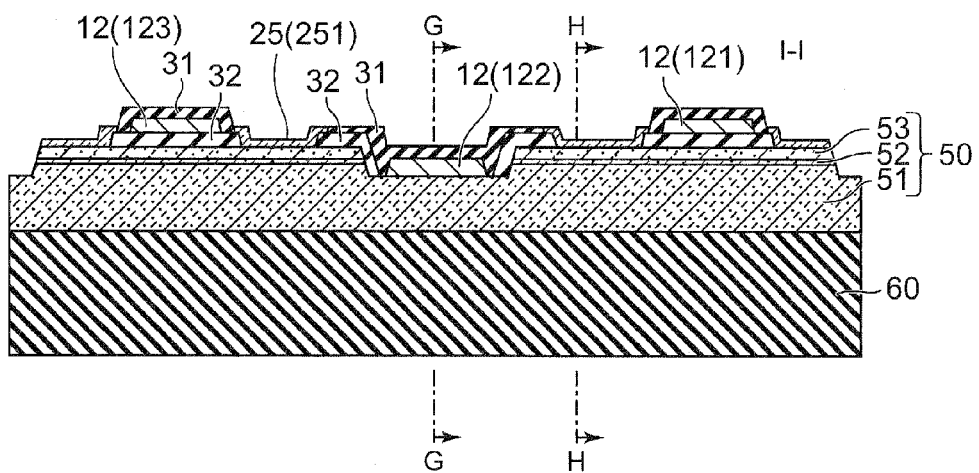
FIG. 34C is a cross-sectional view taken along the line I-I in FIG. 33.
Figure 35:
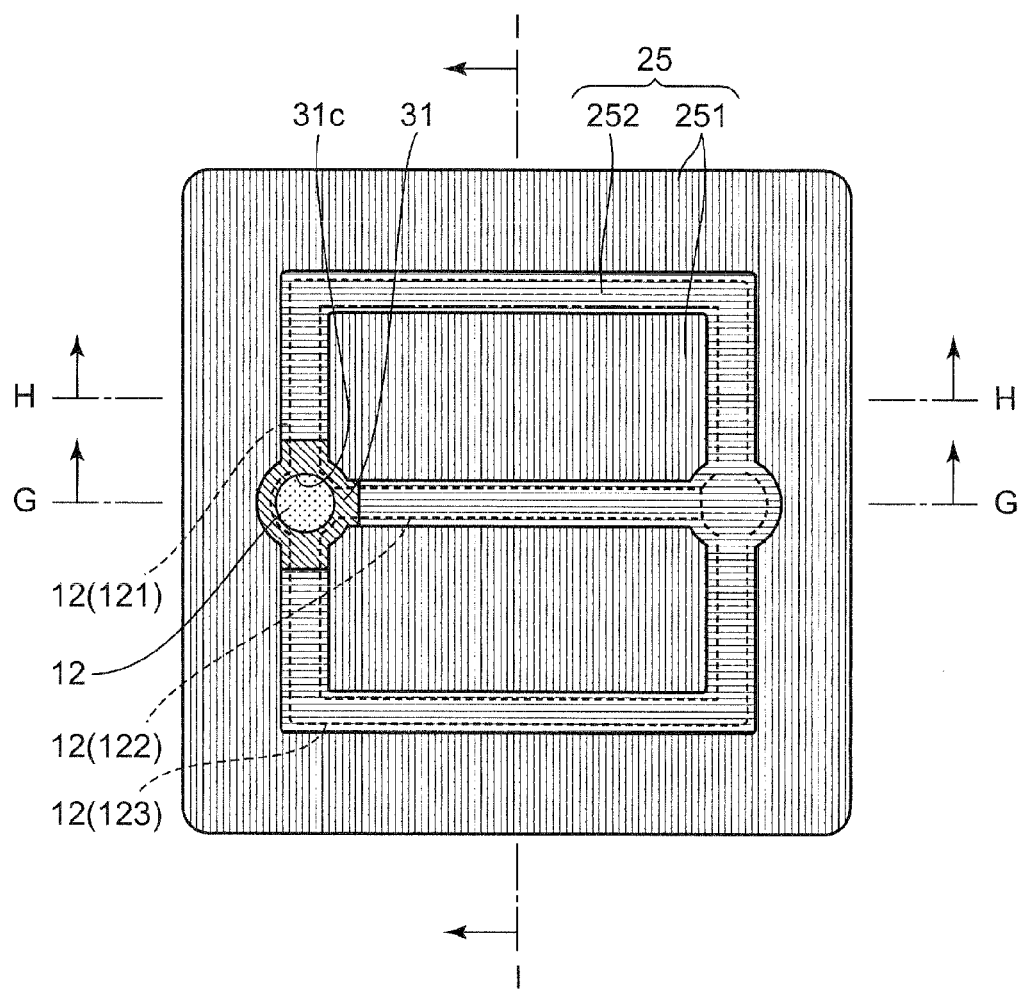
FIG. 35 is a schematic top view for explaining a manufacturing method of the light emitting element in the third embodiment of the present invention.
Figure 36A:
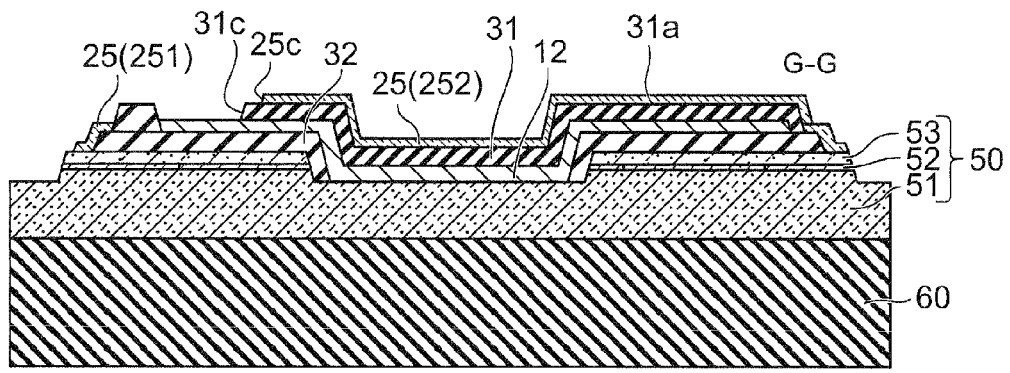
FIG. 36A is a cross-sectional view taken along the line G-G in FIG. 35.
Figure 36B:
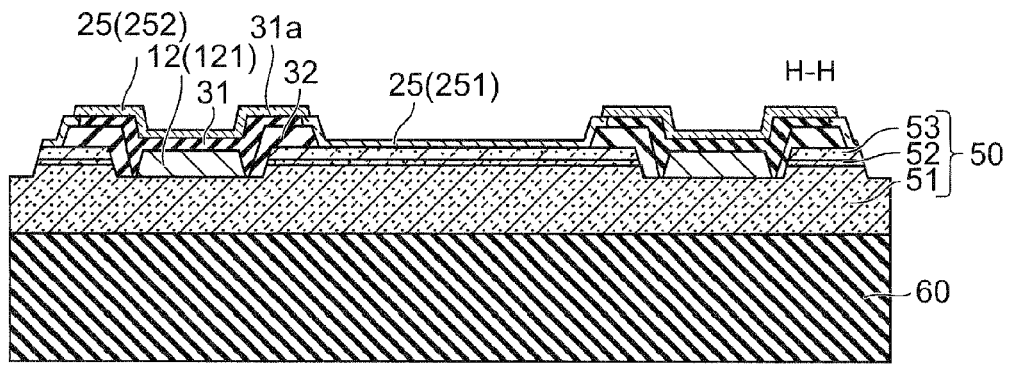
FIG. 36B is a cross-sectional view taken along the line H-H in FIG. 35.
Figure 36C:
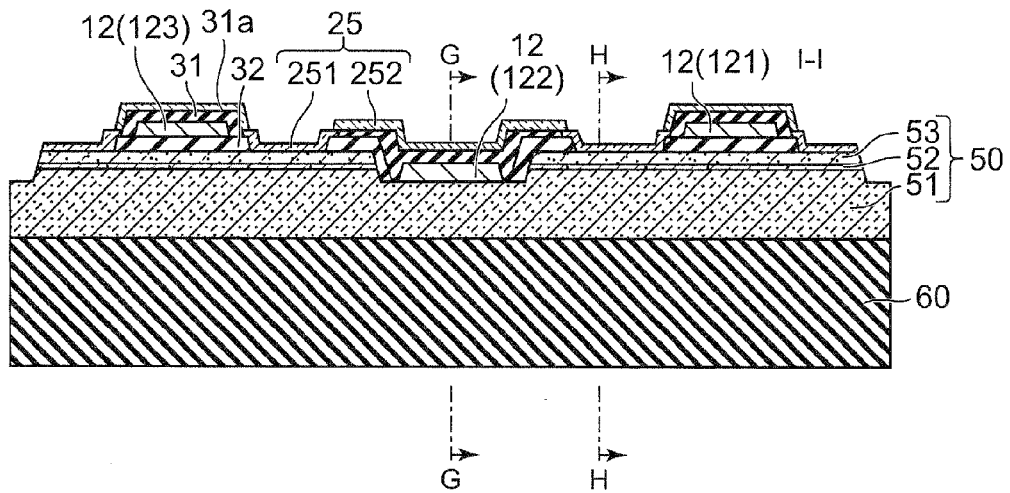
FIG. 36C is a cross-sectional view taken along the line I-I in FIG. 35.
Figure 37:
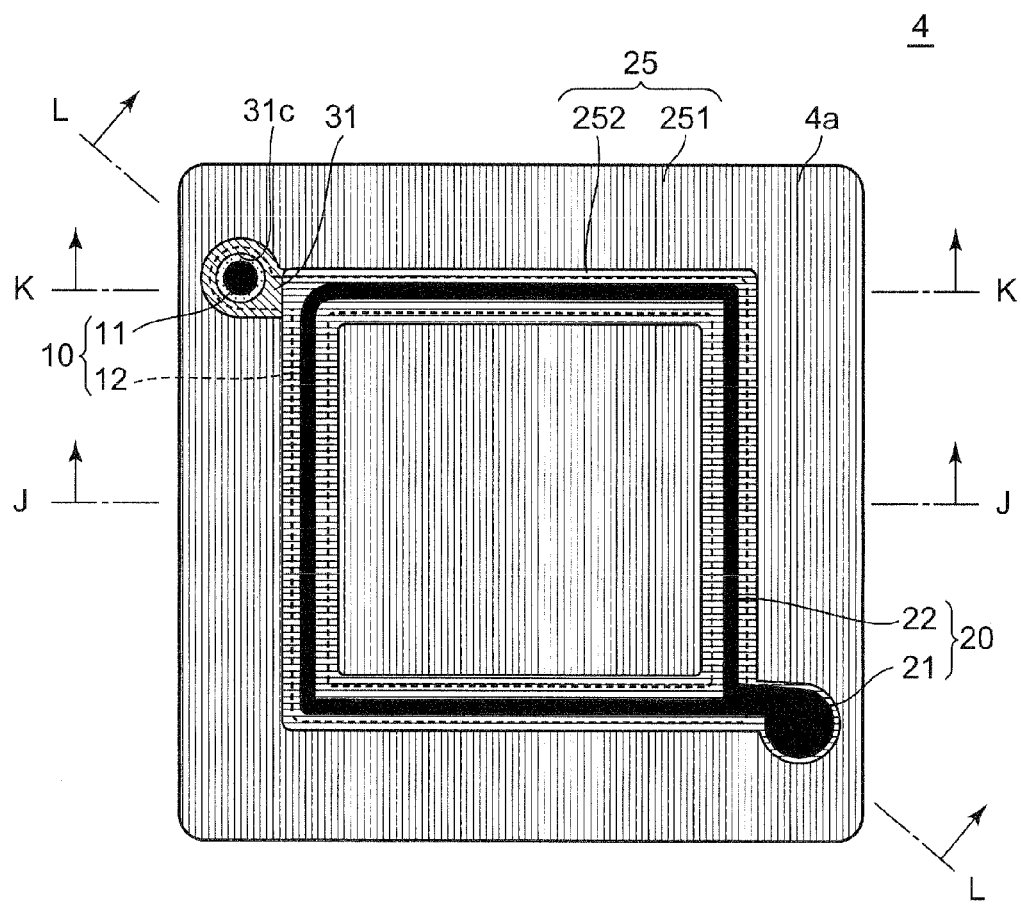
FIG. 37 is a schematic top view of a light emitting element according to a fourth embodiment of the present invention.
Figure 38A:
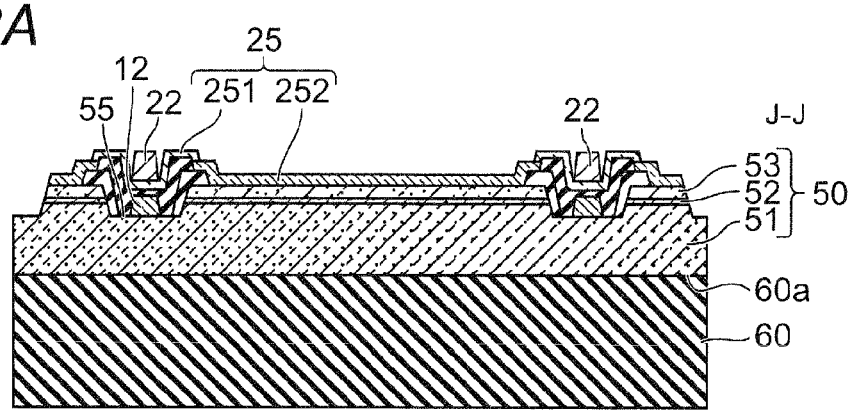
FIG. 38A is a cross-sectional view taken along the line J-J in FIG. 37.
Figure 38B:
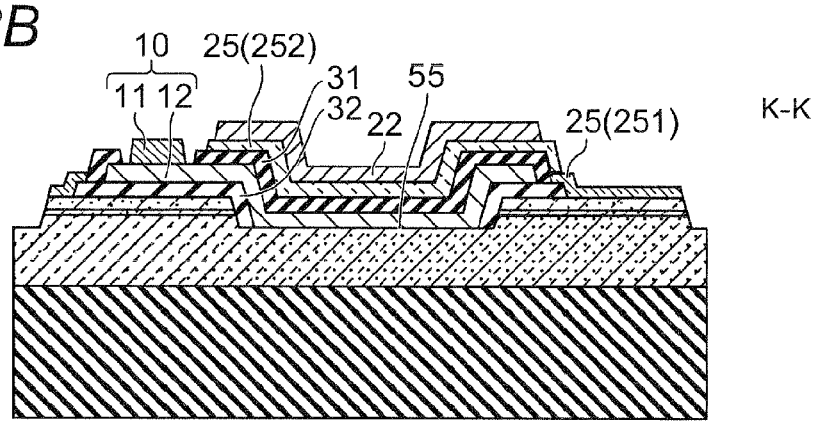
FIG. 38B is a cross-sectional view taken along the line K-K in FIG. 37.
Figure 38C:
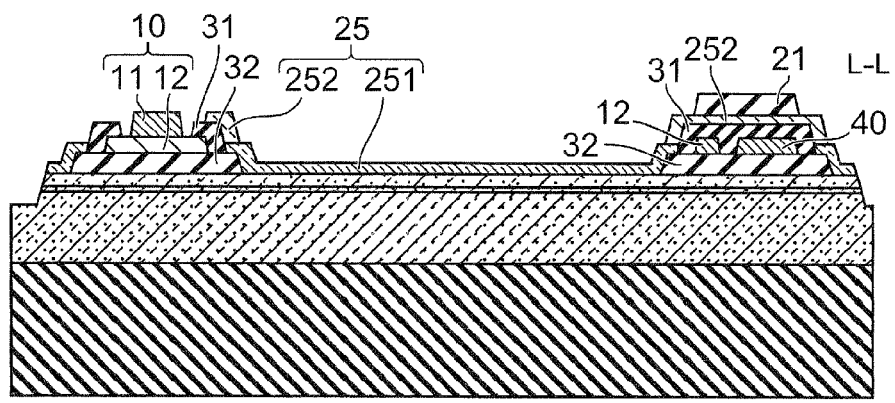
FIG. 38C is a cross-sectional view taken along the line L-L in FIG. 37.
Figure 39:
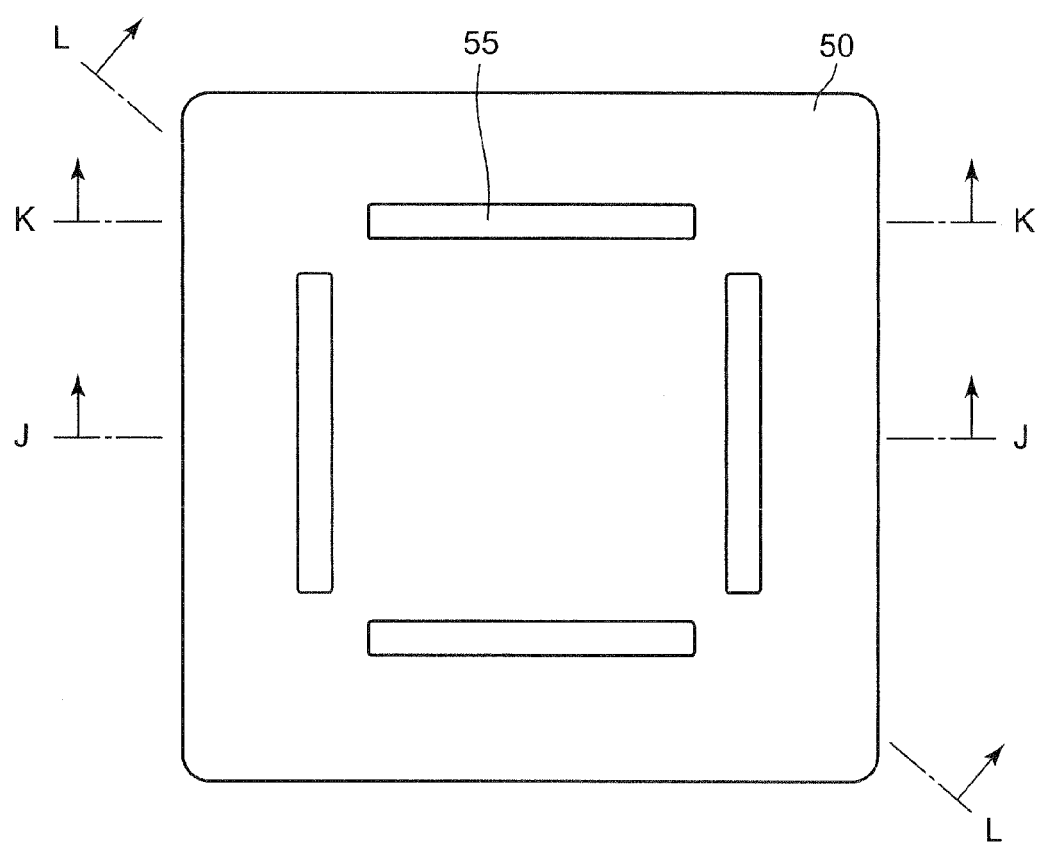
FIG. 39 is a schematic top view for explaining a manufacturing method of the light emitting element in the fourth embodiment of the present invention.
Figure 40A:
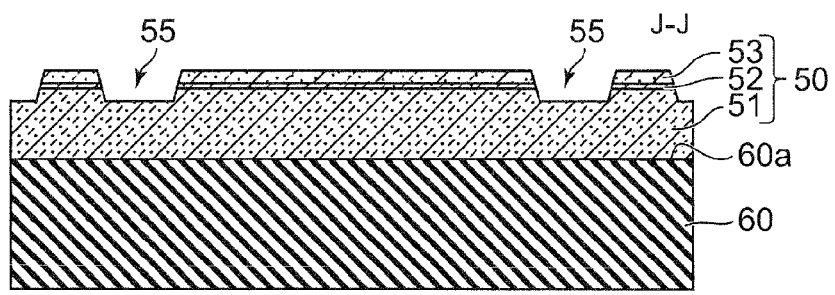
FIG. 40A is a cross-sectional view taken along the line J-J in FIG. 39.
Figure 40B:
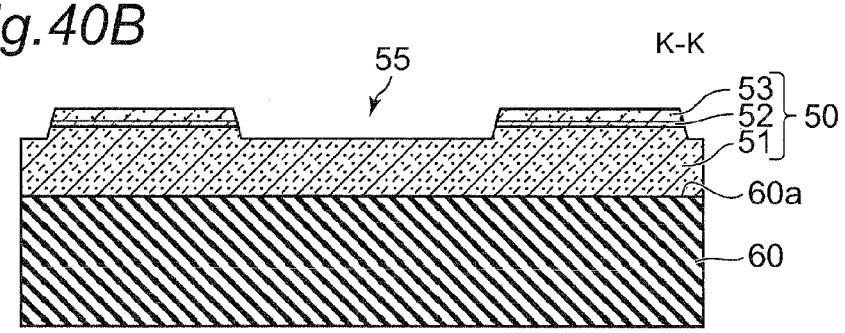
FIG. 40B is a cross-sectional view taken along the line K-K in FIG. 39.
Figure 40C:
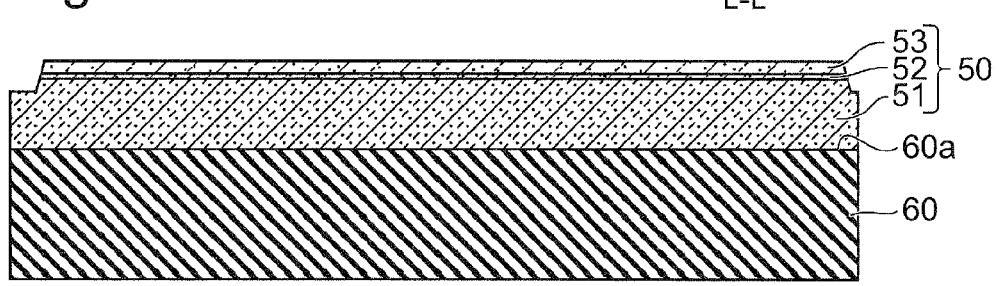
FIG. 40C is a cross-sectional view taken along the line L-L in FIG. 39.
Figure 41:
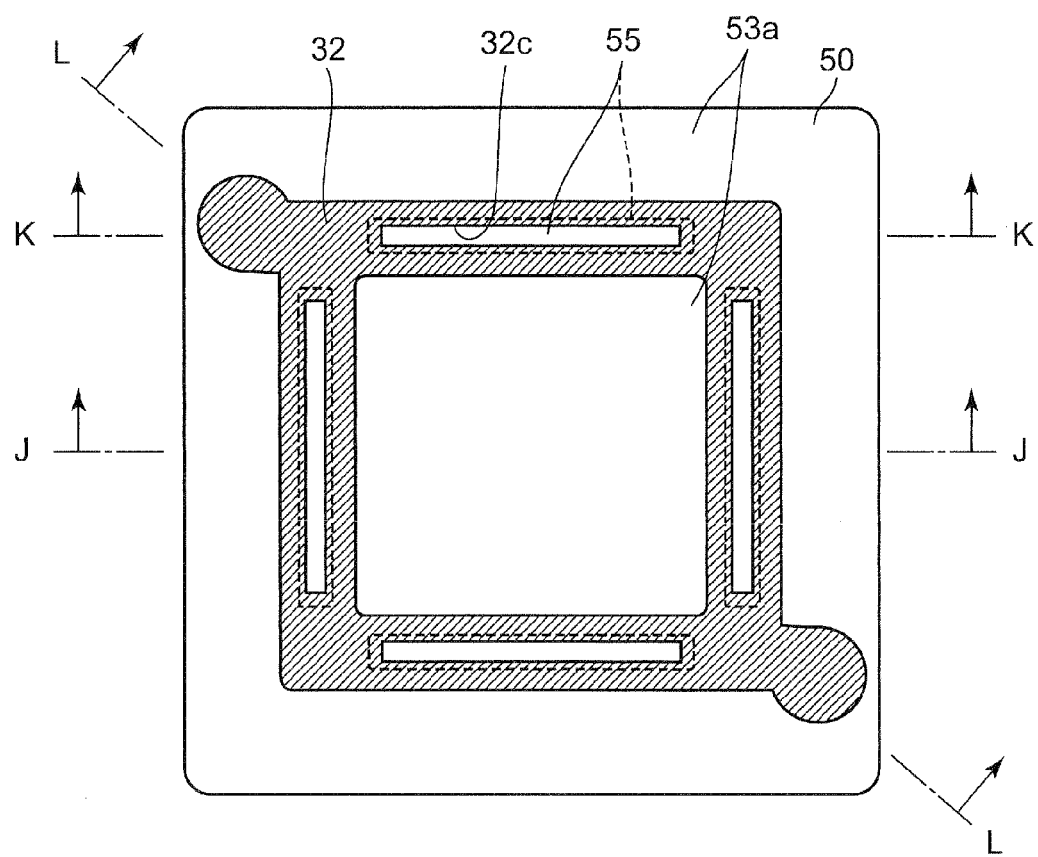
FIG. 41 is a schematic top view for explaining a manufacturing method of the light emitting element in the fourth embodiment of the present invention.
Figure 42A:
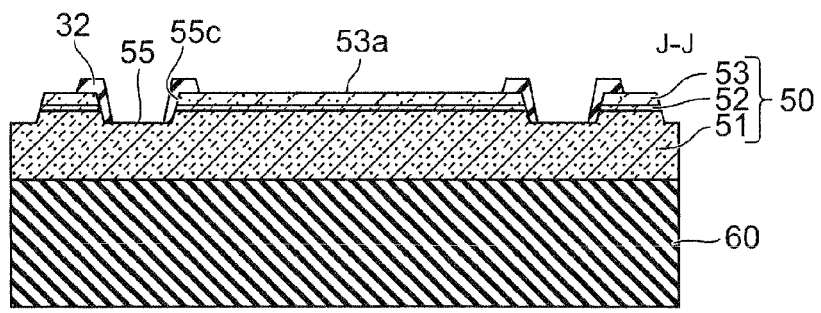
FIG. 42A is a cross-sectional view taken along the line J-J in FIG. 41.
Figure 42B:
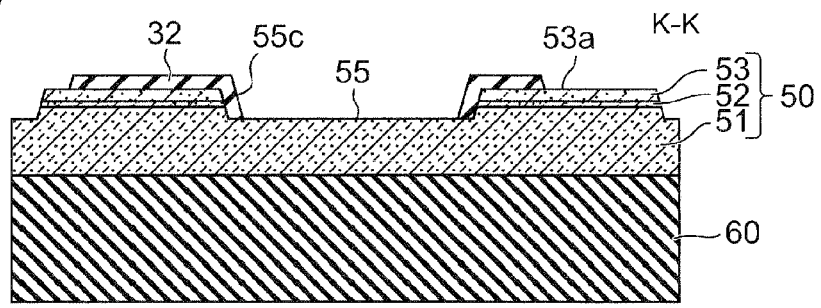
FIG. 42B is a cross-sectional view taken along the line K-K in FIG. 41.
Figure 42C:
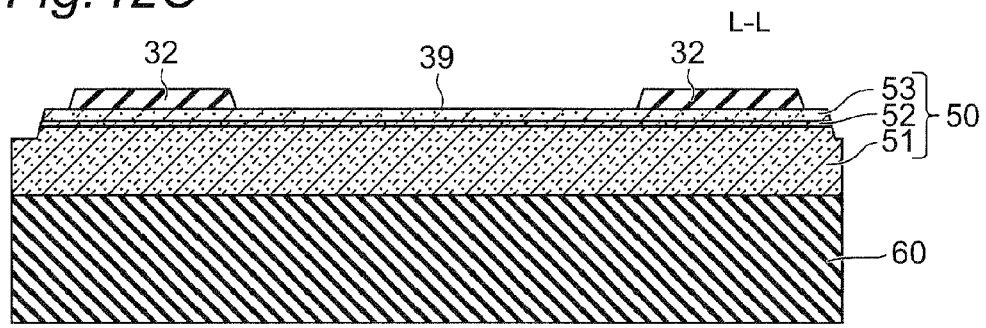
FIG. 42C is a cross-sectional view taken along the line L-L in FIG. 41.
Figure 43:
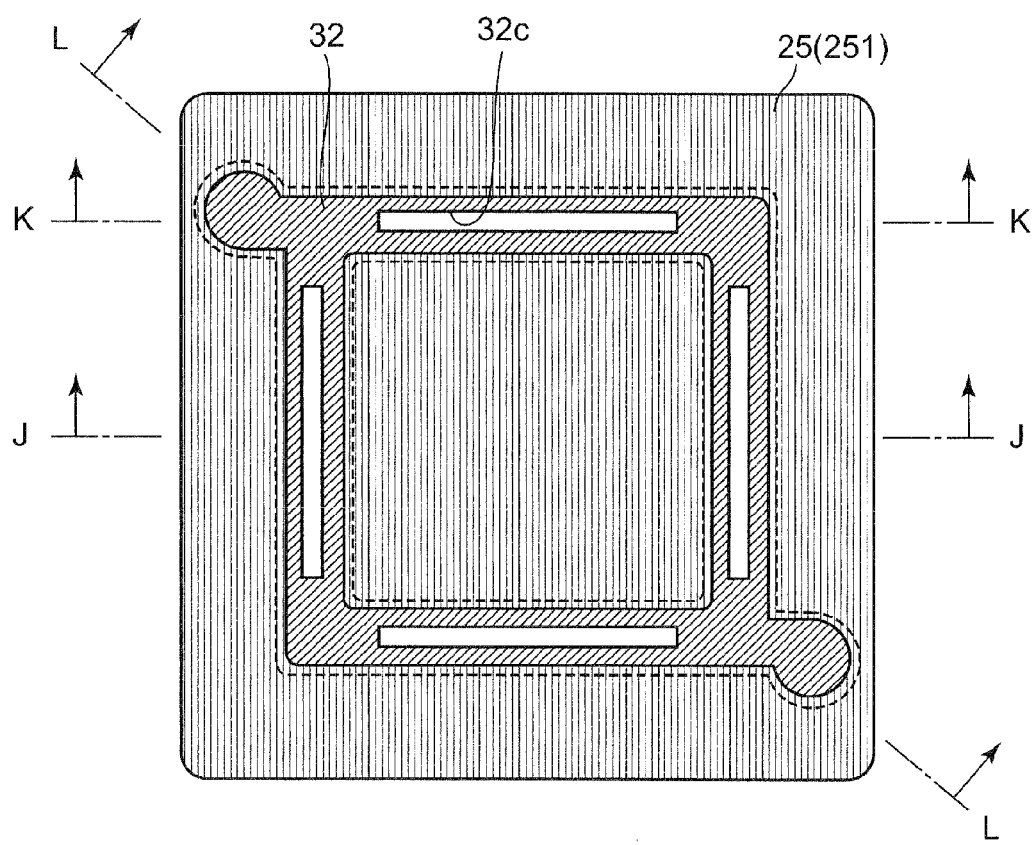
FIG. 43 is a schematic top view for explaining a manufacturing method of the light emitting element in the fourth embodiment of the present invention.
Figure 44A:
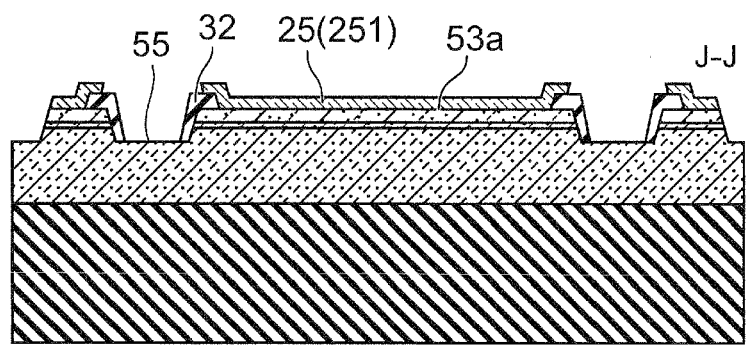
FIG. 44A is a cross-sectional view taken along the line J-J in FIG. 43.
Figure 44B:
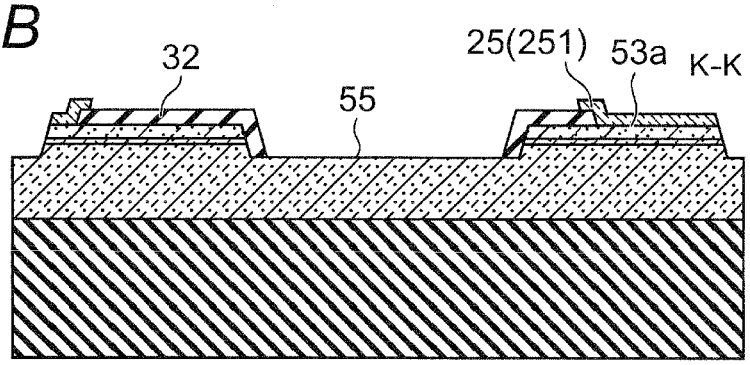
FIG. 44B is a cross-sectional view taken along the line K-K in FIG. 43.
Figure 44C:
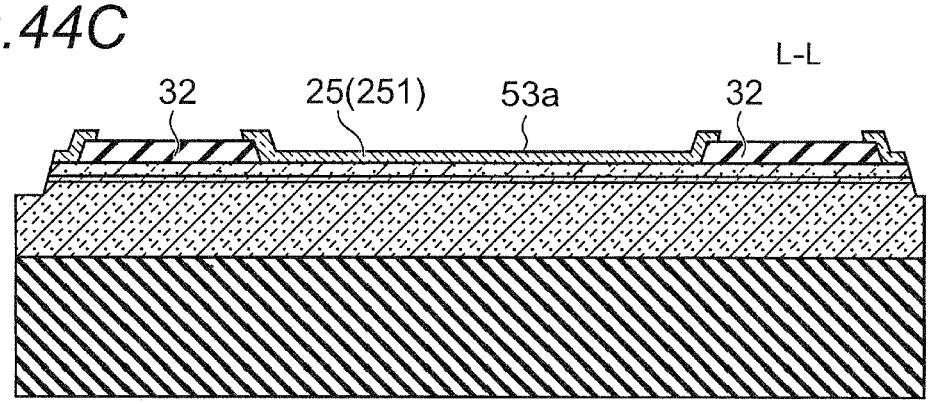
FIG. 44C is a cross-sectional view taken along the line L-L in FIG. 43.
Figure 45:
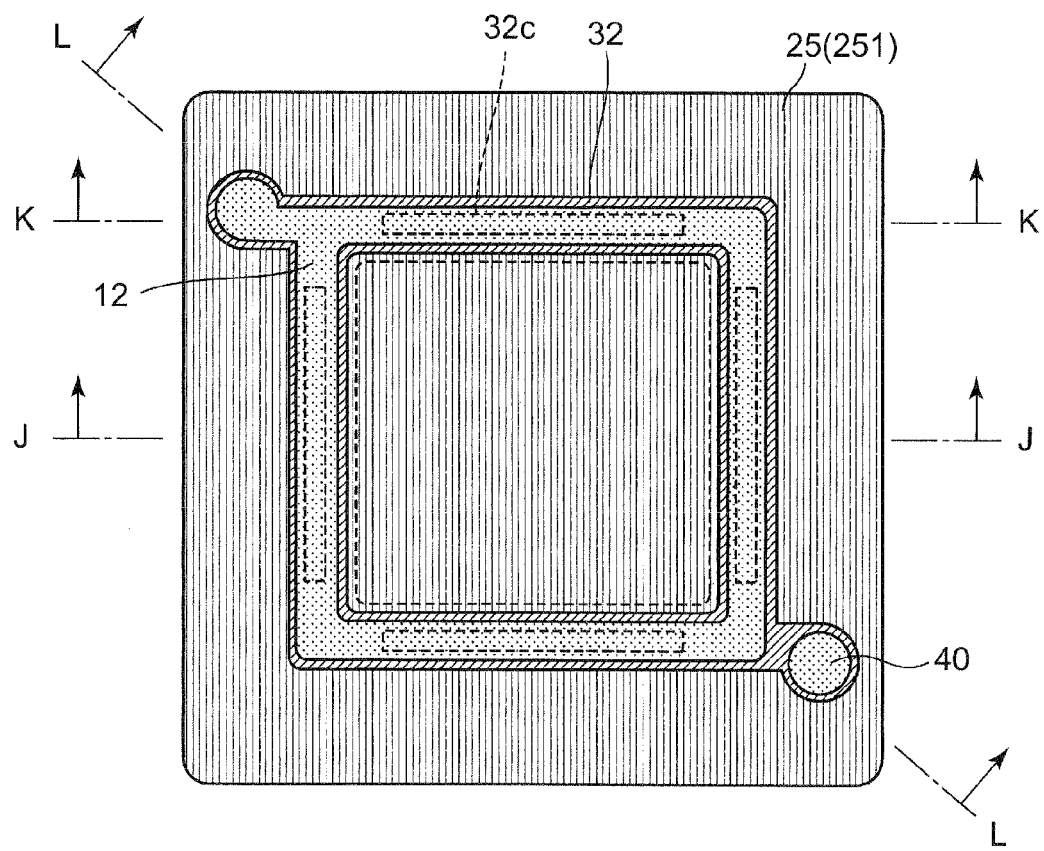
FIG. 45 is a schematic top view for explaining a manufacturing method of the light emitting element in the fourth embodiment of the present invention.
Figure 46A:
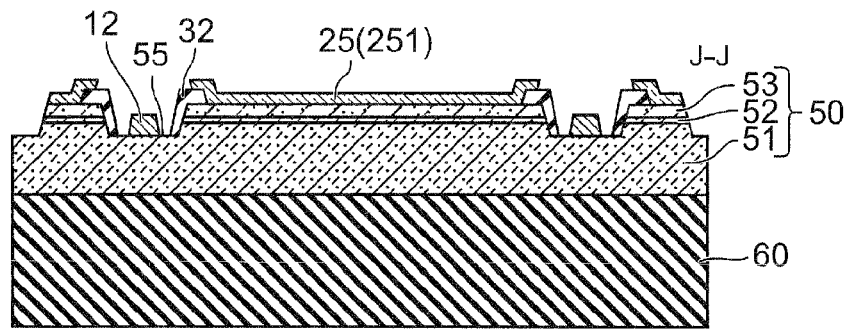
FIG. 46A is a cross-sectional view taken along the line J-J in FIG. 45.
Figure 46B:
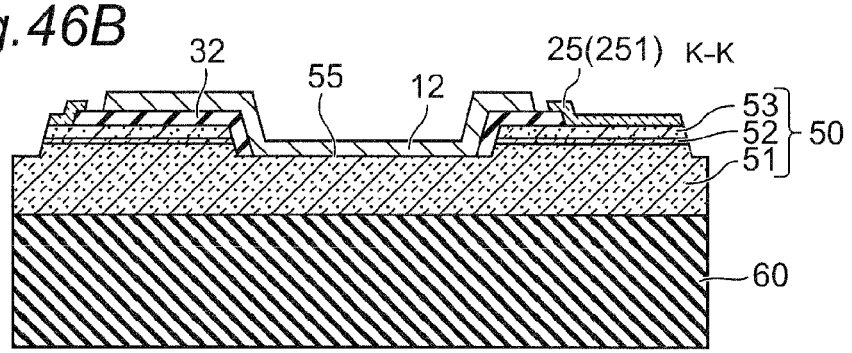
FIG. 46B is a cross-sectional view taken along the line K-K in FIG. 45.
Figure 46C:
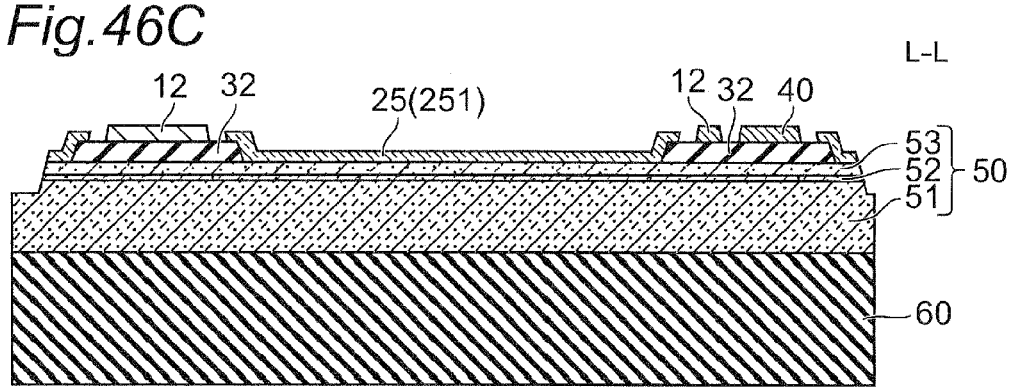
FIG. 46C is a cross-sectional view taken along the line L-L in FIG. 45.
Figure 47:
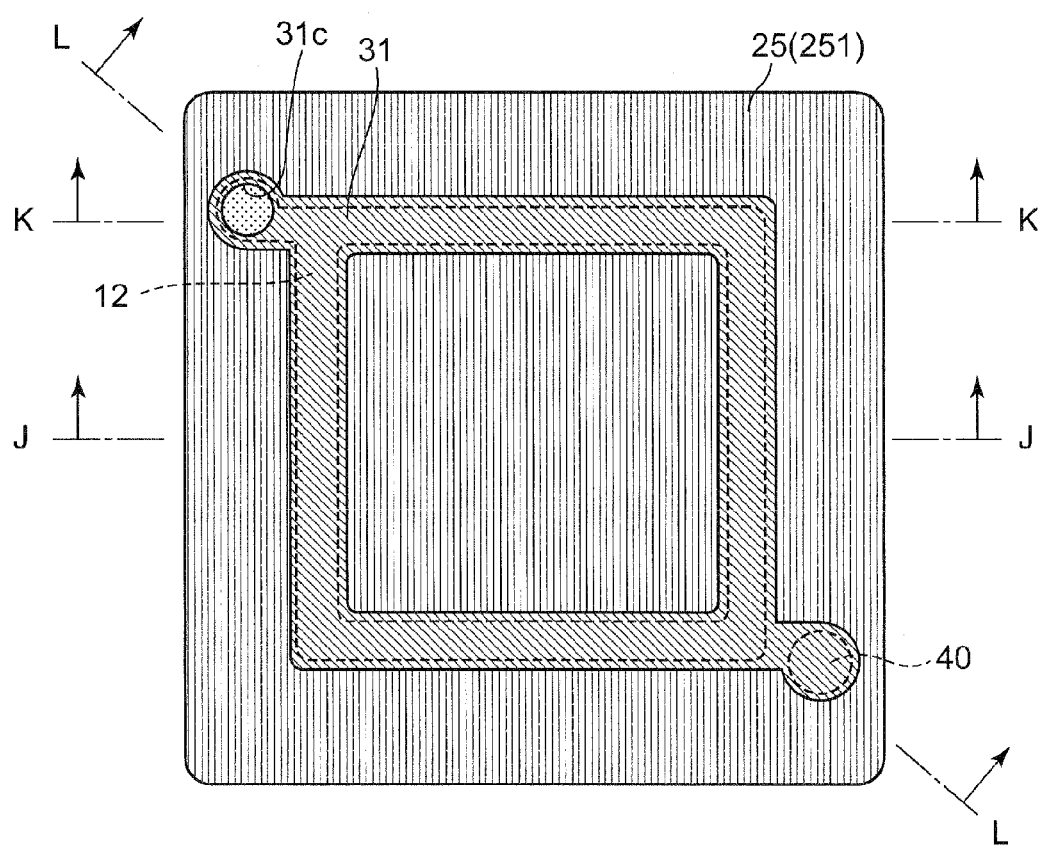
FIG. 47 is a schematic top view for explaining a manufacturing method of the light emitting element in the fourth embodiment of the present invention.
Figure 48A:
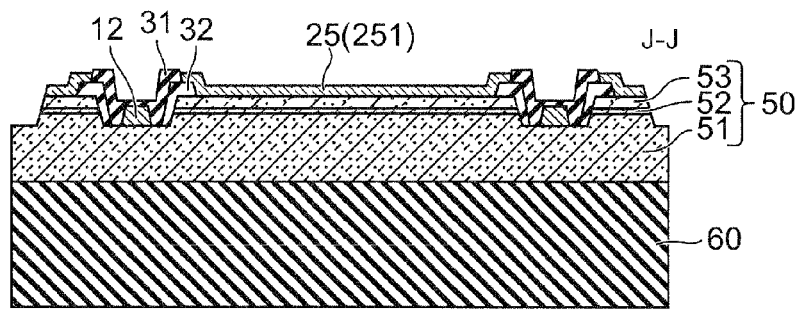
FIG. 48A is a cross-sectional view taken along the line J-J in FIG. 47.
Figure 48B:
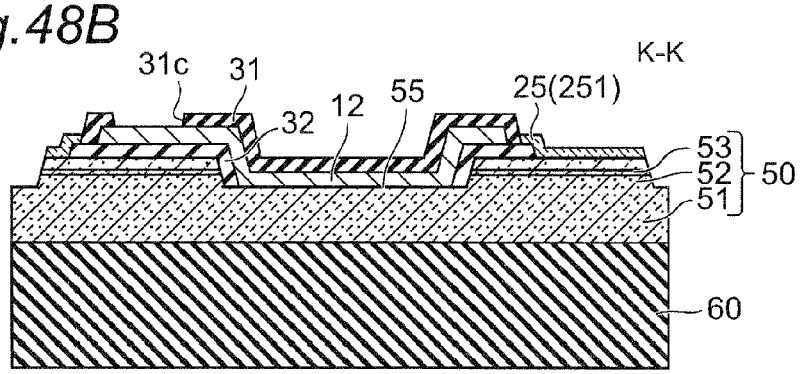
FIG. 48B is a cross-sectional view taken along the line K-K in FIG. 47.
Figure 48C:
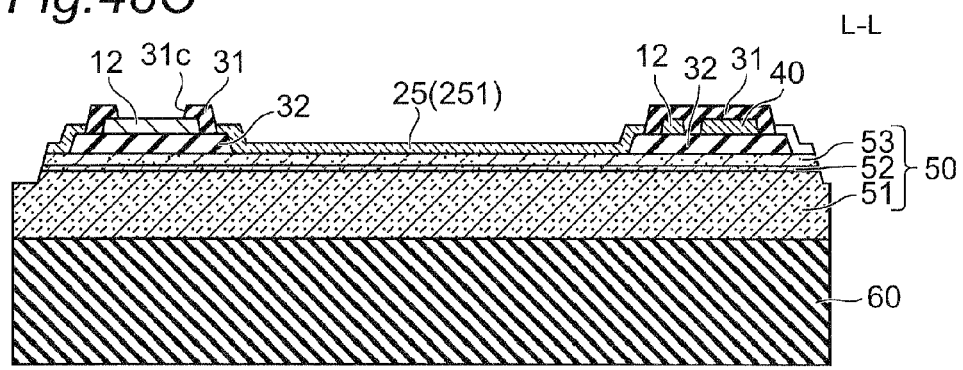
FIG. 48C is a cross-sectional view taken along the line L-L in FIG. 47.
Figure 49:
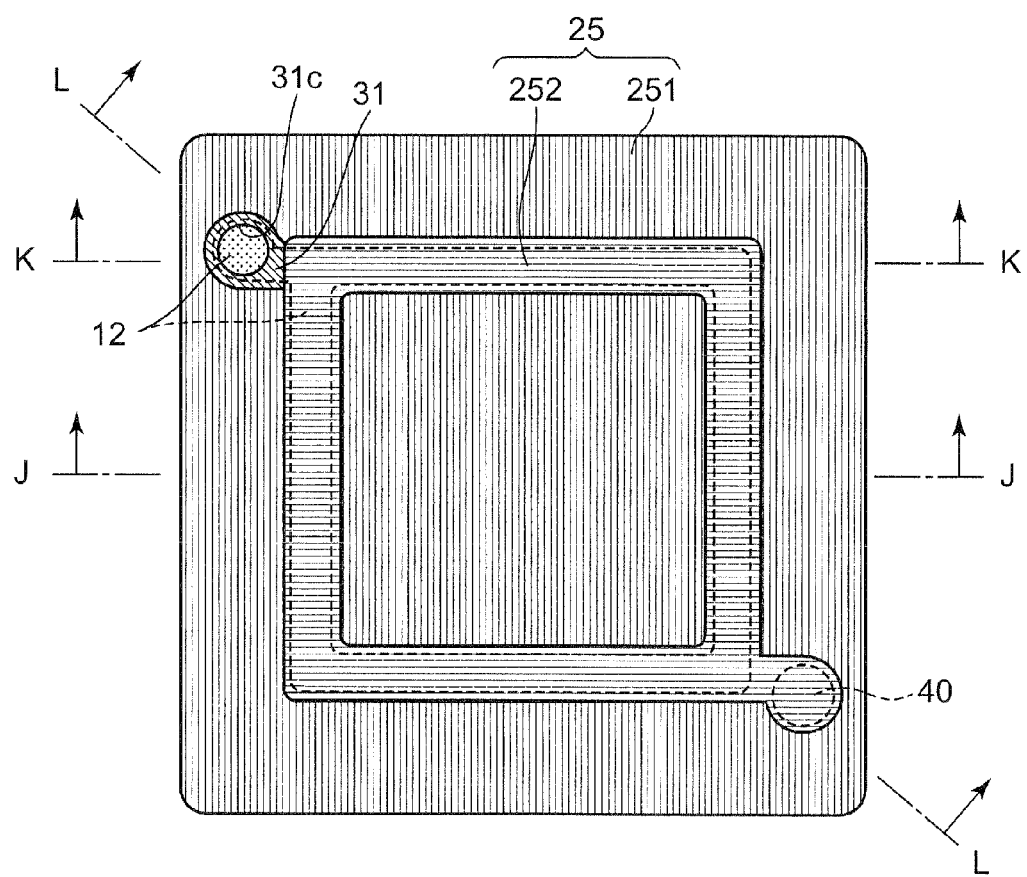
FIG. 49 is a schematic top view for explaining a manufacturing method of the light emitting element in the fourth embodiment of the present invention.
Figure 50A:
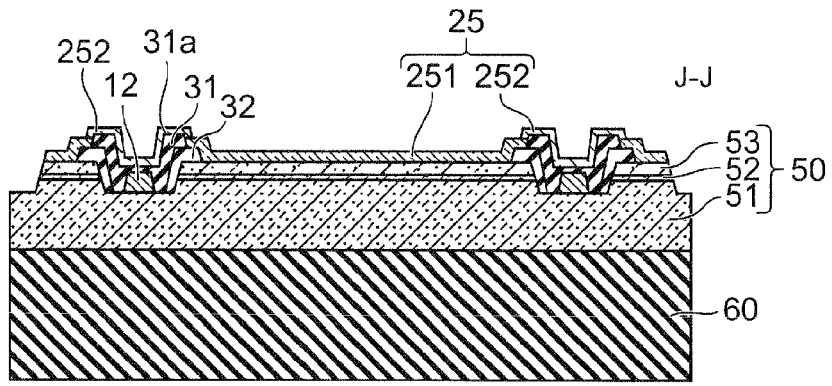
FIG. 50A is a cross-sectional view taken along the line J-J in FIG. 49.
Figure 50B:
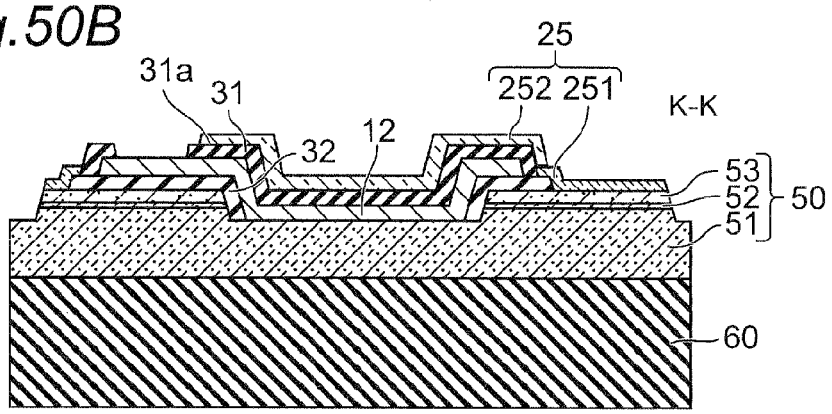
FIG. 50B is a cross-sectional view taken along the line K-K in FIG. 49.
Figure 50C:
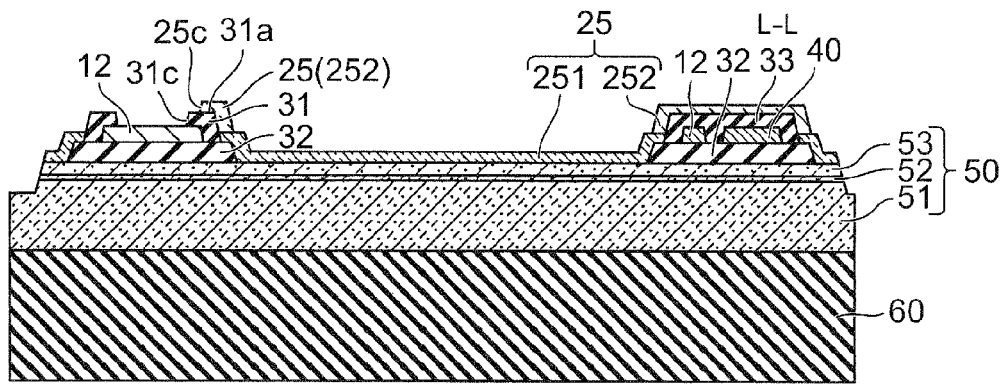
FIG. 50C is a cross-sectional view taken along the line L-L in FIG. 49.

Similarly to the first embodiment, the opening 25c is formed in the translucent electrode 25, and the n-side extending portion 12 is partially exposed from the opening 25c of the translucent electrode 25 through the opening 25c and the opening 31c of the first insulating film 31 (see FIG. 22A).

6. Formation of P-Side Electrode 20 (P-Side Pad Portion 21 and P-Side Extending Portion 22) and N-Side Pad Portion 11

Similarly to the first embodiment, the p-side electrode 20 (p-side pad portion 21 and p-side extending portion 22) and the n-side pad portion 11 are formed. The n-side pad portion 11 is formed at a position on the upper surface 53a of the p-type semiconductor layer 53 via the second insulating film 32, and the p-side pad portion 21 is formed at a position on the upper surface 53a of the p-type semiconductor layer 53 via the second insulating film 32, the n-side extending portion 12, the first insulating film 31 and the translucent electrode 25.

The obtained light emitting element 2 in this embodiment can decrease the area of the exposed portions 55 as compared to the area of the exposed portion 55 of the first embodiment, thereby further improving the light emission output. In particular, in the large-sized light emitting element, the n-side extending portion 12 is set longer so as to spread the current across the entire element. In this case, if the exposed portion 55 is formed over the entire region where the n-side extending portion 12 is provided in the same way as the first embodiment, the total area of the exposed portion 55 might be excessively large. On the other hand, in this embodiment, a plurality of the exposed portions 55 can be provided at appropriate intervals by taking into consideration the diffusion of current. As a result, the area of the exposed portions 55 can be reduced while entirely spreading the current, thereby sufficiently improving the light emission output.

A part of the n-side extending portion 12 is formed at a position on the p-type semiconductor layer 53 via the second insulating film 32 in this embodiment. Therefore, if a crack or gap is generated in the second insulating film 32, the n-side extending portion 12 and the p-type semiconductor layer 53 are likely to short-circuit. The insulating film is formed twice, which means the number of manufacturing steps is increased by onetime. The first embodiment is considered more advantageous than this embodiment on these points.

Third Embodiment

FIGS. 23 to 36C

A light emitting element 3 of this embodiment shown in FIGS. 23 and 24A to 24C differs from the light emitting element 2 of the second embodiment in that the translucent electrode 25 is formed in two steps (for a first transparent conductive layer 251, and a second transparent conductive layer 252). In other points, the light emitting element 3 of this embodiment is substantially the same as the light emitting element 2 of the second embodiment. Differences from the second embodiment will be mainly described in detail below.

In the first and second embodiments, after forming the n-side extending portion 12, the translucent electrode 25 is formed. When the translucent electrode 25 is formed of conductive oxide, such as ITO, as mentioned in the first embodiment, heat treatment can be carried out after formation of the translucent electrode 25 to thereby reduce the contact resistance between the translucent electrode 25 and the p-type semiconductor layer 53, and to increase the transparency of the translucent electrode 25. However, the heat treatment might adversely affect the n-side extending portion 12. For example, if the n-side extending portion 12 is formed of a multi-layered metal film, and an Al layer having a high reflectivity is positioned near the lower surface side thereof, this can increase the reflectivity of the lower surface of the n-side extending portion 12. In this case, the heat treatment can transform the Al layer into an alloyed layer that is alloyed by another metal layer included in the multi-layered metal film. Reflectivity of an Al alloy is usually lower than the reflectivity of an Al element. When the Al layer is alloyed to decrease the reflectivity of the lower surface of the n-side extending portion 12 in this way, the amount of absorption of the light is increased. As a result, the light emission output from the light emitting element may be decreased.

The heat treatment for the translucent electrode 25 needs to be performed at a relatively high treatment temperature (for example, preferably, in a range of 200° C. to 650° C., and more preferably, in a range of 400° C. to 650° C.) in order to reduce the contact resistance between the translucent electrode 25 and the p-type semiconductor layer 53. The high treatment temperature tends to promote alloying of the Al element. On the other hand, in order to enhance the transparency to the same degree, as in the case of using the normal face-up mounted light emitting element, a relatively low heat treatment temperature (for example, in a range of 200° C. to 350° C.) is also enough. Such a low treatment temperature hardly promotes alloying of the Al element.

In the form of the light emitting element in the one embodiment of the present invention, the translucent electrode 25 is provided on the upper surface side of the n-side extending portion 12. For this reason, the translucent electrode 25 needs to be formed after the formation of the n-side extending portion 12.

In this particular embodiment, the translucent electrode 25, made of conductive oxide, is formed in two steps, namely, before and after formation of the n-side extending portion 12, thereby solving this problem. Specifically, before formation of the n-side extending portion 12, in a region in contact with the p-type semiconductor layer 53, the first transparent conductive layer 251 is formed (see FIGS. 29 and 30A to 30C), and then the heat treatment is performed at a high temperature (a first temperature) for reducing the contact resistance. After formation of the n-side extending portion 12, in a region not covered by the first transparent conductive layer 251 (mainly in the region on the upper side of the n-side extending portion 12), a second transparent conductive layer 252 is formed (see FIGS. 35 and 36A to 36C), and then the heat treatment is performed at a low temperature (a second temperature) for increasing the transparency. Finally, one continuous translucent electrode 25 is configured by the first transparent conductive layer 251 and the second transparent conductive layer 252.

In this way, the translucent electrode 25 is formed in two steps, which can suppress the influence of alloying of the n-side extending portion 12, while reducing the contact resistance between the translucent electrode 25 and the p-type semiconductor layer 53. In addition, the light emitting element 3 having the translucent electrode 25 whose entire surface is transparent can be provided. The contact resistance can be reduced to suppress the element resistance of the entire light emitting element, thereby improving the power efficiency. Further, the alloying or the like of the n-side extending portion 12 can be suppressed, and therefore the absorption of the light in the n-side extending portion 12 can be reduced and the light extraction efficiency can be improved. Since the entire surface of the translucent electrode 25 is transparent, the light extraction efficiency can be improved.

Therefore, the light emitting element 3 in this embodiment can improve the power efficiency and the light extraction efficiency.

The manufacturing method of the light emitting element 3 in this embodiment will be described in detail below with reference to FIGS. 23 to 36C.

1. Formation of Semiconductor Laminate 50

Similarly to the second embodiment, the semiconductor laminate 50 is formed on the upper surface 60a of the substrate 60, and then the p-type semiconductor layer 53 and the light emitting layer 52 are partly removed to form the exposed portions 55 (see FIGS. 25 and 26A to 26C).

2. Formation of Second Insulating Film 32

Similarly to the second embodiment, the second insulating film 32 is formed. The second insulating film 32 is provided on a route where the n-side extending portion 12 is disposed to cover the side surface 55c of the exposed portion 55 and the upper surface 53a of the p-type semiconductor layer 53 (see FIGS. 27 and 28A to 28C). The openings 32 are provided in the second insulating film 32c in alignment with the positions of the exposed portions 55.

3. Formation of First Transparent Conductive Layer 251

Unlike the second embodiment, the first transparent conductive layer 251 made of conductive oxide, such as ITO, is formed to cover the upper surface 53a of the p-type semiconductor layer 53 (see FIGS. 29 and 30A to 30C). As shown in the figures, the first transparent conductive layer 251 may extend on the outer edge of the second insulating film 32 so as to ensure contact with the second transparent conductive layer 252 to be formed later.

After forming the first transparent conductive layer 251, the heat treatment is performed at the first temperature (for example, in a range of 400° C. to 650° C.) so as to reduce the contact resistance between the first transparent conductive layer 251 and the p-type semiconductor layer 53. The first temperature is so high that the heat treatment performed at the first temperature can also achieve the increase in transparency of the first transparent conductive layer 251 at the same time.

4. Formation of N-Side Extending Portion 12

Similarly to the second embodiment, the n-side extending portions 12 (121 to 123) are formed (see FIGS. 31 and 32A to 32C). The n-side extending portion 12 is electrically connected to the n-type semiconductor layer 51 within each exposed portion 55 through the opening 32c provided in the second insulating film 32.

A clearance is formed between the n-type semiconductor layer 51 and the first transparent conductive layer 251 such that the n-type semiconductor layer 51 is not in contact with the first transparent conductive layer 251.

5. Formation of First Insulating Film 31

Similarly to the second embodiment, the first insulating film 31 is formed to cover the n-side extending portion 12 (see FIGS. 33 and 34A to 34C). The first insulating film 31 is provided with the opening 31c from which the n-side extending portion 12 is partly exposed. When the first insulating film 31 is formed, the clearance between the n-type semiconductor layer 51 and the first transparent conductive layer 251 maybe filled with the first insulating film 31. As a result, the n-type semiconductor layer 51 can be surely insulated from the first transparent conductive layer 251 by the first insulating film 31 (see FIG. 34C).

6. Formation of Second Transparent Conductive Layer 252

Unlike the second embodiment, the second transparent conductive layer 252 made of conductive oxide, such as ITO, is formed to cover the upper surface 31a of the first insulating film 31 (see FIGS. 35 and 36A to 36C). The first transparent conductive layer 251 is already provided on the upper surface 53a of the p-type semiconductor layer 53, and therefore the first transparent conductive layer 251 does not need to be covered by the second transparent conductive layer 252. However, the first transparent conductive layer 251 needs to be in contact and in electrical conduction with the second transparent conductive layer 252. When the first transparent conductive layer 251 extends to the outer edge of the second insulating film 32, the second insulating film 32 can be covered by the second transparent conductive layer 252, so that the second transparent conductive layer 252 can be in contact with the first transparent conductive layer 251. In order to surely establish connection between the first transparent conductive layer 251 and the second transparent conductive layer 252, the outer edge of the second transparent conductive layer 252 can also be superimposed over the outer edge of the first transparent conductive layer 251 (see FIGS. 36B and 36C).

After forming the second transparent conductive layer 252, the heat treatment is performed at the second temperature (for example, in a range of 200° C. to 350° C.) lower than the first temperature so as to enhance the transparency of the second transparent conductive layer 252. In this way, the translucent electrode 25 is formed by the first transparent conductive layer 251 and the second transparent conductive layer 252. The heat treatment at the second temperature may be performed at any stage until the light emitting element 3 is completed after forming the second transparent conductive layer 252, and, for example, can also be performed after formation of the n-side electrode 10 and p-side electrode 20. Because of its low transparency, the second transparent conductive layer 252 is not preferably superimposed over the region where the first transparent conductive layer 251 is directly in contact with the p-type semiconductor layer 53 serving as the main light extraction surface from the top view.

Specifically, the second transparent conductive layer 252 is preferably formed only above the first insulating film 31 and the second insulating film 32.

7. Formation of P-Side Electrode 20 (P-Side Pad Portion 21 and P-Side Extending Portion 22) and N-Side Pad Portion 11

Similarly to the second embodiment, the p-side electrode 20 (p-side pad portion 21 and p-side extending portion 22) and the n-side pad portion 11 are formed (see FIGS. 23 and 24A to 24C).

In the obtained light emitting element 3 of this embodiment, as compared to the first and second embodiments, the heat treatment at the relatively high temperature for reducing the contact resistance between the translucent electrode 25 and the p-type semiconductor layer 53 can be performed before forming the n-side electrode 10. Therefore, the metal material (such as Al) used in the n-side electrode 10 is suppressed from alloying due to the high-temperature treatment, thereby keeping the reflectivity of the n-side electrode 10 high. As a result, the absorption of light in the n-side electrode 10 can be suppressed and the light extraction efficiency can be improved.

Fourth Embodiment

FIGS. 37 to 50C

A light emitting element 4 of this embodiment shown in FIGS. 37 and 38A to 38C differs from the light emitting element 3 of the third embodiment in that the forms of the n-side electrode 10 and the p-side electrode 20 are changed. Further, this embodiment also differs from the third embodiment in that a metal reflective film 40 completely insulated from the semiconductor laminate 50, n-side electrode 10, and p-side electrode 20 is provided directly under the p-side pad portion 21 of the p-side electrode 20. In other points, the light emitting element 4 of this embodiment is substantially the same as the light emitting element 3 of the third embodiment. The differences from the third embodiment will be mainly described in detail below.

In the light emitting element 4 of this embodiment shown in FIGS. 37 and 38A to 38C, the n-side extending portion 12 of the n-side electrode 10 is formed in a substantially square shape. The n-side pad portion 11 is connected to the vicinity of the vertex of the substantially square shape of the n-side extending portion 12. Similarly to the n-side extending portion 12, the p-side extending portion 22 of the p-side electrode 20 is shaped in a substantially square shape, and is disposed to be superimposed over the n-side extending portion 12. The p-side pad portion 21 is connected to the vicinity of the vertex of the substantially square shape of the p-side extending portion 22. The vertex connected to the n-side pad portion 11 and the vertex connected to the p-side pad portion 21 are opposed to each other in a substantially square shape formed by the n-side extending portion 12 and p-side extending portion 22.

In this embodiment, the p-side pad portion 21 is disposed not to be superimposed over the n-side electrode 10 from the top view. Instead, the p-side pad portion 21 is superimposed over the metal reflective film 40 from the top view.

The metal reflective film 40 is a film having its lower surface with a high reflectivity. For example, the metal reflective film 40 has a layer made of metal material (e.g., Al) having high reflectivity with respect to the light emitted from the semiconductor laminate 50 at least in the vicinity of its lower surface. The metal reflective film 40 is a member formed over the second insulating film 32 in an island-like shape (see FIG. 45), a d covered by the first insulating film 31

(see FIGS. 38C, 47, and 48A to 48C). As a result, the metal reflective film 40 is insulated from the n-type semiconductor layer 51 and the p-type semiconductor layer 53. The metal reflective film 40 is isolated from the n-side electrode 10 (see FIGS. 45 and 46A to 46C), and therefore is insulated from the n-side electrode 10. That is, in this embodiment, the metal reflective film 40 is insulated not only from the semiconductor laminate 50 including the n-type semiconductor layer 51 and the p-type semiconductor layer 53, but also from the n-side electrode 10 and the p-side electrode 20.

The metal reflective film 40 is superimposed over the p-side pad portion 21. Therefore, when a metal wire is wire-bonded to the p-side pad portion 21, the metal reflective film 40 can absorb the impact of the wire bonding so as to reduce the damage to the semiconductor laminate 50. Assuming that a crack or gap is generated in the first insulating film 31 directly under the p-side pad portion 21 due to the impact at the time of wire bonding, the p-side pad portion 21 is likely to be in contact with the metal reflective film 40. However, the metal reflective film 40 is configured to be insulated from the n-side electrode 10 and the semiconductor laminate 50. Therefore, even though the p-side pad portion 21 is in contact with the metal reflective film 40, a short circuit is prevented. The metal reflective film 40 and the p-side pad portion 21 can be substantially superimposed over each other, thereby reducing the light reaching the p-side pad portion 21.

The n-side extending portion 12 and the metal reflective film 40 are separated from each other with a clearance therebetween. The p-side electrode 20 is located directly above the clearance, so that there is a higher possibility that the light propagating through the semiconductor laminate 50 reaches the p-side electrode 20, as compared to the first to third embodiments. The absorption of the light in the p-side electrode 20 is preferably sufficiently suppressed by decreasing the clearance as much as possible. In particular, from the top view, the ratio of a part of the p-side electrode 20 superimposed over the n-side electrode 20 or metal reflective film 40 to the entire p-side electrode 20 is preferably 90% or more.

The manufacturing method of the light emitting element 4 in this embodiment will be described in detail below with reference to FIGS. 37 to 50C.

1. Formation of Semiconductor Laminate 50

Similarly to the second and third embodiments, the semiconductor laminate 50 is formed over the upper surface 60a of the substrate 60, and then the p-type semiconductor layer 53 and the light emitting layer 52 are partly removed to form the exposed portions 55 (see FIGS. 39 and 40A to 40C). The form of the exposed portion 55 in this embodiment differs from that in each of the second and third embodiments. The four strip-like exposed portions 55 are formed (see FIG. 39).

2. Formation of Second Insulating Film 32

Similarly to the second and third embodiments, the second insulating film 32 is formed. The second insulating film 32 is provided on a route where the n-side extending portion 12 is disposed to cover the side surface 55c of the exposed portion 55 and the upper surface 53a of the p-type semiconductor layer 53 (see FIGS. 41 and 42A to 42C). In the second insulating film 32, the openings 32c are provided in alignment with the positions of the exposed portions 55.

3. Formation of First Transparent Conductive Layer 251

Similarly to the third embodiment, the first transparent conductive layer 251 is formed to cover the upper surface 53a of the p-type semiconductor layer 53 (see FIGS. 43 and 44A to 44C).

When the first transparent conductive layer 251 is made of conductive oxide, such as ITO, heat treatment is performed at the first temperature (for example, in a range of 400° C. to 650° C.) so as to reduce the contact resistance between the first transparent conductive layer 251 and the p-type semiconductor layer 53 after forming the first transparent conductive layer 251.

4. Formation of N-Side Extending Portion 12 and Metal Reflective Film 40

Similarly to the third embodiment, the n-side extending portions 12 are formed (see FIGS. 45 and 46A to 46C). Then-side extending portion 12 is electrically connected to the n-type semiconductor layer 51 within each exposed portion 55 through the opening 32c formed in the second insulating film 32.

A clearance is formed between the n-type semiconductor layer 51 and the first transparent conductive layer 251 such that the n-type semiconductor layer 51 is not in contact with the first transparent conductive layer 251.

Unlike the third embodiment, in this embodiment, the metal reflective film 40 is also formed separately from the n-side extending portion 12 when the n-side extending portion 12 is formed. The metal reflective film 40 is formed, for example, using the same material as that of the n-side extending portion 12 at the same time as the n-side extending portion 12. The metal reflective film 40 is formed over the second insulating film 32, and insulated from the n-type semiconductor layer 51 and the p-type semiconductor layer 53.

5. Formation of First Insulating Film 31

Similarly to the third embodiment, the first insulating film 31 is formed to cover the n-side extending portion 12 (see FIGS. 47 and 48A to 48C). The first insulating film 31 is provided with the opening 31c from which the n-side extending portion 12 is partly exposed. Unlike the third embodiment, the first insulating film 31 also covers the metal reflective film 40.

When the first insulating film 31 is formed, the clearance between the n-type semiconductor layer 51 and the first transparent conductive layer 251 may be filled with the first insulating film 31. As a result, then-type semiconductor layer 51 can be surely insulated from the first transparent conductive layer 251 by the first insulating film 31 (see FIG. 48A). In addition, a clearance between the n-side extending portion 12 and the metal reflective film 40 may be filled with the first insulating film 31 and therefore surely insulate the n-side extending portion 12 from the metal reflective film 40 by the first insulating film 31 (see FIG. 48C).

6. Formation of Second Transparent Conductive Layer 252

Similarly to the third embodiment, the second transparent conductive layer 252 is formed to cover the upper surface 31a of the first insulating film 31 (see FIGS. 49 and 50A to 50C).

7. Formation of P-Side Electrode 20 (P-Side Pad Portion 21 and P-Side Extending Portion 22) and N-Side Pad Portion 11

Similarly to the third embodiment, the p-side electrode 20 (p-side pad portion 21 and p-side extending portion 22) and the n-side pad portion 11 are formed (see FIGS. 37 and 38A to 38C).

Unlike the first to third embodiments, the obtained light emitting element 4 of this embodiment includes the metal reflective film 40 disposed directly under the p-side pad portion 21, and insulated from the semiconductor laminate 50 and the electrodes 10 and 20. Although a crack or gap may be generated in the first insulating film 31 located between the p-side pad portion 21 and the metal reflective film 40 by impact at the time of wire bonding and therefore the p-side pad portion 21 and the metal reflective film 40 are in contact with each other, the p-side pad portion 21 is prevented from short-circuiting through the metal reflective film 40.

Suitable materials for the respective components of the light emitting elements in the first to fourth embodiments will be described below.

N-Side Electrode 10

The n-side extending portion 12 and the n-side pad portion 11 which are included in the n-side electrode 10 can be formed of the same material, but may be formed of different materials. For example, similarly to the p-side electrode 20 mentioned below, the n-side extending portion 12 and the n-side pad portion 11 can also be integrally formed of the same material.

The n-side electrode 10 preferably has its lower surface having high reflectivity. Specifically, the layer made of metal material having a high reflectivity for the light emitted from the semiconductor laminate 50 is preferably disposed near the lower surface of the n-side electrode 10 (lower surface of the n-side extending portion 12). In order to prevent the first insulating film 31 covering the upper surface of the n-side extending portion 12 from being peeled off, the upper surface of the n-side extending portion 12 is preferably made of metal material having excellent adhesion with an insulating material (for example, $SiO_2$). For example, the n-side extending portion 12 may have a multi-layered structure including a plurality of metal layers, namely, a lower side metal layer with high reflectivity disposed near its lower surface, and an upper side metal layer having excellent adhesion with the first insulating film 31 and disposed at its uppermost surface. Suitable materials for the lower side metal layer can include Al, Ag, and the like. Suitable materials for the upper side metal layer can include Ti, Ni, Cr, Al, and the like.

One example of the metal laminate structure forming the n-side extending portion 12 is a laminate structure including Al, Ti, Pt, and Ti that are stacked from a side of the n-type semiconductor layer 51 in this order.

The n-side pad portion 11 preferably includes, at its uppermost surface, a metal material having excellent adhesion with a member used for external connection, such as a metal wire or the like. Suitable material for the n-side pad portion 11 can include Au.

When the n-side extending portion 12 and the n-side pad portion 11 are separately provided, the uppermost surface of the n-side extending portion 12 can be formed using metal material (for example, Ti) having excellent adhesion with the first insulating film 31, and the uppermost surface of the n-side pad portion 11 can be formed using metal material (for example, Au) having excellent adhesion with the metal wire or the like, so that the n-side electrode 10 having excellent adhesion with both the first insulating film 31 and the metal wire or the like can be formed.

P-Side Electrode 20

The p-side extending portion 22 and the p-side pad portion 21 which are included in the p-side electrode 20 can be formed of the same material. For example, the p-side extending portion 22 and the p-side pad portion 21 may be integrally formed together. The p-side electrode 20 is preferably formed using metal material having low contact resistance with the translucent electrode 25. When the p-side electrode 20 is formed by a multi-layered structure, including a plurality of metal layers, the lowermost metal layer is made of such metal material. Similarly to the n-side electrode 10, the uppermost surface is preferably formed of metal material having excellent adhesion with the metal wire or the like.

The p-side electrode 20 can be formed, for example, by laminating Ti, Rh, and Au from the p-type semiconductor layer 52 side in this order.

A region where the translucent electrode 25 is in direct contact with the p-type semiconductor layer 53 serves as a main light extraction surface of the semiconductor light emitting element, so the p-side electrode 20 is preferably provided not to be superimposed over this region from the top view. Specifically, the p-side electrode 20 is preferably formed only over the first insulating film 31.

Translucent Electrode 25

The translucent electrode 25 can be formed of translucent conductive material, preferably, conductive oxides. The conductive oxides can include, for example, ZnO, $In_2O_3$, indium-tin-oxide (ITO), $SfO_2$, MgO, and the like. Particularly, ITO is preferable because of a high light transmission performance in the visible radiation (visual region), and a high electric conductivity.

First Insulating Film 31, Second Insulating Film 32

Figure 15:
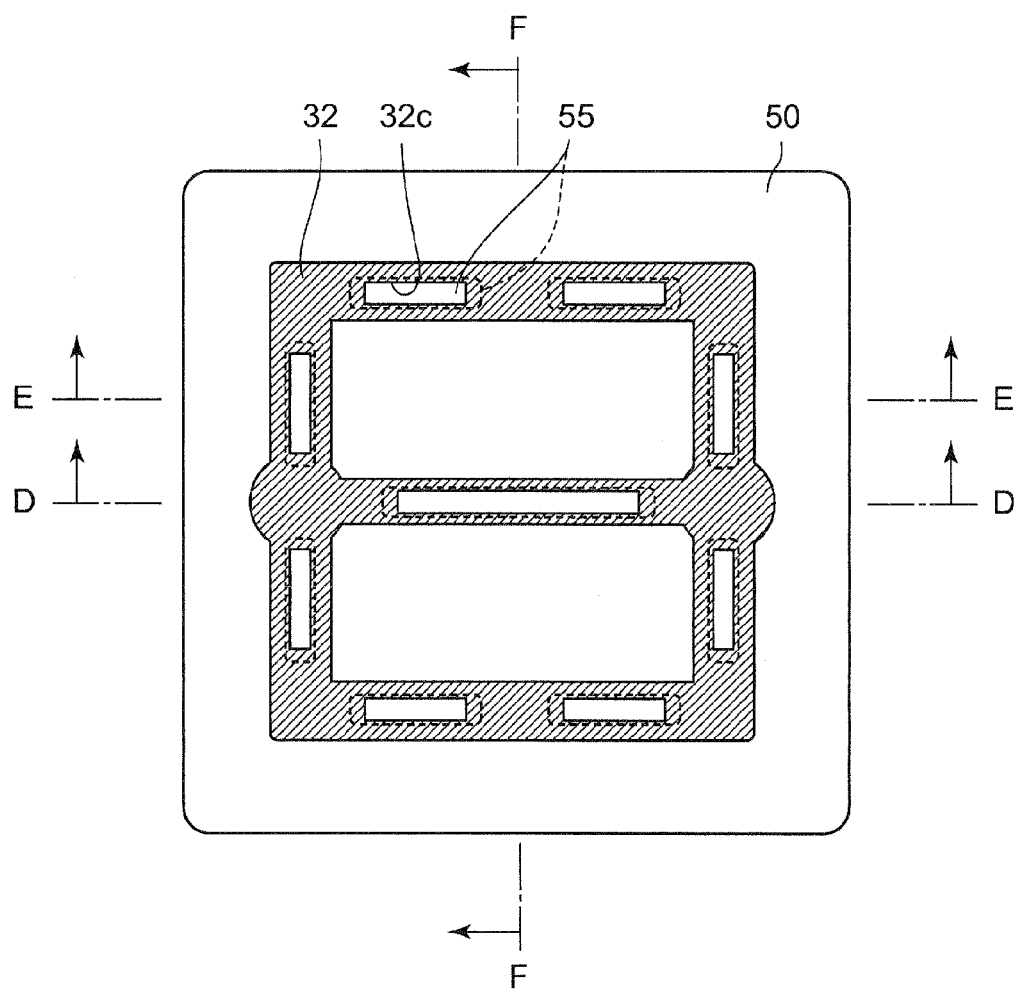
FIG. 15 is a schematic top view for explaining a manufacturing method of the light emitting element in the second embodiment of the present invention.
Figure 16A:
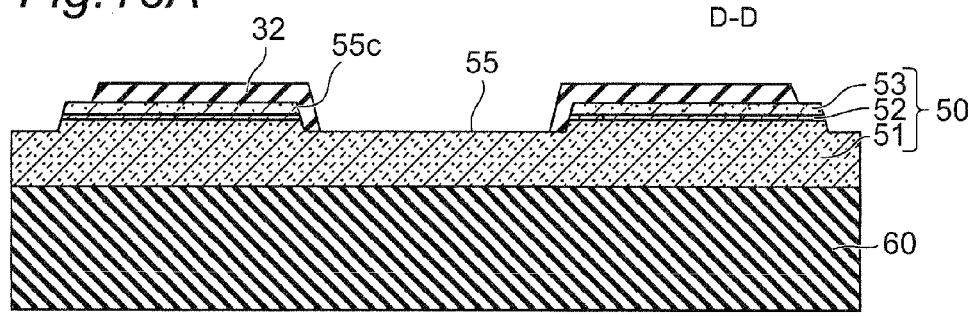
FIG. 16A is a cross-sectional view taken along the line D-D in FIG. 15.
Figure 16B:
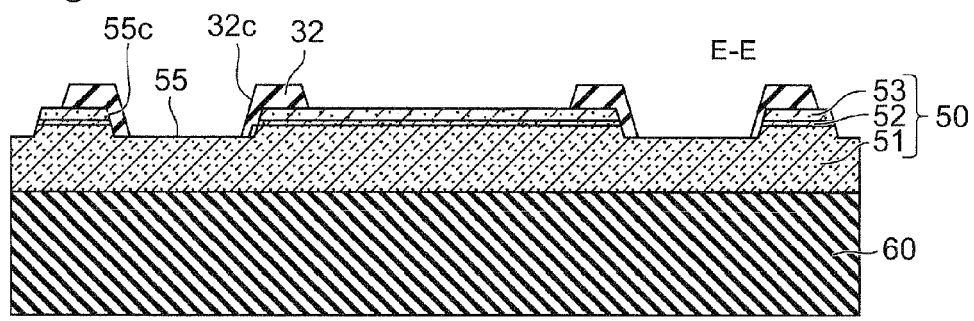
FIG. 16B is a cross-sectional view taken along the line E-E in FIG. 15.
Figure 16C:
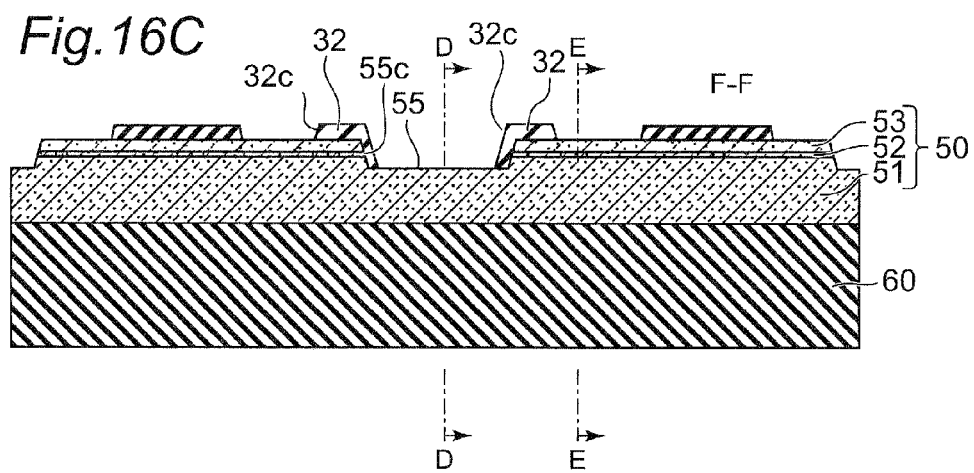
FIG. 16C is a cross-sectional view taken along the line F-F in FIG. 15.
Figure 17:
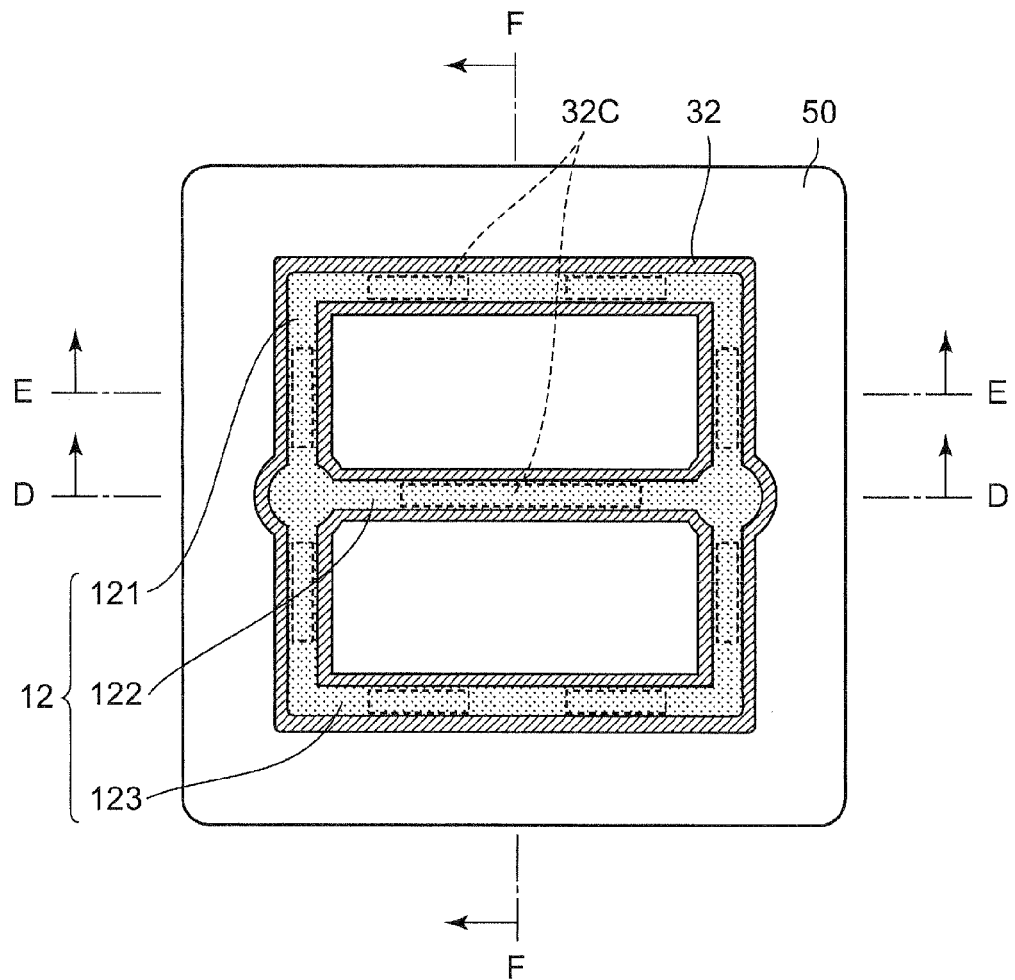
FIG. 17 is a schematic top view for explaining a manufacturing method of the light emitting element in the second embodiment of the present invention.
Figure 18A:
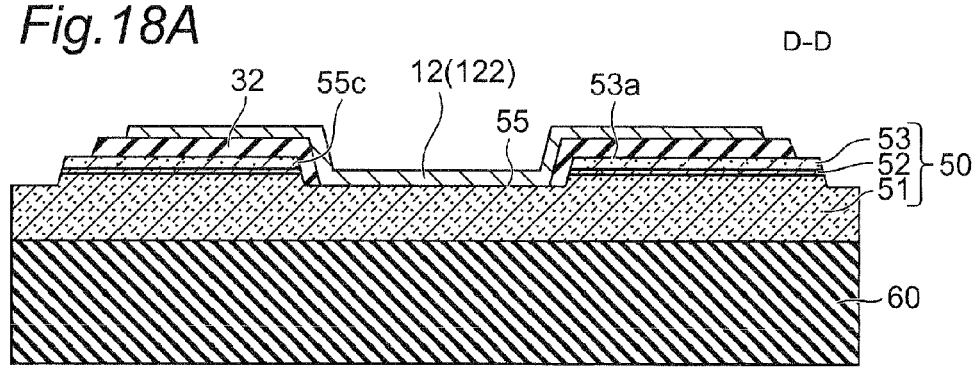
FIG. 18A is a cross-sectional view taken along the line D-D in FIG. 17.
Figure 18B:
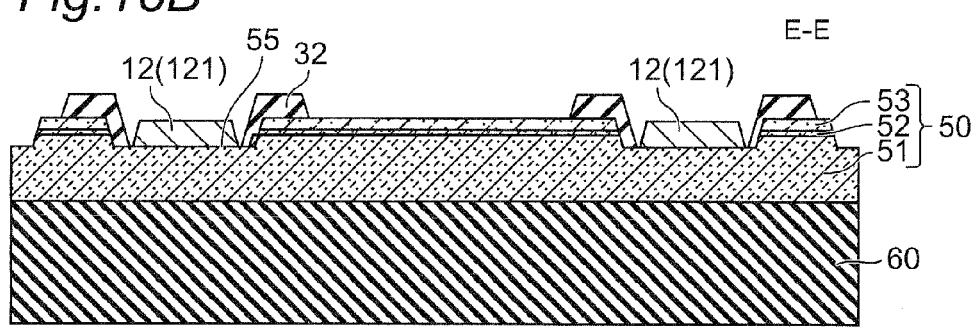
FIG. 18B is a cross-sectional view taken along the line E-E in FIG. 17.
Figure 18C:
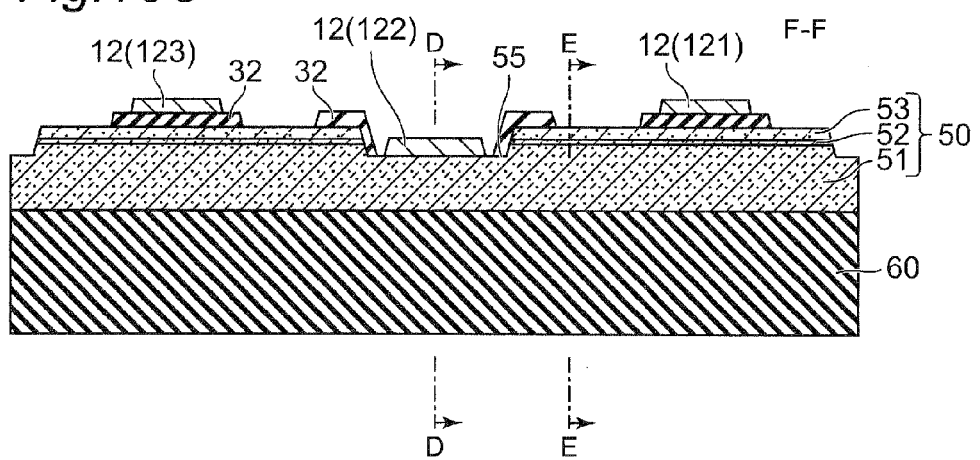
FIG. 18C is a cross-sectional view taken along the line F-F in FIG. 17.
Figure 19:
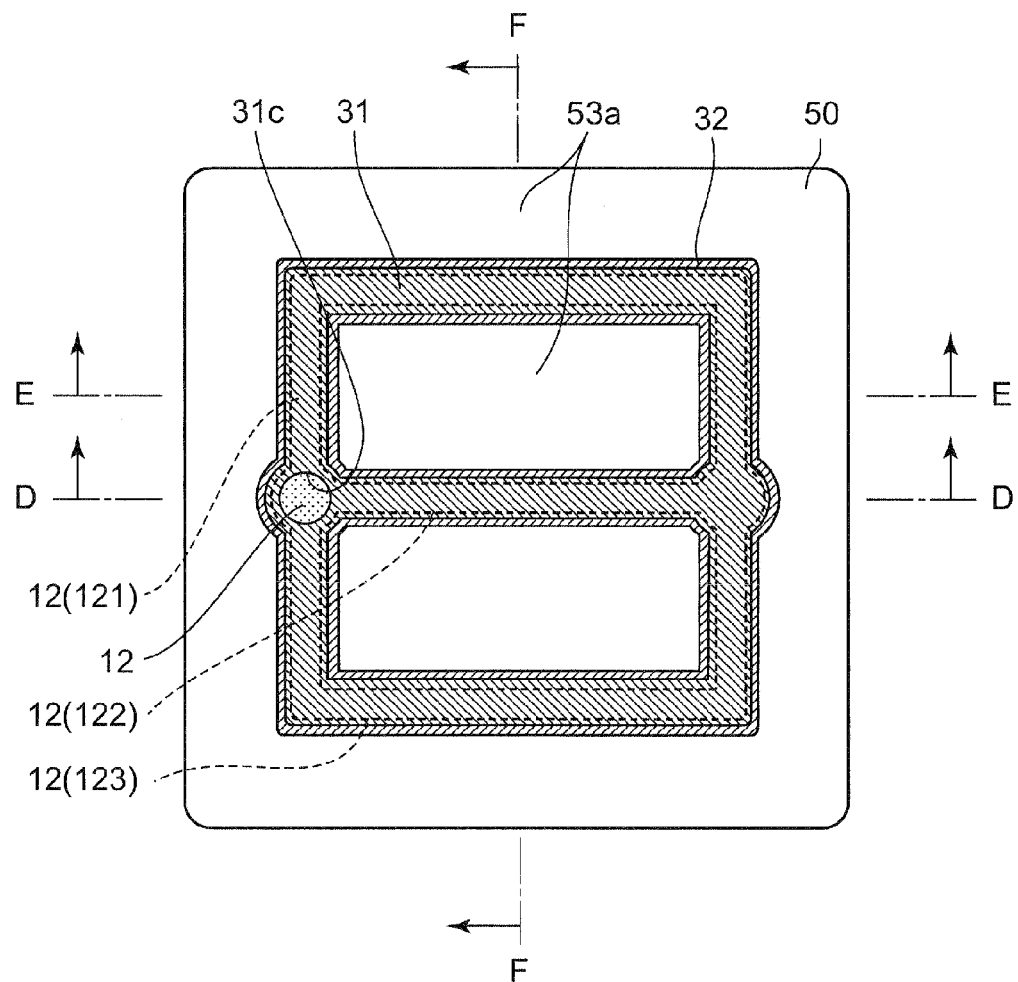
FIG. 19 is a schematic top view for explaining a manufacturing method of the light emitting element in the second embodiment of the present invention.
Figure 20A:
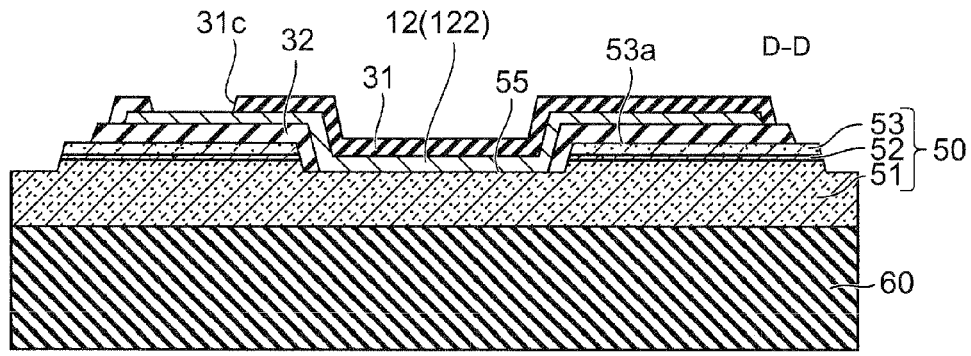
FIG. 20A is a cross-sectional view taken along the line D-D in FIG. 19.
Figure 20B:
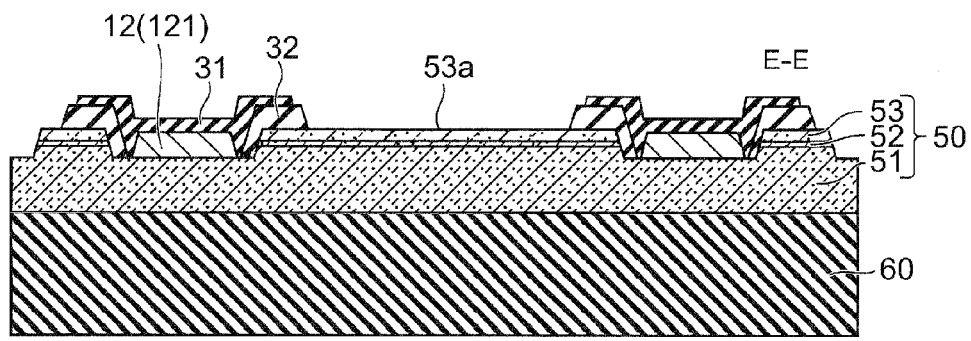
FIG. 20B is a cross-sectional view taken along the line E-E in FIG. 19.
Figure 20C:
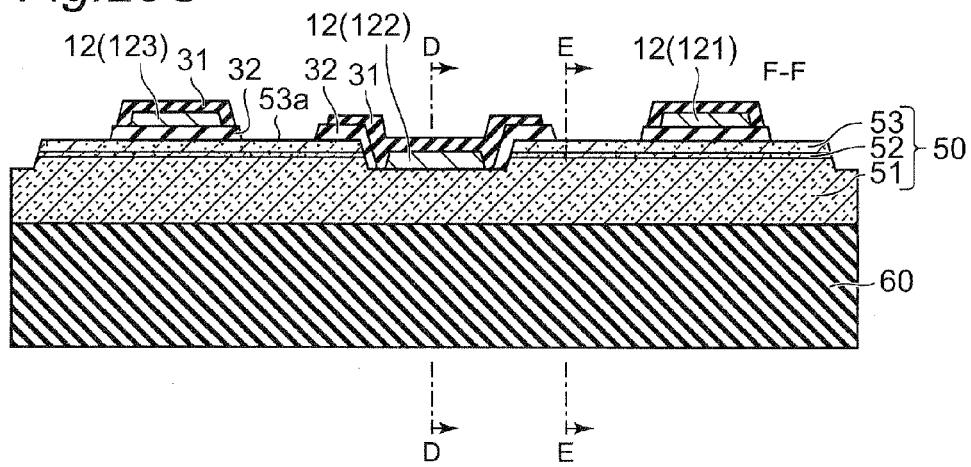
FIG. 20C is a cross-sectional view taken along the line F-F in FIG. 19.
Figure 21:
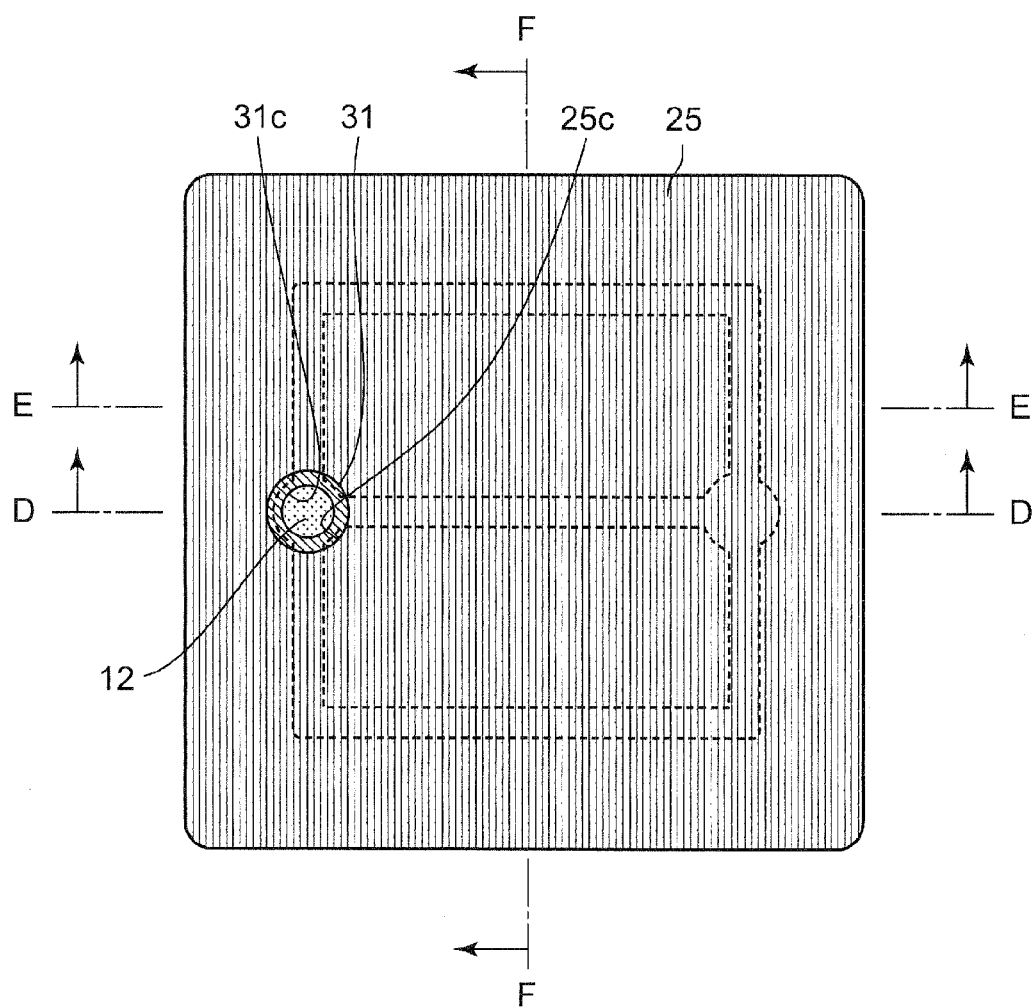
FIG. 21 is a schematic top view for explaining a manufacturing method of the light emitting element in the second embodiment of the present invention.

The first insulating film 31 and the second insulating film 32 are formed of an insulating film, and preferably, formed of an oxide film. The first insulating film 31 and the second insulating film 32 can be formed by, for example, a silicon dioxide ($SiO_2$), and a Zr oxide film ($ZrO_2$). The second insulating film 32 may be formed by a dielectric reflective film, for example, a multi-layered film including $SiO_2/Nb_2O_5$. The second insulating film 32 formed by the dielectric reflective film can reflect the light propagating through the semiconductor laminate 50, and therefore the absorption of the light in the n-side extending portion 12 can be reduced. The insulating film 32 serving as the reflective film is preferably formed in the same shape as that of the n-side extending portion 12 as shown in FIG. 15 or the like in order to prevent an increase in light shielding area.

Semiconductor Laminate 50

The semiconductor laminate 50 can be formed of various semiconductor materials. For example, the semiconductor laminate 50 can be formed of a gallium nitride-based compound semiconductor represented by the general formula of $In_xAl_yGa_{1-x-y}N$ ($0 \leq x \leq 1$, $0 \leq y \leq 1$, $0 \leq x+y \leq 1$). Specifically, the semiconductors can be, for example, GaN, AlGaN, InGaN, AlGaInN, and the like represented by the above-mentioned general formula.

The n-type semiconductor layer 51 can be formed by, for example, a gallium nitride-based compound semiconductor containing, for example, Si, Ge, O, or the like as an n-type impurity.

The light emitting layer 52 can be formed by, for example, InGaN.

The p-type semiconductor layer 53 can be formed by, for example, a gallium nitride-based compound semiconductor containing, for example, Mg as a p-type impurity.

The semiconductor laminate 50 may include any other layer in addition to the n-type semiconductor layer 51, the light emitting layer 52, and the p-type semiconductor layer 53. For example, the semiconductor laminate 50 may include an undoped layer formed without containing an n-type impurity and a p-type impurity.

Substrate 60

As the substrate 60, an insulating substrate such as a sapphire substrate ($Al_2O_3$) with any of a C plane, an A plane, and an R plane as a main surface is typically used. SiC (6H, 4H or 3C), silicon, ZnS, ZnO, GaAs, or nitride semiconductor (GaN, AlN, or the like) may be used as a material for the substrate.

The surface 60a of the substrate 60 may be a flat surface, but alternatively may be provided with pits or protrusions that can effectively take out the light repeatedly reflected within the semiconductor laminate 50.

The first to fourth embodiments embody the light emitting element having a substantially square shape in which the extending electrodes 12 and 22 are disposed in a substantially square shape and the two pad portions 11 and 21 are provided. However, the present invention is not limited thereto, and various modifications and changes can be made to these embodiments. For example, the rectangular light emitting element can also include extending electrodes that are disposed in any shape (e.g., in a grid pattern, in a circular shape, or the like), and three or more pad portions.

What is claimed is:

1. A semiconductor light emitting element comprising:
   a lower surface side and an upper surface side, the upper surface side being a light emitting surface side;
   a first conductive type semiconductor layer having one of n-type conductivity and p-type conductivity;
   a light emitting layer;
   a second conductive type semiconductor layer having the other of n-type conductivity and p-type conductivity;
   the first conductive type semiconductor layer, the light emitting layer and the second conductive type semiconductor layer being disposed in this order from the lower surface side of the light emitting element toward the upper surface side thereof;
   a first electrode provided on the first conductive type semiconductor layer, the first electrode including a first pad portion and a first extending portion extending from the first pad portion;
   a first insulating film covering the first extending portion;
   a translucent electrode connected to an upper surface of the second conductive type semiconductor layer and extending over the first insulating film; and
   a second electrode connected to the translucent electrode at a position on the first insulating film, the second electrode including a second pad portion, and a second extending portion extending from the second pad portion along the first extending portion so as to be superimposed over the first extending portion; wherein the first electrode is located directly under the second pad portion.

2. The semiconductor light emitting element according to claim 1, wherein, in a top view, 90% or more of an area of the second electrode is superimposed over the first electrode.

3. The semiconductor light emitting element according to claim 2, wherein at least one of the first extending portion and the second extending portion has a plurality of parts extending in the same direction.

4. The semiconductor light emitting element according to claim 1, wherein the first electrode is provided on an exposed portion, the first conductive type semiconductor layer being exposed within the exposed portion.

5. The semiconductor light emitting element according to claim 4,
   wherein the first electrode extends from on the exposed portion to the upper surface of the second conductive type semiconductor layer, and
   wherein the semiconductor light emitting element further comprises a second insulating film disposed between the first electrode and the second conductive type semiconductor layer so as to insulate therebetween.

6. The semiconductor light emitting element according to claim 5, wherein the first pad portion is disposed over the second conductive type semiconductor layer with the second insulating film therebetween.

7. The semiconductor light emitting element according to claim 1,
   wherein, in a top view, the second pad portion is disposed so as not to be superimposed over the first electrode, and
   wherein the semiconductor light emitting element further comprises a metal reflective film directly under the second pad portion, the metal reflective film being insulated from the first conductive type semiconductor layer and the second conductive type semiconductor layer.

8. The semiconductor light emitting element according to claim 1,
   wherein the first extending portion is formed of a lower metal layer, and
   wherein the first pad portion is formed of an upper metal layer provided on the lower metal layer.

9. The semiconductor light emitting element according to claim 1, wherein at least one of the first extending portion and the second extending portion has a plurality of parts extending in the same direction.

10. A method for manufacturing a semiconductor light emitting element, comprising:
    forming a first conductive type semiconductor layer, a light emitting layer and a second conductive type semiconductor layer in this order;
    forming a first electrode contacting an exposed portion formed by partly removing the second conductive type semiconductor layer and the light emitting layer so as to expose the first conductive type semiconductor layer, the first electrode including a first pad portion and a first extending portion extending from the first pad portion;
    forming a first insulating film covering the first extending portion;
    forming a translucent electrode connected to an upper surface of the second conductive type semiconductor layer and extending over the first insulating film; and
    forming a second electrode connected to the translucent electrode at a position on the first insulating film, the second electrode including a second pad portion and a second extending portion extending from the second pad portion along the first extending portion so as to be superimposed over the first extending portion; wherein the first electrode is formed directly under the second pad portion.

11. The method according to claim 10, wherein the step of forming the translucent electrode comprises:
    forming a first transparent conductive layer made of conductive oxide on the upper surface of the second conductive type semiconductor layer; and
    forming a second transparent conductive layer made of conductive oxide on the first insulating film so as to connect the first transparent conductive layer to the second electrode.

12. The method according to claim 11, further comprising:
    before the step of forming the first electrode and the step of forming the second electrode, heat treating the first transparent conductive layer at a first temperature; and
    after the step of forming the first electrode and the step of forming the second electrode, heat treating the second transparent conductive layer at a second temperature lower than the first temperature.

13. A semiconductor light emitting element comprising:
    a lower surface side and an upper surface side, the upper surface side being a light emitting side;
    an n-type semiconductor layer;
    a light emitting layer;
    a p-type semiconductor layer;

the n-type semiconductor layer, the light emitting layer and the p-type semiconductor layer being disposed in this order from the lower surface side of the light emitting element toward the upper surface side thereof;

a first electrode provided on the n-type semiconductor layer, the first electrode including a first pad portion and a first extending portion extending from the first pad portion;

a first insulating film covering the first extending portion;

an indium-tin-oxide (ITO) layer connected to an upper surface of the p-type semiconductor layer and extending over the first insulating film; and a second electrode connected to the ITO layer at a position on the first insulating film, the second electrode including a second pad portion, and a second extending portion extending from the second pad portion along the first extending portion so as to be superimposed over the first extending portion; wherein the first electrode is located directly under the second pad portion.

14. The semiconductor light emitting element according to claim 13, wherein, in a top view, 90% or more of an area of the second electrode is superimposed over the first electrode.

15. The semiconductor light emitting element according to claim 14,
wherein the first electrode is provided on an exposed portion, the n-type semiconductor layer being exposed within the exposed portion,
wherein the first electrode extends from on the exposed portion to the upper surface of the p-type semiconductor layer, and
wherein the semiconductor light emitting element further comprises a second insulating film disposed between the first electrode and the p-type semiconductor layer so as to insulate therebetween.

16. The semiconductor light emitting element according to claim 15,
wherein, in the top view, the second pad portion is disposed so as not to be superimposed over the first electrode, and
wherein the semiconductor light emitting element further comprises a metal reflective film directly under the second pad portion, the metal reflective film being insulated from the n-type semiconductor layer and the p-type semiconductor layer.

* * * * *